US009666286B2

(12) United States Patent
Lee

(10) Patent No.: US 9,666,286 B2
(45) Date of Patent: May 30, 2017

(54) SELF-TIMED SLC NAND PIPELINE AND CONCURRENT PROGRAM WITHOUT VERIFICATION

(71) Applicant: Peter Wung Lee, Saratoga, CA (US)

(72) Inventor: Peter Wung Lee, Saratoga, CA (US)

(73) Assignee: APLUS FLASH TECHNOLOGY, INC., Fremont, CA (US)

( * ) Notice: Subject to any disclaimer, the term of this patent is extended or adjusted under 35 U.S.C. 154(b) by 35 days.

(21) Appl. No.: 14/859,237

(22) Filed: Sep. 18, 2015

(65) Prior Publication Data

US 2016/0093384 A1    Mar. 31, 2016

Related U.S. Application Data

(60) Provisional application No. 62/056,590, filed on Sep. 28, 2014.

(51) Int. Cl.
| | |
|---|---|
| *G11C 16/04* | (2006.01) |
| *G11C 16/10* | (2006.01) |
| *G11C 16/08* | (2006.01) |
| *G11C 16/26* | (2006.01) |
| *G11C 16/34* | (2006.01) |
| *G11C 16/32* | (2006.01) |

(52) U.S. Cl.
CPC .......... *G11C 16/10* (2013.01); *G11C 16/0408* (2013.01); *G11C 16/0466* (2013.01); *G11C 16/0483* (2013.01); *G11C 16/08* (2013.01); *G11C 16/26* (2013.01); *G11C 16/32* (2013.01); *G11C 16/3459* (2013.01)

(58) Field of Classification Search
CPC ..... G11C 16/10; G11C 16/08; G11C 16/0408; G11C 16/0466; G11C 16/0483
USPC ........................ 365/185.12, 185.17
See application file for complete search history.

(56) References Cited

U.S. PATENT DOCUMENTS

| | | | | |
|---|---|---|---|---|
| 8,279,673 B2* | 10/2012 | Furuyama | .......... | G11C 16/0483 365/185.17 |
| 8,605,504 B2* | 12/2013 | Okamoto | ............ | G06F 12/0246 365/185.09 |
| 9,245,639 B1* | 1/2016 | Lee | ........................ | G11C 16/26 |

* cited by examiner

*Primary Examiner* — Pho M Luu
(74) *Attorney, Agent, or Firm* — Raywell Group, LLC

(57) ABSTRACT

A hierarchical-GBL/LBL NAND array with a plurality of LG and MG groups in either orthogonal BL/CSL scheme or parallel BL/SL scheme including a plurality of block-decoders with a shared self-timed delay control circuit and a plurality of fully-shielding dynamic CACHE registers made of 2 local broken metal lines within the array and DRAM-like SA is provided. Each DCR capacitor is flexibly expandable by connecting multiple $C_{LG}$s made by the local broken metal lines of the LGs to form a $C_{MG}$ of a larger MG. Based on the NAND array, multiple randomly selected WLs in multiple random blocks within multiple random LGs within one MG can be selected on basis of one WL per block per LG for performing an ABL pipeline and concurrent SLC program without verification, and on basis of one WL per block per MG for performing an ABL-like or HBL pipeline and concurrent SLC read.

46 Claims, 30 Drawing Sheets

| ABL random-1WL pipeline SLC program without verify | | | | | |
|---|---|---|---|---|---|
| Start time | t1 | t2 | t3 | ……. | tm |
| Select WL | WL2 | WL63 | WL22 | ……. | WL128 |
| Select Block | BLK1 | BLK4 | BLK2 | ……. | BLK3 |
| Select LG | LG1 | LG2 | LG4 | ……. | LG3 |
| Select MG | MG1 | MG1 | MG3 | ……. | MG4 |
| Select HG | HG1 | HG5 | HG3 | ……. | HG8 |

FIG. 5A

| ABL multi-WLs pipeline/concurrent SLC program without verify | | | | | | | |
|---|---|---|---|---|---|---|---|
| Start Time | t1 | | t2 | | | ……. | tm | |
| Select WL | WL5 | WL5 | WL32 | WL32 | WL32 | ……. | WL1 | WL1 |
| Select Block | BLK1 | BLK4 | BLK2 | BLK1 | BLK3 | ……. | BLK3 | BLK2 |
| Select LG | LG1 | LG2 | LG1 | LG4 | LG4 | ……. | LG3 | LG4 |
| Select MG | MG1 | MG1 | MG1 | MG2 | MG3 | ……. | MG4 | MG2 |
| Select HG | HG1 | HG5 | HG1 | HG3 | HG3 | ……. | HG8 | HG1 |

FIG. 5B

1Gb Vt distribution derived from one-pulse Vpgm=20V for Tpgm=100us

Multiple WL Pipeline Program in same LG

| Mode | | CLA | CLRn | PH | ENSn | EMBn | XDPn | XDNn | XDMBn | XDn | XDMPn | HXDn | GSLp | SSLp | XT1~XT128 | VHH | SSL | WL1~WL128 | GSL |
|---|---|---|---|---|---|---|---|---|---|---|---|---|---|---|---|---|---|---|---|
| Clear All | | 1 | 0 | 0 | 0 | 1 | 0 | 0 | 1 | 1/0 | 0/1 | 0 | 1 | 1 | 0/1 | 1 | 0* | 0* | 0* |
| Indiv. Latch | Sel Blk | 0 | 0 | CK | 0 | ⊔ | ⊓ | 0 | 0→1 1→0 | 1 | 0 | ⊓ | 0 | H2 | H2/H3 →X | H4 | H2* | H2*/H3* | 0* |
| | Unsel Blk | 0 | 0 | CK | 0 | ⊔ | 0 | 0 | 0→1 1→0 | 1 | 1 | 0 | 0 | H2 | H2/H3 →X | H4 | 0* | 0* | 0* |
| Self-timed Lock | Sel Blk | 0 | 0 | CK | ⊓ | 1 | 0 | 0→1 1→0 | 0→1 1→0 | 1 | 0→1 | 0 | 0 | H2 | X | H4 | H2* | H2*/H3* | 0* |
| | Unsel Blk | 0 | ⊓ | CK | ⊓ | 1 | 0 | 1→0 0→1 | 0 | 1 | 1 | ⊓ | 0 | H2 | X | H4 | 0* | 0* | 0* |
| Self-timed Unlock & Discharge | Sel Blk | 0 | ⊓ | CK | 0 | 1 | ⊓ | 0 | 0 | 1 | 1 | ⊓ | 0 | H2 | 0 | H4 | 0 | 0 | 0 |
| | Unsel Blk | 0 | 0 | CK | 0 | 1 | ⊓ | 0 | 0 | 1 | 1 | 0 | 0 | H2 | 0 | H4 | 0 | 0 | 0 |

Note: 1=Vdd, 0=0V, w=Floating, X=Don't care, CK=Clock Pulse, H2=Vpass, H3=Vpgm, H4=Vpp, 0*=H4'~Vpp+Vt

FIG. 13A

SELF-TIMED SLC NAND PIPELINE AND CONCURRENT PROGRAM WITHOUT VERIFICATION

1. CROSS-REFERENCES TO RELATED APPLICATIONS

This application claims priority to U.S. Provisional Application No. 62/056,590, filed Sep. 18, 2014, commonly assigned and incorporated by reference herein for all purposes.

This application is related to U.S. patent application Ser. Nos. 14/806,629, 14/583,178, 14/487,078, 14/341,739, 14/316,936, 14/283,209, and 14/828,427, incorporated by reference herein for all purposes.

2. BACKGROUND OF THE INVENTION

Electrically Erasable and Programmable NAND memory has become one of the most popular non-volatile memory (NVM) with the lowest unit price and highest density. Particularly, NAND is extensively used with a big volume in cellular phones, digital cameras, personal digital assistants, mobile computing devices, tablet, SSD, and desktop computers, and many other emerging wearable devices. In order to keep driving NAND density higher at a lower unit cost, the program schemes of MLC, TLC, and even XLC are extensively used in 2D NAND flash memories. Similarly, the 3D NAND flash memory is also migrating from MLC storage in 2013 to TLC storage in 2014 to further reduce the die cost as disclosed by Samsung's Vertical NAND.

Unfortunately, when NAND manufacture technology scaling comes to below 30 nm, or even down to 1×nm-class range, interference coupling effect on the floating-gate charge threshold voltage Vt becomes very severe between two physically adjacent bit lines (BLs) and word lines (WLs) in aforementioned NAND arrays. Thus the NAND data reliability, performance, and P/E endurance cycles of MLC and TLC are greatly degraded compared to SLC storage.

These BL-BL or WL-WL coupling effects are termed as Yupin BL-BL or WL-WL cell coupling effects. The Yupin coupling effect results in erroneous reading, which is not avoidable and much severe particularly in MLC and TLC NAND. In some high-end industry or enterprise SSD code and data storage applications, the high bit errors and low P/E cycles cannot be accepted. Therefore, for a higher reliable NAND code application, a SLC read and storage scheme is still more preferable over the counterparts of MLC, TLC, and XLC storages in storage market place. For example, in 2014, the SLC NAND suppliers include Toshiba's BENAND, Micron, and many other NAND companies such as Spansion, Macronix, Winbond, etc.

In all these conventional SLC NAND designs, an iterative SLC program scheme is generally adopted, which performs a SLC program verification right after each iterative program step to confirm if the SLC program from a single SLC erase state is successfully done. Although this program verification step is advantageous to achieve the narrow width of threshold Vt state distribution and to avoid the over-program of the SLC program, it has several key drawbacks as summarized below. Firstly, the latency of whole cycle of the SLC program operation is about 30% increased when the SLC program verification is required. Secondly, since the high-voltage stress of Vpgm and Vpass of the SLC program cycle and the HV stress of Vread of SLC verification cycle are proportional to the number of iteration steps, thus SLC P/E endurance cycles is drastically reduced. Thirdly, the power consumption of the SLC iterative program and verification are increased proportional to the number of iteration steps, thus battery life is shortened in mobile system equipped with these SLC memory.

For example, the as-mentioned SLC program scheme is based on one typical 2D mainstream NAND array architecture (having a NAND memory block circuit with 1-level tight 1λ-width and 1λ-spacing metal lines (m1) as bit lines (BLs) laid in parallel in Y-direction (string direction) and one common source line (SL) per block laid in X-direction (WL direction). In addition, all BLs including both even-numbered BLe and odd-numbered BLo metal lines are made of same m1 metal layer, but SL uses bottom m0 or m2-strapped layer, depending on the NAND process technologies. With such NAND array structure, all SLC 8 KB NAND cells in all strings in each selected physical WL can be programmed and read at same time in All-BL-manner but at expense of using large size of 8 KB page buffer (PB) and 8 KB static cache registers. Alternatively, Half-BL Odd/Even-numbered BLs read and program can be performed with only one half of interleaving SLC cells associated with half numbers of all BLs on each physical WL are selectively programmed and read at same time with a benefit of using a smaller 4 KB PB but all the latency, gate disturbance, and power consumption of read and program operations are doubled, where Half-BL is referred to interleaving Odd/Even BL-shielding read and program verify operations.

In another example, an alternative NAND array structure includes paired 2D NAND strings as disclosed in U.S. Pat. No. 5,734,609 providing each BL node of Even/Odd string connected in a zigzag way to each corresponding SL node of next adjacent Odd/Even string. But the string size of this NAND array is larger because one depletion-type NMOS transistor with bigger channel length and size is added per string for selecting Even/Odd strings.

Several other conventional NAND structures are proposed (e.g., in U.S. Pat. Nos. 8,695,943 and 7,499,329), but none of those provides truly BL-shielding effect to overcome the Yupin coupling effect at the same time keeping a compact string size in NAND array with small page buffer size.

For many emerging fast program and read applications, a faster and more reliable SLC program and read have a market need. It is desired to have an improved NAND program scheme, based on a novel NAND array structure with multi-level hierarchical bitlines, to replace the conventional iterative SLC program method with multiple-pulse stair-raised Vpgm including time-consuming program verification.

3. BRIEF SUMMARY OF THE INVENTION

The present invention is generally related to non-volatile NAND memory, regardless of 2D or 3D NANDs. Embodiments of the present invention provide a preferred multiple WLs SLC concurrent and pipeline program scheme without verification step based on a two(or more)-level hierarchical-BL NAND array structure. More specifically, a self-timed program-time Tpgm and discharge of Vpgm, Vpass, and Vread for each selected set of M WLs and top/bottom string-select translator gate control lines of each block-decoder for performing the program operation are also disclosed for providing more powerful and efficient mixed pipeline and concurrent program and read operations with both program and read latencies being reduced by more than M-fold.

In an embodiment, the multi-WL mixed concurrent and pipeline SLC program operation includes a concurrent and pipeline of All-BL-like SLC program-verify and read operations performed on a second randomly selected set of blocks of same or different NAND plane with a set of common global bit lines (GBLs) bus and another set of HV supply XT bus lines being available or being made available duo to higher priority while the first pipeline SLC program and SLC read or mixed operations are performed in a first selected set of blocks in same or different plane of NAND array. Additionally, the multi-WL pipeline SLC program operation includes a second pipeline of All-BL SLC program operations performed on the second selected set of WLs in multiple dispersed blocks while the first pipeline of ABL SLC program, ABL-like SLC read and program-verify or mixed operations are still performed in the first selected set of blocks in same or different plane of NAND array. In other words, a plurality of pipelines of ABL SLC program operations can be performed simultaneously as long as the shared XT and GBL bus lines can be managed to avoid data contention at particular timelines.

In another embodiment, the present application provides a self-timed larger-RC circuit for program-time Tpgm control and discharge delay control so that the block-decoders, LG-decoders can be properly operated during the ABL multi-WLs pipeline and concurrent SLC program which can be operated even during a sudden unintentional Vdd power-down.

In yet another embodiment, with the capability to latch multiple sets of Vpgm, Vpass and Vread in multiple selected sets of WLs, SSL, and GSL control gate lines of string-select transistors, and local bit line (LBL) program and program-inhibit voltages $V_{LBL}$ in multiple selected Dynamic Cache Registers (DCRs) formed by parasitic line capacitor $C_{LBL}$ based on the broken LBLs, the SLC program without verification would consume the least power and use less operation steps in accordance with multiple loaded page data either already in either capacitor-based DCR in NAND cell array or logic-device-based Static Cache Registers (SCRs) outside the NAND array in PB area to be transferred to DCRs as a safe self-timed pipeline and concurrent SLC program. As a result, an off-chip battery can be eliminated for better environment disposal or a size of a bulky, super-sized capacitor can be reduced in size for both cost and footprint reduction.

In still another embodiment, a DRAM-like clocked sense amplifier (SA) with a full tracking of parasitic bit line capacitance $C_{LBL}+C_{GBL}$ from only one same sensing path that takes both sensed cell voltage and reference bit voltages to be split and stored into 2 tracking inputs with two identical capacitors for a reliable SA design applied for performing multi-WLs SLC pipeline and concurrent read and program-verify operations.

Embodiments of the present invention, based on a multi-level hierarchical-BL NAND array structure, include a pipeline-based concurrent multiple-WL self-timed ABL SLC program operation without subsequent program verification with effective one-WL program latency being drastically reduced to below 1/10 if 10 or more than 10 WLs are being selected for concurrent SLC program.

Embodiments of the present invention also include a pipeline-based concurrent multiple-WL ABL-like SLC evaluation of SLC read operation with effective one-WL read latency being cut down to 1/100 after a second SLC read. In the multi-level hierarchical-BL NAND array structure, a plurality of Dynamic CACHE Registers (DCR) is provided via broken LBL metal lines flexibly connected with an adjustable capacitance so that smaller $C_{LBL}$s are used for ABL SLC program operation and larger $C_{LBL}$s are used for ABL-like read operation for reduction of power consumption and latency. An optimized number of self-timed block-decoders are provided to share one compact self-timed delay control circuit with a tracking capability of any known program/read delay generated by an on-chip State-machine to save the area. A sector-based DRAM-like sense amplifier (SA) design in PB is provided with only one identical path of $C_{LBL}$ and $C_{GBL}$ to be split into two separate inputs of one corresponding Multiplier and SA for receiving two sensed voltages of each SLC bit and each reference bit in a fully tracking manner without charge-sharing (CS) degradation along the sensing path between the SA and selected cells in the selected block.

In a specific embodiment, the preferred multi-level hierarchical-BL NAND array includes a first kind of NAND block comprising a plurality of NAND strings with all drain nodes being connected by a plurality of parallel bitlines (BLs) and all source nodes being connected by a orthogonal common source line (CSL) per block. Alternatively, another preferred multi-level hierarchical-BL NAND array includes a NAND block comprising a plurality of NAND strings connected only to a plurality of BLs without any CSL in the array. Each BL serves as a bit line for one NAND string and as a source line for one physically adjacent NAND string while keeping full NAND cell and process compatibility in both 2D and 3D NAND structure. Of course, those of ordinary skill in the art may recognize variations, alternatives, modifications, and other derivatives in NAND string schemes can be used as a base to build the similar hierarchical-BL NAND array structure as disclosed in the present invention.

Various embodiments of the present invention are summarized below, by referring to the accompanying drawings that form a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments to capture the foundations of the following claimed objectives. Other embodiments may be utilized and structural, logical, and electrical changes may be made without departing from the scope and objectives of the present disclosure. The following detailed objectives, embodiments and descriptions, therefore, not to be taken in a limitation sense.

In a specific embodiment, the present invention provides a hierarchical broken-BL NAND array structure including block decoders with a self-timed delay control circuit and a DRAM-like sense amplifier and a Multiplier configured to perform preferred pipeline-based concurrent ABL SLC program operation and ABL-like SLC concurrent evaluation of read operation without verification. The NAND array is divided into a plurality of HGs (high-level groups) using top-level broken GBL metal lines. Each HG is further divided into another pluralities of LGs (low-level groups) using low-level broken LBL metal lines. The devices that are used to connect two adjacent LBLs or two adjacent GBLs are respectively referred as LBL-divider and GBL-divider.

In another specific embodiment, the hierarchical broken-BL NAND array structure includes at least two levels m0/m1 LBL metal lines with a full LBL metal shielding capability so that Yupin coupling effect between two adjacent LBL-LBL lines is completely eliminated. In particular, the two levels m0/m1 LBL metal lines are preferably formed by using two groups of tight 2λ-pitch (1λ-width and 1λ-spacing) metal lines with one group being laid at m0 level in association with all Even numbered strings shielded by interleaving Odd-numbered m0 lines in ground and another group being laid at m1 level in association with all Odd numbered strings shielded by interleaving Even-numbered m1 lines in ground or vice versa. For each block, it is preferred to program two dummy WL cells (if any) with a SLC data but with a program verify operation to keep the tight Vt-width of one program state to obtain the desired Odd-numbered BL and Even-numbered BL select function before to program the regular WL cells with the SLC data by one-shot Vpgm pulse without program-verification. The GBL metal lines are preferably formed at m2 level on top with 4λ-pitch connecting to N/2-bit PB is for N-bit per one physical WL. The 4λ-pitch size includes many combinations of line widths and line spacing. With 2-level LBL metal lines, an ABL evaluation of read operation can be achieved. Alternatively, 1-level LBL metal lines layout scheme can be used, then Half-BL evaluation of read operations has to be used instead.

In yet another specific embodiment, each of the hierarchical broken GBL or broken LBL metal lines that are used for forming the plurality of HGs or LGs forms a parasitic metal capacitor corresponding to each MG or LG as a Dynamic CACHE Register (DCR) to allow temporary storage of one bit of analog or digital voltage data or a precharged program-inhibit voltage Vinh without taking extra silicon area outside the NAND array in the peripheral area for performing one or more pipeline-based concurrent program/read operations. Between any two different pipeline-based concurrent operations, there is a time interval during which multiple subject operations are performed concurrently.

In still another specific embodiment, the present invention discloses a 2-level hierarchical BL structure of a NAND array with J m2 broken GBL lines and two interleaving m1 and m0 broken LBL lines per each long column for many preferred low-power and fast SLC program and read operations. Each piecewise m2 broken GBL line represents one higher-level capacitor $C_{HG}$ obtained by dividing a column using J–1 GBL-dividers. Each $C_{HG}$ is associated with a HG of the NAND array. A HG can be further divided into L MGs (middle-level groups). Each MG is associated with a m1 (or m0) LBL. Each piecewise m1 (or m0) LBL forms a lower-level capacitor $C_{MG}$. Each $C_{MG}$ is further divided to J' $C_{LG}$s by J'–1 LBL-dividers to form J' broken-LBLs with same metal layers, where $C_{LG} \leq C_{MG}$. Each LG further comprises of H blocks and each block comprises of a plurality of strings, where each block can be associated with or without one common source line.

In summary, the broken GBL and LBL metal lengths associated with HG, MG, and LG are defined as $C_{Column}=J \times C_{HG}=J \times (L \times C_{MG})=J \times [L \times (J' \times C_{LG})]=J \times L \times J' \times C_{LG}$, where $C_{column}$ stands for whole lengths or capacitors of each long column across J HG groups of one NAND plane. The size or length of each broken local LG and MG metals or $C_{LG}$ and $C_{MG}$ capacitors can be flexibly made equal or unequal, depending on specs but equal broken length for regular LG and MG groups of NAND array is preferred for design simplicity. In an embodiment, all broken-LBL metal lines are preferably made by 2 interleaving 2λ-pitch m0 and m1 layers with same 1λ-width and 1λ-spacing for a full LBL shielding protection for ABL program but Odd/Even-BL verify and read operations. An option of the 2-level hierarchical-BL NAND structure includes forming each $C_{column}$ by one long m2 GBL being divided to J broken GBLs respectively associated with J HGs and with each HG being divided to L LGs without MGs.

In yet still another specific embodiment, the present invention provides a method of reserving 1 or 2 HG groups which are the nearest to the PB for reliably storing SLC page data for operating system. In these HGs, the precharge voltage can be just the same as operation voltage Vdd<3V rather than Vinh~7V to reduce power consumption during sensitive ABL-like pipeline-based SLC read operation without performing charge-sharing with a whole $C_{column}$.

In an alternative specific embodiment, the present invention provides a method and NAND array structure with adjustable size in GBL/LBL metal line capacitor as a 1-bit DCR in accordance with different NAND pipeline operations. For example, when one big piecewise $C_{MG}$ is used for storing 1-bit sensed analog data from a cell in the NAND array for read, program-verify, or erase-verify operation or 1-bit SLC data loaded from I/O for program operation, then this $C_{MG}$ is referred as a big DCR bit. In this case, part or all corresponding J' $C_{LG}$ capacitors within one $C_{MG}$ have to be connected together without a voltage drop to form part or whole $C_{MG}$. Note, for those HGs near PB, the number of $C_{LG}$ can be smaller because the charge-sharing amount between the resulting big $C_{MG}$ and $C_{column}$ is relatively smaller. When one small $C_{LG}$ is used for storing 1-bit analog or digital program voltage $V_{LBL}$ or program-inhibit voltage Vinh, then this is referred as a small DCR bit. In this case, all corresponding J'$C_{LG}$ capacitors within one $C_{MG}$ are isolated. In summary, each capacitor size of 1-bit is flexibly defined in accordance with the desired magnitude of capacitance of the desired operations. An N-bit DCR in one row is defined as a 1-page DCR. During SLC program, a small $C_{LG}$-based 1-page DCR is preferably used to temporarily store the desired $V_{LBL}$ voltages for saving precharge-current. But when a SLC read is performed, the $C_{LG}$-based 1-page DCR has to be switched to form a bigger $C_{MG}$-based 1-page DCR for a secure charge-sharing operation.

In another alternative specific embodiment, the present invention provides a method of selecting one page of small N-bit $C_{LG}$ of one DCR in one selected $C_{HG}$ for an one-page ABL SLC program without verification in one HG group, selecting M pages of small $C_{LG}$ from M dispersed DCRs in one or more selected $C_{HG}$ for a batch-based M-WL SLC program without verification in one or more HG groups. Each $C_{HG}$ is preferably comprised of at least 8 $C_{LG}$ registers when each GBL is being divided into 16 HG groups. Since each $C_{LG}$ in the nearest HG group would perform the charge-sharing operation with least signal dilution, thus each small $C_{LG}$ capacitor in each DCR can be used to store each corresponding bit of SLC page data loaded from I/Os without using the big $C_{MG}$ to reduce power consumption. For example, in Group 1, one $C_{LG}$ within one $C_{MG}$ will perform a charge-sharing operation with only one $C_{MG}$ and one $C_{HG}$ because it is formed next to the PB. The rest of (J–1) $C_{HG}$ will be electrically isolated from the selected $C_{HG}$ for performing the charge-sharing operation with least signal dilution.

In yet another alternative embodiment, the present invention discloses preferably to use one page of DCR comprising of a row of N small $C_{LG}$ capacitors to temporarily store each selected WL SLC page program digital data including $V_{LBL}=0V$ as SLC program BL voltage and one $V_{LBL}=Vinh \geq 7V$ as SLC program-inhibit BL voltage in accordance with the SLC page data stored in SCR in PB. For a preferred pipeline-based M-WL SLC program, then M dispersed pages of DCRs are required to temporarily store M-WLs N-bit SLC program page data for the M-fold latency reduction during M-WL concurrent SLC program. In other words, M-WL pipeline-based N-bit SLC program requires M N-bit DCRs distributed in M selected N-bit $C_{LG}$ capacitors.

In still another alternative embodiment, the present invention a method for loading a single SLC N-bit page data from byte-based I/O to 8 KB-based DCR in the NAND array. The method includes steps: 1) The whole 8 KB SLC page data is divided into 2 HBL-based SLC sector data, i.e., Odd-BL half-page data and Even-BL half-page data. Each HBL size is 4 KB according to this hierarchical broken-BL NAND array structure with a PB size of 4 KB, and a SCR size of 4 KB; 2) The pipeline-based SLC program starts from receiving Command and address; 3) A first 4 KB SLC data of a whole 8 KB page data from a flash controller is sequentially and synchronously clocked into the 4 KB SCR via a byte-based I/O in 4K clocks; 4) A first addressed 4 KB of one 8 KB DCR capacitors $C_{LBL}$ are selected for precharging with Vinh voltage to prepare for the subsequent $V_{LBL}$ conversion from Vdd/Vss to Vinh/Vss for the pipeline SLC program; 5) The first 4 KB SCR sector data is then transferred to the 4 KB PB in one step. Once completed, then it immediately releases the 4 KB SCR to receive the continuous loading of a second 4 KB sector data from I/O again. Simultaneously, the first 4 KB of sector data in SCR are first connected to 4 KB GBL in one-step with the first 4 KB DCR being disconnected from the 4 KB GBL lines; 6) Once the 4 KB GBL lines are settled steadily with the first 4 KB sector data, then the second connection between the 4 KB GBL lines and the selected addressed 4 KB DCRs are performed in parallel in one-step to start the $V_{LBL}$ voltage conversion from all initial Vinh to Vinh/Vss in accordance with the Vdd/Vss sector data supplied from 4 KB PB; 7) After a predetermined period of conversion, then aforesaid both the first and the second GBL connections are disconnected from the DCR and PB to release the 4 KB common GBL lines for the second 4 KB sector data loading and conversion. The process will be continued and then finished when all 2 consecutive 4 KB sector data of one selected page being fully transferred, converted and locked into 2 addressed interleaving sectors of one 8 KB DCR that contains the selected block, which further contains the selected WL for one pipeline SLC program.

Concurrently, the next pipeline program operation can be immediately started without waiting for the following first set of Vpgm and Vpass to be set up to benefit various fast pipeline operations: 1) One set of predetermined Vpgm, Vpass, Vdd, and Vss control gate voltages for the selected WL, all non-selected WLs, one string-select gates SSL and GSL is started from automatically charging to final locking steps for whole program cycle Tpgm without program-verification on the single addressed block by a self-timed time control circuit designed to be one for one $C_{LG}$ capacitor for area saving in block-decoders. 2) A final self-timed time control to discharge all HVs of Vpgm, Vpass, and $V_{LBL}$ in the selected block decoder and DCRs when SLC program or read is completed.

In yet still another alternative embodiment, the present invention discloses any two or more neighboring broken $C_{LG}$s can be connected to form a bigger capacitor by turning on related LBL-dividers MLBL with their gates tied to respective BLG signals. When total J' adjacent $C_{LG}$ capacitors in a same MG are turned on to be connected, then total $C_{LG}$ capacitors form one biggest $C_{MG}$, e.g., J'×$C_{LG}$=$C_{MG}$. In the present invention, one $C_{MG}$ is optimized per each bit of SLC sensing data when the subsequent charge-sharing operation is performed between each $C_{MG}$ and its associated $C_{HG}$ along the path to SA under the regular SLC read or dummy SLC cells program verification operation.

In an embodiment, the present invention provides parasitic broken-LBL line capacitor $C_{LG}$ optimized for 1-bit of DCR associated with a LG group. A whole row of N-bit $C_{LG}$s would form one page of N-bit DCR with the least $C_{LBL}$ capacitance optimized for temporarily storing N-bit SLC page data for a preferred ABL SLC pipeline and concurrent program with least power consumption. The N/2 Odd and N/2 Even source nodes of one DCR page are respectively connected to one common precharge power line LBLps via N/2 Even precharge NMOS transistors of MLBLS1 and another interleaving N/2 Odd precharge NMOS transistors of MLBLS2 and one MG-divider transistor to allow the independent and concurrent $C_{LG}$ precharging during LBL precharge cycle or concurrent discharging after the precharge or CS cycle. Both the precharge transistor and the MG-divider transistor are like string-select transistor with a same preferred BVDS≥7V.

The determination of each $C_{LG}$ size in NAND design is a tradeoff of array size increase, $C_{LG}$ precharge-current consumption, and the degree of flexibility of desired batch-based SLC concurrent operations allowed in same NAND plane. For the present invention, one embodiment is to set each $C_{LG}$ size to be H NAND blocks for limiting the array size increase less than 3%, where H≥4 and H is an integer. If array efficiency is ~70%, then NAND die size increase is controlled below 2% for adding this powerful batch-based concurrent ABL SLC program and read functions.

In another embodiment, the present invention provides a method of storing many preferred types of data or voltages respectively in each $C_{LG}$ or $C_{MG}$ of each LG-DCR or each MG-DCR in accordance with each ABL SLC program. For example, a $V_{LBL}$ voltage of 0V and a $V_{LBL}$ of Vinh~7V are respectively stored in the selected $C_{LG}$ after data conversion in accordance with one SLC digital page data for the SLC pipeline program and program-inhibit operations. The concurrent Vinh precharge voltage in each DCR for both SLC pipeline program and read via the selected precharge power lines. One page (WL) of N-bit analog sensing SLC bit data converted to Vinh and Vss before charge-sharing operation is performed for the regular selected $C_{LG}$ far away from the PB. One page (WL) of N-bit analog sensing SLC bit data converted to Vinh/N' and Vss after the charge-sharing operation is performed to dilute the voltage by factor N' depending on a ratio of participated $C_{LG}$ or $C_{MG}$ and multiple $C_{HG}$S. One page (WL) of N-bit analog sensing SLC bit data converted to Vdd and Vss before charge-sharing operation is performed when the selected $C_{LG}$ nears the PB with the least charge-sharing dilution and the initial Vinh precharge being replaced by Vdd precharge.

In yet another embodiment, the present invention discloses a block-decoder and its associated self-timed delay control circuit configured to provide each set of Vpgm, Vpass, Vread, and Vss for single selected WL, multiple non-selected WLs, one pair or string-select control lines, can be collectively charged, locked during SLC pipeline and concurrent program and then automatically discharged when SLC pipeline program is completed. The operation of this self-timed delay control circuit of the block decoder is divided into several steps at least including: 1) using the on-chip State-machine to generate one-shot pulse for ENBm with a predetermined delay t1 to discharge from initial Vdd to generate a Vref voltage for one reference input of 2 differential amplifiers (DA). Note, one design option of t1 is the time interval of around 5 μs for charging Vpgm and Vpass to the selected block's 128 WLs; 2) generating a self-timed delay of 50 μs aligned to above 5 μs in full tracking of 10×RC delay to generate the preferred one-pulse 50 μs and Vpgm=20V for this preferred SLC pipeline and concurrent program without verification.

In still another embodiment, the present invention further discloses a DRAM-like sense amplifier (SA) circuit including a Sample and Hold circuit and a Latch-type SA circuit. The Sample and Hold circuit is configured such that the 1-bit of Vinh/Vss and 1-bit of Vinh/2 sample-hold storage that use 2 adjacent $C_{MG}$ capacitors in WL-direction of 2 adjacent bits of DCR to store each bit of sector diluted sensing analog data of Vinh/(L×J) as high or (Vinh−ΔV)/(L×J) or Vss as low after the charge-sharing operation and one bit of diluted reference voltage of (Vinh−ΔV/2)/(L×J) for a DRAM-like SA to distinguish the sensed SLC bit data of Vtp from Vte, where ΔV is about 2V up to Vinh depending on SA design. The Latch-type SA circuit is configured to be like DRAM's SA with a capability to differentiate at least 50 mV signal difference presented in 2 inputs.

4. BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 5A shows an ABL random-1WL pipeline SLC program sequence according to an embodiment of the present invention.

FIG. 5B shows a multiple-WL pipeline SLC program carried out in the NAND array built by strings of FIG. 1B, or FIG. 1C or FIG. 1D according to another embodiment of the present invention.

FIG. 13A shows control voltages and one-shot waveforms of varied control signals in each block-decoder according to an embodiment of the present invention.

5. DETAILED DESCRIPTION OF THE INVENTION

Figure 1A:
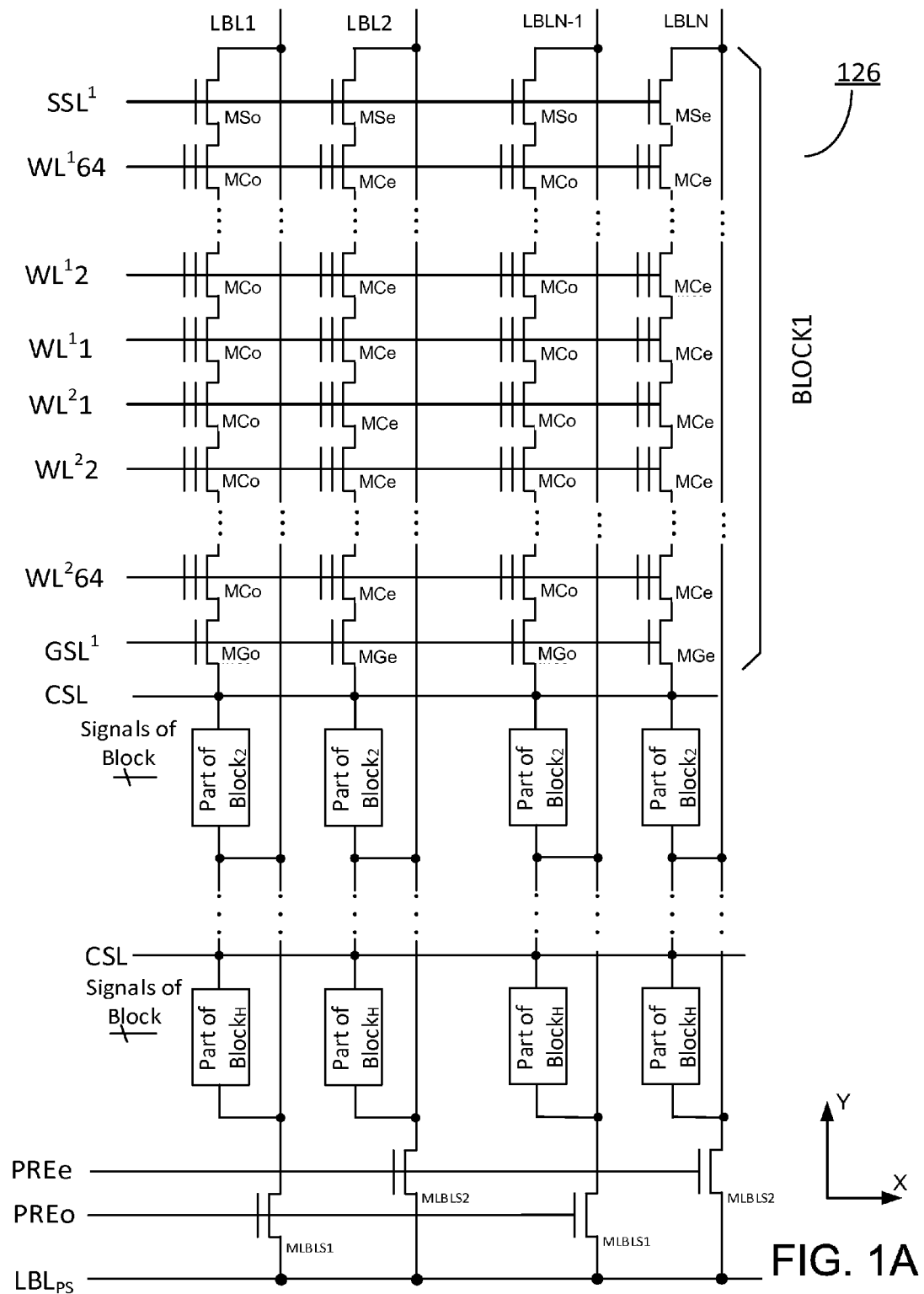
FIG. 1A is a diagram of a hierarchical-BL NAND array with m0 and m1 interleavingly laid Odd and Even LBL lines for a full shielding effect and a bottom common source line shared by two adjacent blocks according to an embodiment of the present invention.

In the following detailed description of the present embodiments, reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the present disclosure. The following detailed description, therefore, not to be taken in a limitation sense.

Through multiple embodiments, the present invention is to improve all aspects of non-pipeline and non-concurrent single SLC NAND program or single read operation in one plane of non-hierarchical legacy NAND, particularly for NAND design down to 20 nm, regardless of 2D or 3D NAND manufacturing technologies. In particular, the present invention provides a batch-based hierarchical-BL NAND array configured for performing multiple pages of a self-timed SLC program without program-verify in a pipeline and concurrent manner so that the advantages of performing faster SLC program and read operations, lower power consumption, less WL disturbance and longer P/E cycles with disadvantage of a widened SLC program Vt distribution but sufficient SLC Vt-gap can still be achieved. In an embodiment, each SLC pipeline and concurrent program scheme can also be implemented with a program-verify with advantage of achieving a tighter SLC program Vt distribution and larger Vt-gap for superior data reliability but at expense of longer program time and higher power consumption. The SLC program without a verify step is particularly useful when a Vdd supply of NAND chip is suddenly removed. A quick and self-timed SLC program will secure the SLC program to be completed in less time with lower power consumption.

Up to year 2014, all NAND key operations are performed in unit of single WL in single selected NAND plane, regardless of SLC, MLC, TLC, and XLC, regardless of 2D or 3D NAND technology. Although there are many prior art disclosing multiple-WL program, read and verify or mixed operations in multiple independent blocks in multiple independent planes, there are no solutions to allow multiple WLs to be randomly read, programmed and verified within same plane. This is what we referred as the batch-based pipeline or concurrent operations of NAND designs. When more than 10 WLs in different blocks and groups within the same or different planes are selected for a batch-based pipeline or concurrent erase, program, verify, and read, more than 10-fold improvements in speed and power performance can be easily achieved.

In the specification below, different examples of SLC ABL program and ABL-like read schemes are used under several specific hierarchical NAND array structures to describe the inventive concepts. But for those ordinary skilled in art, any derivatives of the solutions based on the specific NAND array designs of the presentation should be further covered herein. For example, in an embodiment, the present invention provides a SLC program without a program-verify step executed in a pipeline and concurrent manner. In particular, preferred methods of performing batch-based SLC NAND pipeline and concurrent program and read operations are described in details, including random page and partial or full block SLC erase, SLC erase-verify, SLC ABL pipeline and concurrent program, and SLC ABL-like read optimized with $V_{LBL}$ voltages of Vinh and Vinh−ΔV, where the smallest value of Vinh−ΔV is Vss developed in each corresponding LBL parasitic metal line capacitor $C_{LBL}$ before the charge-sharing operation is performed between each $C_{LBL}$ and each corresponding GBL parasitic metal line capacitor $C_{GBL}$.

Figure 1B:
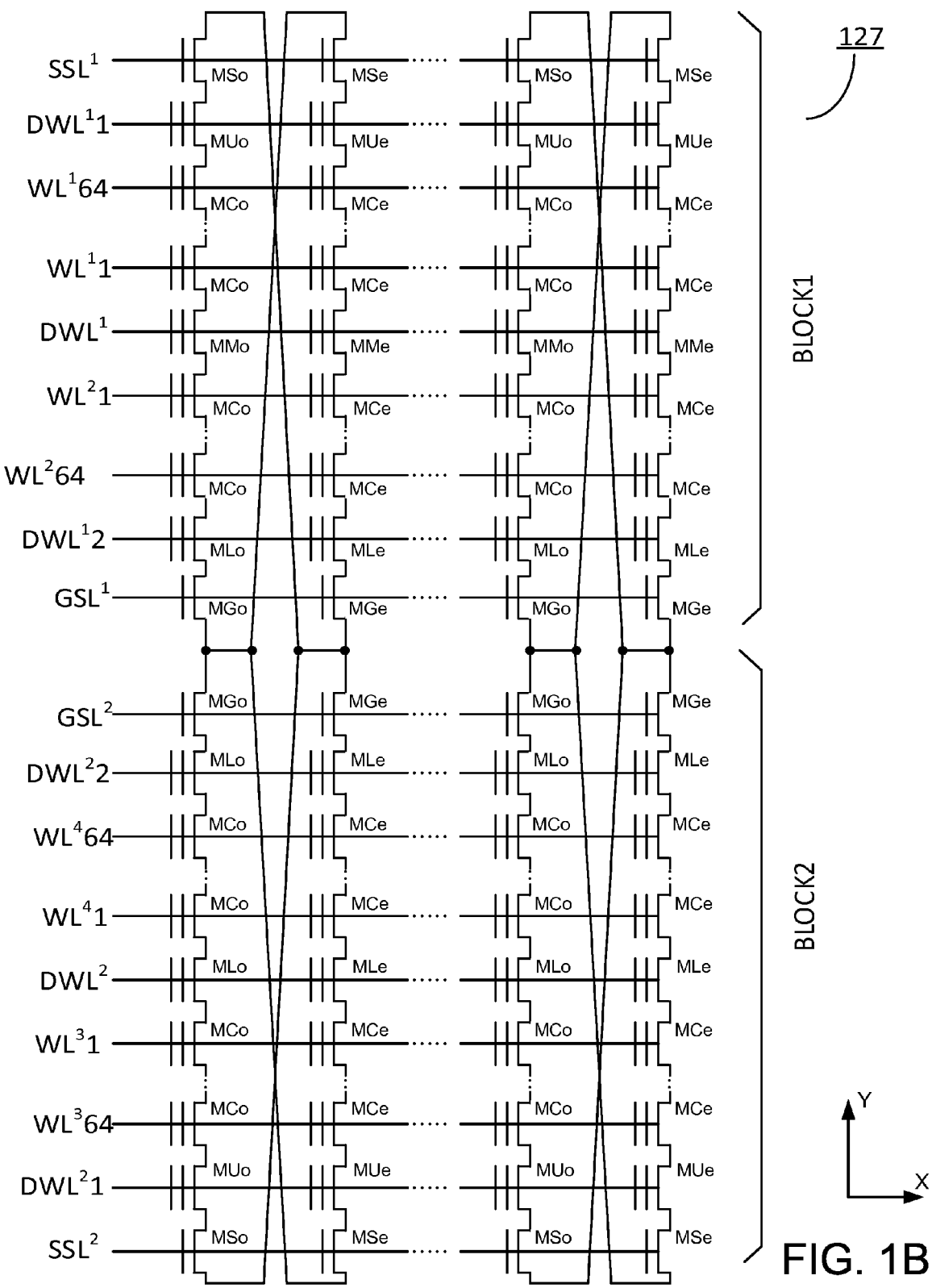
FIG. 1B is a diagram of two blocks of a hierarchical-BL NAND array with m0 and m1 interleavingly laid and zigzag connected Odd and Even LBL lines for a full shielding effect without any horizontal common source line according to another embodiment of the present invention.
Figure 1C:
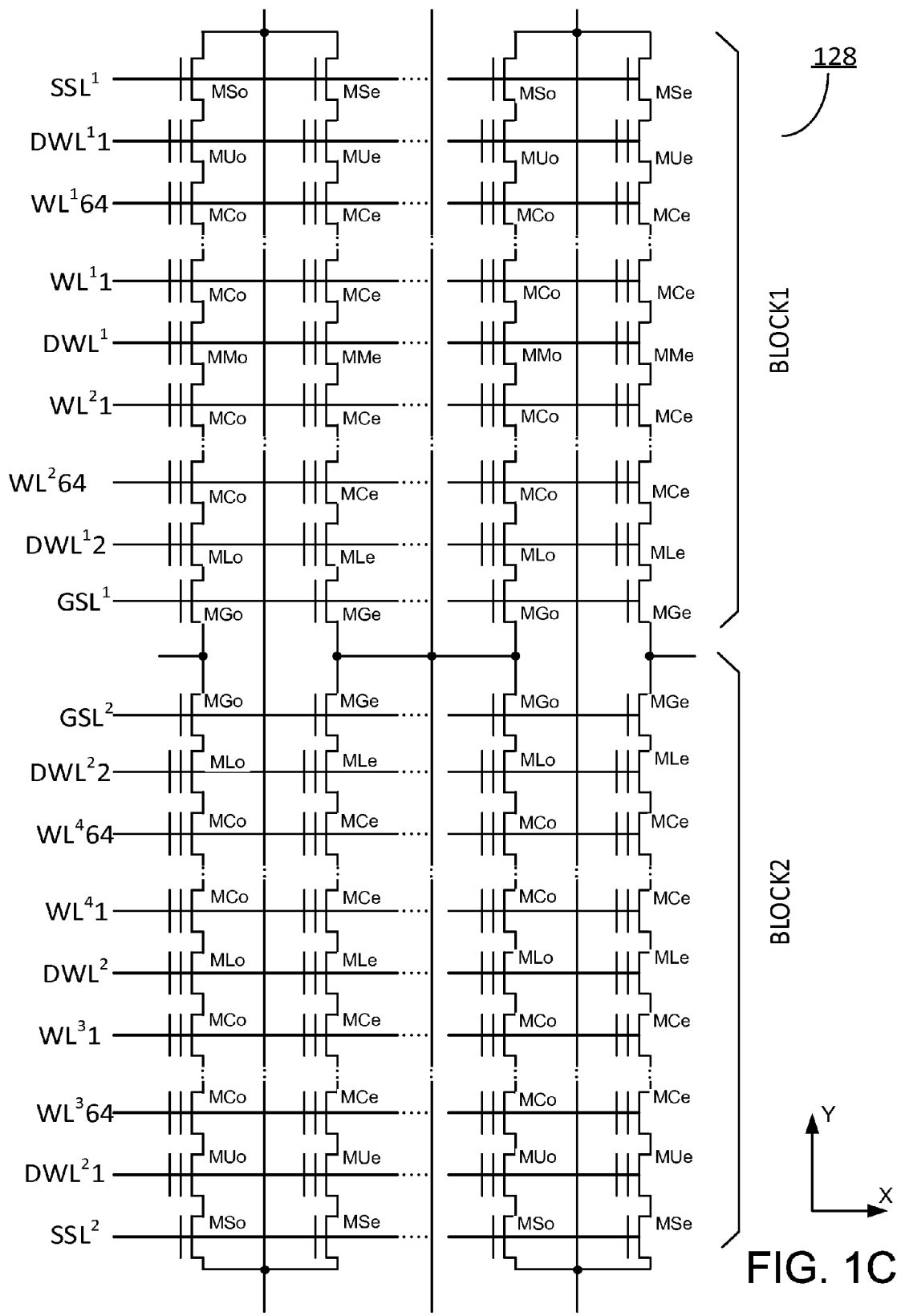
FIG. 1C is a diagram of two blocks of a hierarchical-BL NAND array with a plurality of paired Odd and Even NAND strings with individual LBLs without adding an extra large string transistor and without any common source line according to yet another embodiment of the present invention.
Figure 1D:
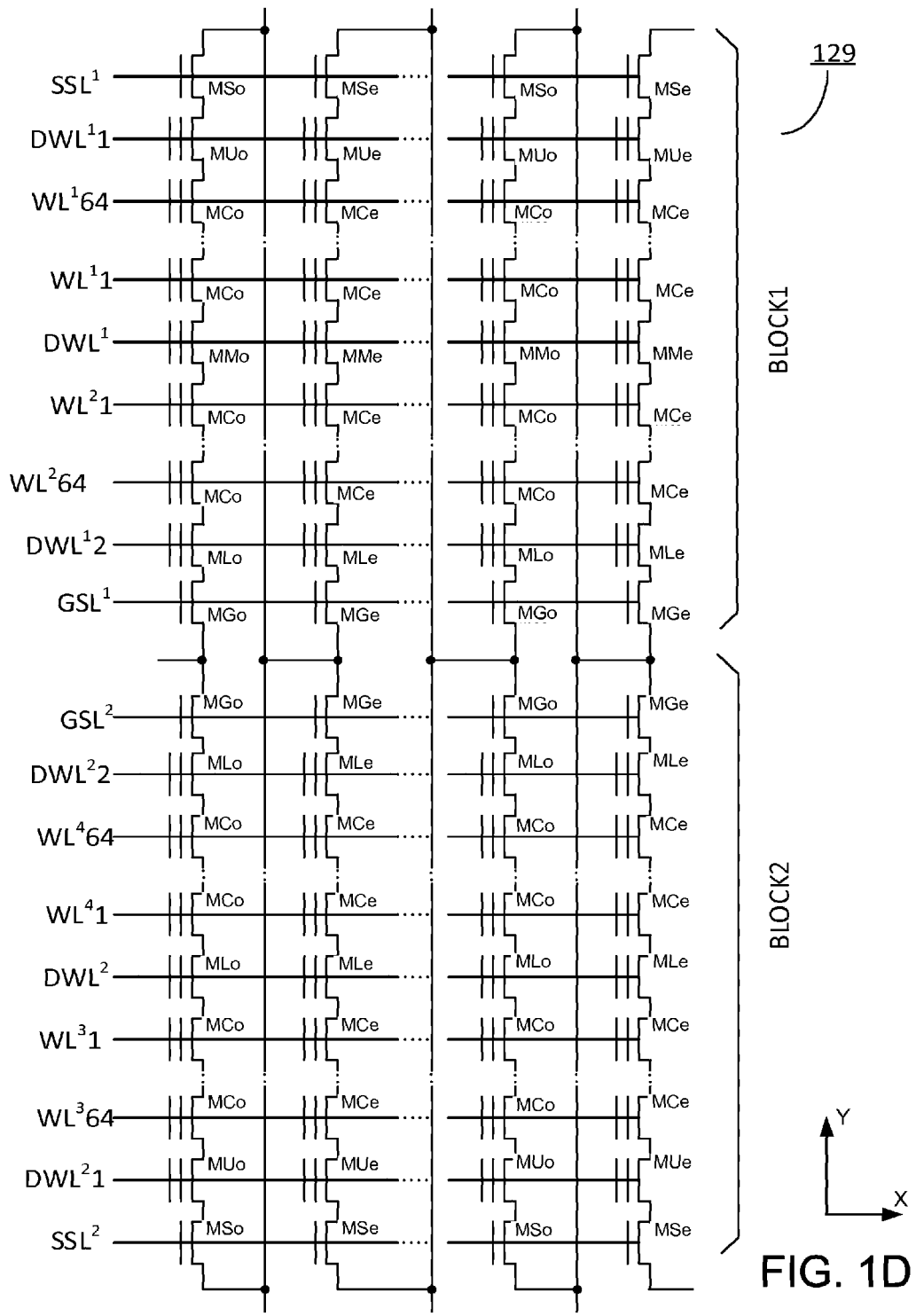
FIG. 1D is a diagram of two blocks of a hierarchical-BL NAND array with a plurality of paired Odd-Even NAND strings zigzag connected to individual broken LBLs without adding an extra large string transistor according to still another embodiment of the present invention.

In addition to NAND array based on FIG. 1A NAND blocks with an array scheme of (GBL//LBL)⊥(CSL//LBLps), for those hierarchical NAND arrays based on NAND blocks of FIG. 1B, FIG. 1C and FIG. 1D with (GBL//LBL)⊥LBLps scheme, the present invention also provides a source line voltage $V_{SL}$-based Vt-offset for SLC read operation which can be used to offset SLC widened, shifted Vt distribution and narrower Vt-gap due to Yupin-coupling effect between adjacent BL-BL and WL-WL for more accurate and reliable SLC read. Note, the symbol of "//" stands for "parallel", while the symbol of "⊥" stands for "orthogonal."

It is known that each SLC NAND memory cell can store two threshold voltages, Vte and Vtp. The 2-state cell is referred as a SLC cell, which means 1b/cell. The SLC memory states are assigned with logical data "1" for Vte and "0" for Vtp. At least one current breakpoint level between two states is generally established so as to partition the conduction window of each SLC cell into two ranges. When the SLC cell is read by applying predetermined, fixed voltages, on its gate of WLn, its source/drain conduction current is resolved into one of the memory states by comparing it with the breakpoint level, e.g., reference voltage, or reference current. If the current read is higher than that of the breakpoint level, the SLC cell is determined to be "on" and in the logical state of "1." If the current is less than the breakpoint level, the SLC cell is determined to be "off" and in the other logical state of "0." In one example of a SLC NAND memory, one of the final desired voltage threshold (Vte) is negative after each SLC cell is erased, and defined as logic "1." Conversely, the final SLC program threshold voltage (Vtp) is positive after a SLC program operation, and defined as logic "0." When the threshold voltage is negative and a read is attempted by applying 0 volts to the selected SLC cell's control gate, the SLC cell will turn on to indicate logic one is being stored. When the threshold voltage is positive and a read operation is attempted by applying 0 volts to SLC cell's control gate, the SLC cell will not turn on to indicate that logic zero is being stored.

Typically, all prior art SLC NAND cell Vts are defined and measured from cell gate voltage, $V_{WL}$, with respect to its common source node. Normally, a source node voltage $V_{SL}$ for all selected SLC cells in a selected WL is held at Vss during SLC read and program-verify operations. The negative erase state Vte of the prior art NAND cell can be as low as −3V with a distribution as wide as 2V. But a single program state Vtp of the cell is kept pretty narrow-width, ranging from 0.2V to 0.5V when the SLC program is performed along with a tight-Vt program-verify operation at the expense of more iterative Vpgm steps or longer program time with a smaller ΔVpgm.

On the contrary, by adopting a NAND scheme of this invention using an adjacent BL as a SL per string, the way of Vt measurement can be more effective by assigning $V_{SL}$ a value to adjust cell's effective Vt in accordance with the SLC value stored in two adjacent BLs and one adjacent WL that will be programmed a SLC page data thereafter the current one being locked out already.

Throughout the specification, when N-bit is referred, it means that total 8 KB physical NAND cells residing in one physical WL or Page not including the additional syndrome ECC bytes. Thereby, N/2-bit means 4 KB which is half page or ½ WL size storing 4 KB regular NAND cells. 8 KB and N-bit or 4 KB and N/2-bit are alternately used in this specification and should be treated as the same.

In certain embodiments, although the following examples are focusing on SLC erase, ABL SLC program without verify, HBL read of NAND arrays made of NAND strings in certain configurations such as FIG. 1B, FIG. 1C and FIG. 1D without CSL proposed in the present invention can be also applied to the mainstream NAND array with CSL such as FIG. 1A without providing individual $V_{SL}$-based Vt-offset read operation. The whole inventive concepts disclosed herein should not be limited to any particular NAND arrays and memories, regardless of 2D or 3D NAND, PMOS-cell or NMOS-cell NAND, 2-poly floating-gate cell or 1-poly charge-trapping cell NAND.

Based on a typical NAND program-speed measurement that plots individual program Vt increments vs. program time under different NAND cell gate voltages with cell channels being held at one identical voltage of 0V and $V_{TPW}$=0V and $V_{DNW}$=Vdd, it has been shown that within a same program time, the higher gate program voltage, the higher increase in NAND cell's program Vt. Assuming that the NAND cell Vts are increased from one same initial negative erase state with Vte of −3.0V, with long-enough program time (longer than ~20 μs program pulse), the final programmed cell Vt differences are well maintained and controlled in the same degree by the different gate voltages with a same cell channel voltage at 0V. With 1V difference among the different gate voltages, the final cell Vt values are automatically and approximately tracking with the 1V gate voltage difference after the elapse of several iteratively accumulated program time period that is longer than ~100 μs. For NAND cell Vt value within a negative range, the Vt increment is larger. But when NAND cell Vt becomes a positive value, the degree of cell's Vt increment gradually becomes smaller due to that more electrons accumulated in floating gate would generate the repulsive force to slow down the electron injection into the floating gate from a 2-poly cell channel or into the charge-trapping layer of a 1-poly cell channel.

After a longer accumulated program time (>100 μs), Vt difference of 1V for the NAND cells is approximately realized in accordance with the 1V difference among the gate voltages. In other words, with one identical initial negative Vte, multiple final equally-spaced Vt program states can be obtained at almost same time without earlier lockout state under certain pre-assigned program gate voltages of Vpgm with an equal difference. In other words, using one same program gate voltage Vpgm of 20V, but different channel voltages of 0V for programming and of Vinh for inhibiting, a preferred pipeline SLC program operation without verify can be executed. As a result, a larger Vt difference or Vt-gap between Vte and Vtp can be readily achieved if the Vtp width is controlled within a desired range of less than 3V.

In another SLC program Vt distribution measurement for 1 Gb cell under conditions of one-pulse of 50 μs and Vpgm=20V without a program verify, a resultant program state center Vt value is set around 1.8V with a width of about 3V but a minimum Vt value is only around 0.3V, which is too close to 0V without enough margin to reliably distinguish from Vte of erase-state cell. In addition, for a page size of 8 KB used as example for current invention, the final Vt distribution of Vtp in one WL should be much less than 3V.

Further under alternative SLC program conditions of 100 μs and Vpgm=20V without a program verify, the above Vt distribution measurement yields the resultant program state center Vt value to be around 2.3V with a width of about 3V and Vtpmin≥1.1V. The optimal Vread is made to be ≥Vtpmax+1V, while the optimal VR for SLC read operation is defined as ½(Vtpmin−Vtemax) to obtain the equal read margin between Vte and Vtp with a condition VR≥0V.

FIG. 1A is a diagram of a hierarchical-BL NAND array with m0 and m1 interleavingly laid Odd and Even LBL lines for a full shielding effect and a bottom m0 common source line (CSL) shared by two adjacent blocks according to an embodiment of the present invention. This diagram is merely an example, which should not unduly limit the scope of the claims. One of ordinary skill in the art would recognize many variations, alternatives, and modifications. As shown, one of H blocks of the NAND array 126 with hierarchical-BL structure includes N strings and 128 regular WLs of cells divided into two halves (each being arranged from WL1 through WL64 from middle of the strings) and one row of N top string-select transistors MS respective coupled drain nodes of the N strings to N local bit lines (LBLs) and one row of bottom string-select transistors MG respectively coupled source nodes of the N strings to a common source line (CSL). The total H blocks forms a LG group. All N LBLs for the total H blocks are continuous through the LG group. Each of the N LBLs forms a $C_{LG}$ capacitor and is alternatively laid in m0 level for Odd (or Even) numbered lines and m1 level for Even (or Odd) numbered lines. The Odd/Even numbered LBLs are coupled via N/2 precharge devices MLBLs to connect to a precharge power line LBLps per one LG group laid in parallel with the CSLs. The NAND array 126 is formed by many more such LG groups, though not directly shown in FIG. 2A, any two adjacent LG groups being divided by a row of N LBL-dividers (not shown) that can be controllably connected to form a MG group. For example, each MG group includes J' LG groups. Further, L MG groups form a HG group which is associated with another metal line per string laid at m2 level above the m0 and m1 level as a broken GBL. The whole NAND plane can have J number of HG groups (not shown in FIG. 1A) so that any adjacent broken GBLs for each of N columns can be controllably connected by one of N GBL-dividers. In an embodiment, each CSL per block and each precharge power line LBLps per LG group are made of metal lines for reducing resistance to allow clean discharging or low-power precharging. Both of them can be either laid at a level below the m0 and m1 level of the LBLs or higher than m2 level of the GBLs.

Each broken LBL is a basic unit $C_{LG}$ capacitor configured to be 1-bit dynamic CACHE register (DCR) associated with each LG group for temporarily storing respective $V_{LBL}$ program and program-inhibit voltages precharged via one precharge device, MLBLs, gated by PREo signal for Odd numbered broken LBL and PREe signal for Even numbered broken LBL, from the LBLps precharge power line connected with a Vinh voltage supply ($\geq 7V$).

For both SLC program and read operations, LBL precharging is preferably performed concurrently in ABL scheme within one physical page of 8 KB local $C_{LG}$s (one 8 KB DCR) for power saving and latency reduction of high-voltage Vpgm and Vpass stresses on 128 WLs of any selected block. Although not explicitly shown in FIG. 1A, each Odd numbered LBL metal line per one LG group is laid at m0 level and each Even numbered LBL metal line is laid at m1 level. Each charged Odd/Even LBL metal line with 1λ width and 1λ spacing is shielded by a grounded Even/Odd metal line at the same m0 or m1 level to attain a full LBL electrical shielding effect to substantially eliminate Yupin LBL-LBL AC coupling effect during the ABL program and program-inhibit operations. More details about the interleaving m0/m1 metal line layout with grounded shield line will be provided below.

FIG. 1B is a diagram of two blocks of a hierarchical-BL NAND array with m0 and m1 interleavingly laid and zigzag connected Odd and Even LBL lines for a full shielding effect without any horizontal CSL according to another embodiment of the present invention. This diagram is merely an example, which should not unduly limit the scope of the claims. One of ordinary skill in the art would recognize many variations, alternatives, and modifications. As shown, only two blocks, BLOCK1 and BLOCK2, of a hierarchical broken-LBL and broken-GBL NAND array 127 are explicitly provided with interleaving and zigzag Odd and Even LBL lines without any common source line in WL direction. Each LBL line is connected to one string as a dedicated local bit line and is also connected to an adjacent string correspondingly as a dedicated local source line. In addition, each string includes 2 dummy cells being programmed with two complementary SLC states to act as the Odd and Even string select transistors without using one additional large transistor per string with size as the original MS and MG devices to keep NAND string length almost same without increase to save array size.

Similarly, except the difference in each basic block structure described above versus that shown in FIG. 1A, all other features of the hierarchical broken-LBL and broken-GBL NAND array 127 remain the same, including J HG group connected by top-level m2 broken GBL metal line and each HG including a plurality of LG groups connected by the broken LBL lines. Each Odd numbered LBL metal line per one LG group is laid at m0 level and each Even numbered LBL metal line is laid at m1 level, respectively been configured to be a m0 or m1 level $C_{LG}$ capacitor or one-bit DCR isolated by a LG-divider and used to temporarily store the 0V and Vinh ~7V in accordance with SLC program digital data of Vss and Vdd for respective SLC's $V_{LBL}$ program and program-inhibit voltages precharged via a precharge device, MLBLs, gated by a PRE signal, from a precharge power line of LBLps per LG group connected to Vinh ($\geq 7V$) supply.

In a specific embodiment, with the block structure proposed here, SLC program and LBL precharge operations are preferably performed in ABL scheme within one physical page of N local $C_{LG}$ capacitors of one DCR register for power saving and reduction of high-voltage stress. But SLC read and dummy cells' program-verify operations can be performed in HBL scheme in two cycles, first for all N/2 Odd numbered strings, then for all N/2 Even numbered strings.

FIG. 1C is a diagram of two blocks of a hierarchical-BL NAND array with a plurality of paired Odd and Even NAND strings with individual LBLs without adding an extra large string transistor and without any common source line according to yet another embodiment of the present invention. This diagram is merely an example, which should not unduly limit the scope of the claims. One of ordinary skill in the art would recognize many variations, alternatives, and modifications. As shown, in a hierarchical broken-LBL and broken-GBL NAND array 128 a plurality of paired NAND strings without any common source line forms basic structure for each block. Each paired NAND strings includes one Odd and one Even string respectively connected to Odd and Even LBLs without adding an extra large string-select transistor to keep each string size the smallest one. Instead, a paired but small programmable NAND dummy cells with two complementary programmed Vts are used to act as the small Odd and Even NAND string-select transistors for area saving. Each string has its individual LBL and uses its physically adjacent LBL as its dedicate LSL. All other features of the hierarchical broken-LBL and broken-GBL NAND array remain the same, including J HG group connected by top-level m2 broken GBL metal line and each HG including a plurality of LG groups connected by the broken LBL lines.

In a specific embodiment, this NAND string scheme includes a single level metal line for all LBLs because the zigzag LBL connection in FIG. 1B has been removed by straight LBL lines. But 2 tight 1λ-width and 1λ-spacing m0 and m1 metal lines with interleaving grounded lines are still preferred for laying the Odd and Even numbered LBLs to attain a full LBL shielding effect so that ABL pipeline and concurrent SLC program and HBL read operations can be easily performed without the degradation of data reliability. All other features of the hierarchical broken-LBL and broken-GBL NAND array 128 remain the same, including J HG group connected by top-level m2 broken GBL metal line and each HG including a plurality of LG groups connected by the broken LBL lines. Each Odd/Even numbered LBL metal line per one LG group is configured to be a $C_{LG}$ capacitor or one-bit DCR isolated by a LG-divider and used to temporarily store the 0V and Vinh for respective SLC's $V_{LBL}$ program and program-inhibit voltages precharged via a precharge device, MLBLs, gated by a PRE signal, from a precharge power line of LBLps per LG group connected to Vinh ($\geq 7V$) supply.

FIG. 1D is a diagram of two blocks of a hierarchical-BL NAND array with a plurality of paired Odd-Even NAND strings zigzag connected to individual broken LBLs without adding an extra large string transistor according to still another embodiment of the present invention. This diagram is merely an example, which should not unduly limit the scope of the claims. One of ordinary skill in the art would recognize many variations, alternatives, and modifications. As shown, in a hierarchical broken-LBL and broken-GBL NAND array 129 each block includes a plurality of paired NAND strings including one Odd and one Even BL string without adding an extra large string transistor. Instead, paired but small programmable NAND dummy cells, such as MUe and MUo or MLe and MLo, are used with 2 complementary Vts (Vte and Vtp) to act as Odd and Even string-select for keeping the string-size the smallest one throughout the whole NAND plane of the hierarchical broken-LBL and broken-GBL NAND array 129. Similarly, each string has its individual LBL and uses its adjacent LBL as an individual LSL.

All other features of the hierarchical broken-LBL and broken-GBL NAND array remain the same, including J HG group connected by top-level m2 broken GBL metal line and each HG including a plurality of LG groups connected by the broken LBL lines. Each Odd numbered LBL metal line per one LG group is laid at m0 level and each Even numbered LBL metal line is laid at m1 level, respectively been configured to be a m0 or m1 level $C_{LG}$ capacitor or one-bit DCR isolated by a LG-divider and used to temporarily store the 0V and Vinh for respective SLC's $V_{LBL}$ program and program-inhibit voltages precharged via a precharge device, MLBLs, gated by a PRE signal, from precharge power line of LBLps per LG group connected to Vinh (≥7V) supply.

Figure 2:
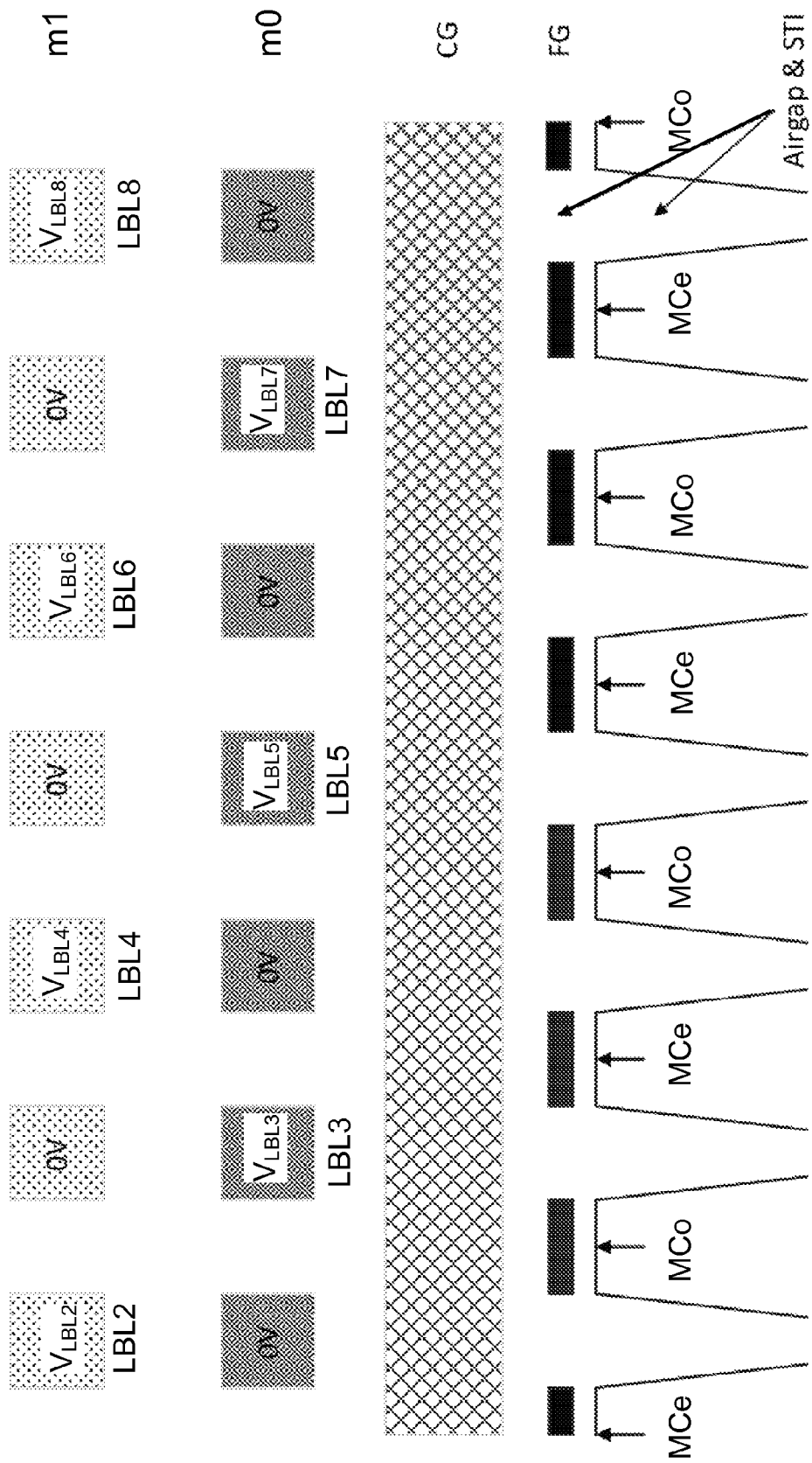
FIG. 2 shows a cross-sectional view of two interleaving LBL metal lines, m0 and m1, adopted by a 2-level hierarchical-BL NAND array structure according to an embodiment of the present invention.

FIG. 2 shows a cross-sectional view of a layout option of two interleaving LBL metal lines, m0 and m1, adopted by a 2-level hierarchical-BL NAND structure for those NAND arrays based on NAND blocks shown in FIG. 1A, FIG. 1B, FIG. 1C, and FIG. 1D according to varied embodiments of the present invention. This diagram is merely an example, which should not unduly limit the scope of the claims. In an alternative embodiment, a layout of single-level m0 only LBL metal lines can be used for above NAND blocks shown in FIG. 1A, FIG. 1C, and FIG. 1D. One of ordinary skill in the art would recognize many variations, alternatives, and modifications. As shown, two m0 and m1 metal lines are both made of a tight metal line with 1λ width and 1λ spacing adopted by this 2-level hierarchical-BL NAND array structure. Each Odd numbered LBL line laid in m0 level is connected to drain node of a corresponding Odd string for storing 1-bit of data but one adjacent Even number metal line at m0 level is not connected to any adjacent string but is grounded to provide electrical shielding. Similarly, each Even numbered LBL line laid in m1 level is connected to drain node of a corresponding Even string for storing 1-bit of data but one adjacent Odd number metal line at m1 level is not connected to any adjacent string but is grounded to provide electrical shielding. In other words, each interleavingly laid Odd/Even m0/m1 LBL is fully shielded for performing ABL SLC pipeline and concurrent program with Yupin BL-BL coupling effect being substantially eliminated.

In a specific embodiment, a full ABL page data is divided into two interleaving groups with two alternatively shielded m0 and m1 LBLs. As a consequence, an ABL NAND program scheme can be realized without suffering any LBL-coupling effect. For the hierarchical broken-LBL and broken-GBL NAND array 126, 127, 128, and 129 described above, the GBLs can be configured to have a greater pitch size (with larger spacing between adjacent top-level metal lines) by multiplexing several LBLs into one GBL, so that not only the GBL-coupling effect can be reduced or even eliminated but also the corresponding 8 KB size page buffer can be reduced by multiple folds.

Figure 3A:
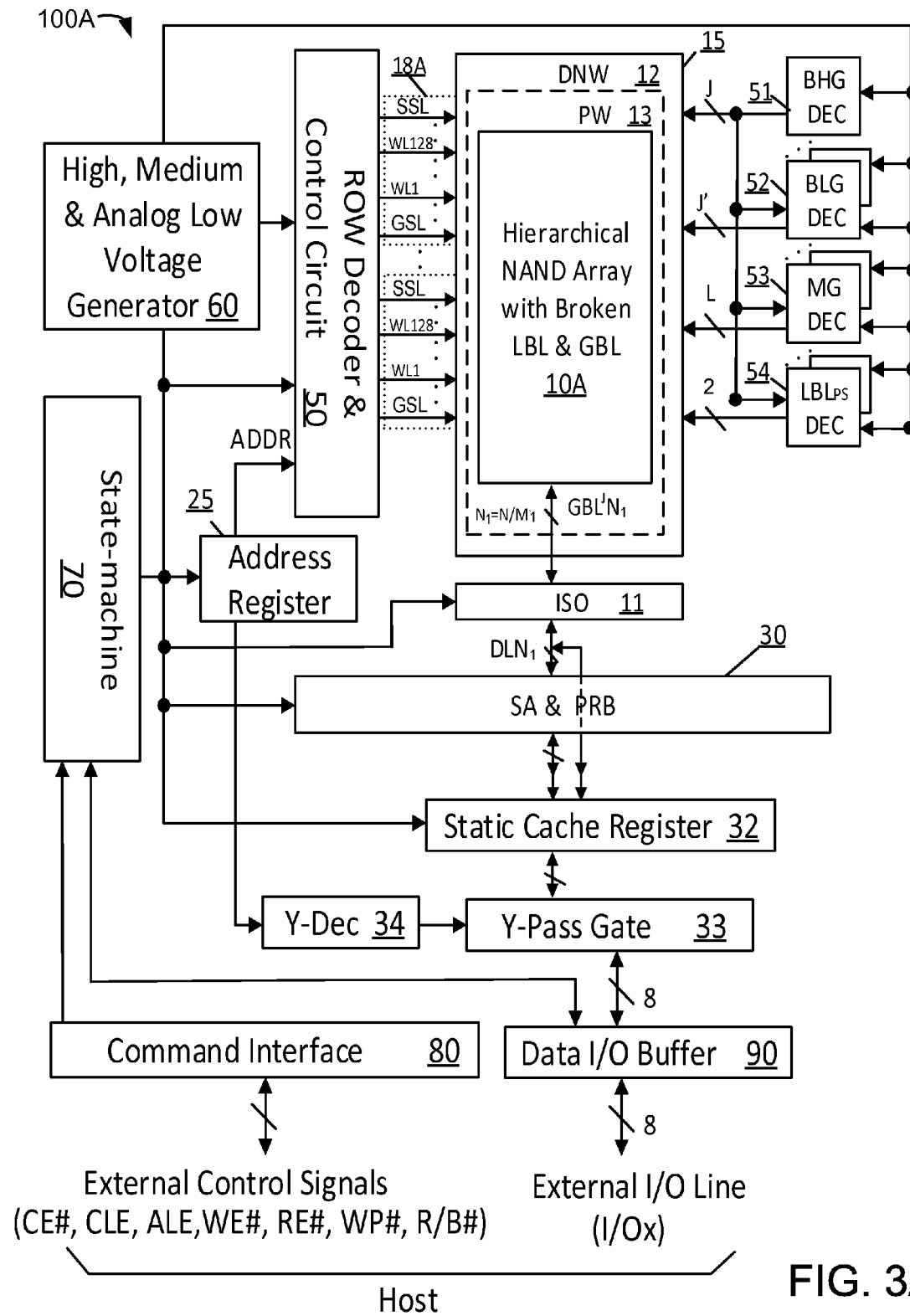
FIG. 3A is a diagram of a NAND chip including a preferred hierarchical-BL NAND array and associated block-decoders and page buffer, Static Cache Registers, I/Os, and Row-decoders according to an embodiment of the present invention.

FIG. 3A is a diagram of a NAND chip including a preferred hierarchical-BL NAND array and associated block decoders and page buffer, Static Cache Registers, I/Os, and row decoders according to an embodiment of the present invention. This diagram is merely an example, which should not unduly limit the scope of the claims. One of ordinary skill in the art would recognize many variations, alternatives, and modifications. As shown, a NAND chip 100A preferred hierarchical-BL NAND array 15 and associated page buffer 30. The page buffer (PB) 30 contains a sense amplifier and program-register buffer (SA & PRB) coupled to Static Cache Register (SCR) 32. The hierarchical-BL NAND array 15 includes a NAND plane 10A formed on a P-well 13 in a deep N-well 12 on top of a P-substrate. The NAND plane 10A is made of a plurality of HG groups comprising a plurality of LG groups. A plurality of isolated metal lines arranged in parallel are associated with each HG group of NAND cells at top level and each LG group of NAND cells at lower level in the NAND array, each forming a 1-bit HG-based or LG-based dynamic CACHE register (DCR). Each LG group is made of multiple blocks. Each block is made of a plurality of NAND strings substantially the same as the one described in FIG. 1A. Each block includes a common source line (CSL) connected to each NAND string and each LG group includes one LBLps precharge power line connected to each LG-based DCR. The NAND chip 100A also includes data I/O buffer 90, Y-pass gate circuit 33, and Row-decoders 50, State-machine 70, ISO row circuit 11, a plurality of group-decoders including BHG-DEC 51, BLG-DEC 52, MG-DEC 53 with self-timed delay control, and a LBLps-DEC 54 for precharging LG-based DCR for setting common source line (CSL) voltages at either Vdd or Vss. The Row-decoder 50 is configured to provide a set 18A of WL voltages for all 128 (or other number) pages of NAND cells and string-select control voltages for top SSL string-select devices and bottom GSL string-select devices. The NAND chip 100A further includes command interface 80 and HV, MHV, and LV voltage generator circuit 60. The State-machine 70 is configured to receive external control signals from the command interface 80 and external data from the data I/O buffer 90 to generate operation instruction to High, Medium, and Analog voltage generator 60 and address register 25 and to control ISO row circuit 11, SA & PRB 30 and SCR 32.

The hierarchical-BL NAND plane 10A includes a plurality of paired NAND blocks each with a plurality of NAND strings having broken LBL and GBL lines served as varied size on-chip DCRs for temporarily storing charges or data with voltages being preferably converted in Vinh and Vss form so that speedy pipeline and/or concurrent ABL SLC program, ABL-like read, erase-verify operations can be performed more than 10-fold faster with substantial reduction in latency, power consumption, and Vpgm, Vpass, Vread WL stress for achieving a longer P/E cycle. For example, when $M_1$ numbers of WLs are selected from dispersed $M_1$ LG groups for performing pipeline and concurrent SLC program, the performance of the SLC NAND chip is at least $M_1$-fold enhanced.

In a specific embodiment, the NAND chip 100A includes a $M_1$-to-1 multiplexer to convert $M_1$ numbers of LBLs at lower m0/m1 level to a single GBL at top m2 level, a $M_1$-fold reduction in PB and SCR areas can be realized while still keeping operational schemes of ABL SLC program and ABL-like SLC read. In a simplest example, $M_1=2$, the PB size is then reduced by ½ from 8 KB to 4 KB per one physical page of 8 KB cells. Each WL page contains two HBL sectors, an Odd-BL sector and an Even-BL sector, with a sector size of 4 KB.

In another specific embodiment, the NAND chip 100A is able to provide a dramatic improvement over prior art in ABL SLC program operation by adopting a Vinh (~7V) as the program-inhibit voltage without sole relying on Vpgm WL-boost program scheme of using Vdd as program-inhibit BL voltage. As a result, improved NAND operations like random page or partial-block erase, ABL program, and ABL-like read can be realized in different blocks of the same NAND plane 10A.

In yet another specific embodiment, the NAND chip 100A includes a plurality of BHG, BLG, MG, LBLps, and CSL decoders and LG-based DCRs to allow multiple pipeline SLC program and read operations to be performed partially concurrently in the same plane of NAND array. Some of the preferred SLC pipeline/concurrent operations include SLC read while SLC program and erase-verify, or SLC program while erase-verify and SLC read, or a second SLC pipeline program while a first SLC pipeline program, or a second SLC pipeline read while a first SLC pipeline read.

Figure 3B:
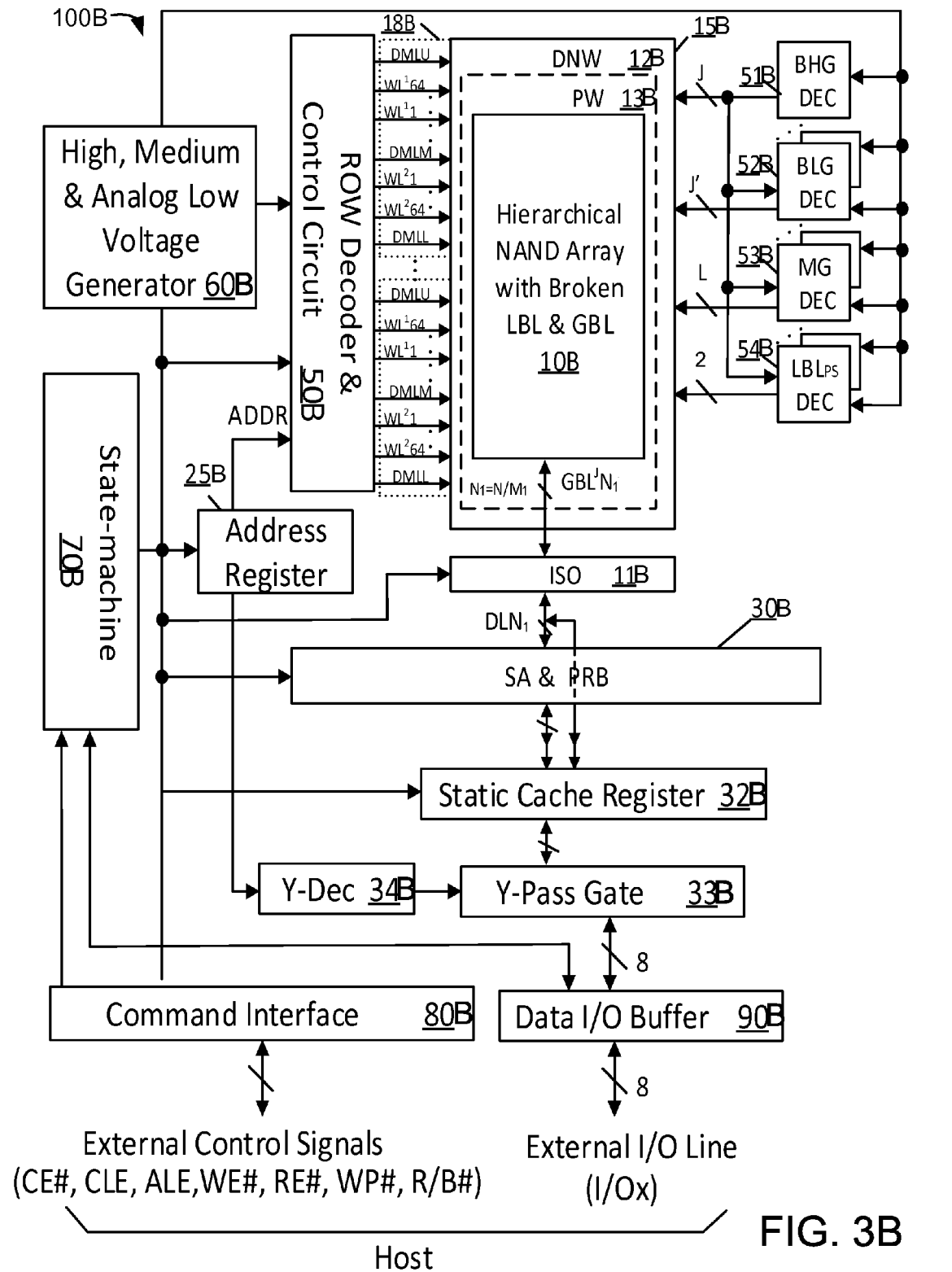
FIG. 3B is a diagram of a preferred hierarchical-BL NAND array and associated BHG, BLG, MG, and LBLps decoders and page buffer, Static Cache Registers, I/Os, Row-decoders and State-machine according to another embodiment of the present invention.

FIG. 3B is a diagram of a preferred hierarchical-BL NAND array and associated block-decoders and page buffer, Static Cache Registers, I/Os, and Row-decoders according to another embodiment of the present invention. This diagram is merely an example, which should not unduly limit the scope of the claims. One of ordinary skill in the art would recognize many variations, alternatives, and modifications. As shown, a NAND chip 100B with a preferred hierarchical-BL NAND array 15B and associated page buffer 30B is provided. The page buffer (PB) 30B contains SA & PRB coupled to a SCR 32B. The hierarchical-BL NAND array 15B includes a NAND plane 10B formed on a P-well 13B in a deep N-well 12B on top of a P-substrate. The NAND plane 10B is made of a plurality of HG groups comprising a plurality of LG groups. A plurality of isolated metal lines arranged in parallel are associated with each HG group of NAND cells at top level and each LG group of NAND cells at lower level in the NAND array, each forming a 1-bit HG-based or LG-based dynamic CACHE register (DCR). Each LG group is made of multiple blocks. Each block is made of a plurality of NAND strings substantially the same as the one described in either FIG. 1B, or FIG. 1C, and or FIG. 1D. Note, unlike the previous example shown in FIG. 3A, no CSL is associated with each block in the NAND array 15B in this example. Each LG group still includes a LBLps precharge power line connected to each LG-based DCR. The NAND chip 100B also includes data I/O buffer 90B, Y-pass gate circuit 33B, and Row-decoders 50B, State-machine 70B, ISO row circuit 11B, a plurality of group-decoders including BHG-DEC 51B, BLG-DEC 52B, MG-DEC 53B with self-timed delay control, and a LBLps-DEC 54B for precharging LG-based DCR. The Row-decoder 50B is configured to provide a set 18B of control signals including all regular and dummy WL voltages for all 128 (or other number) pages of NAND cells and a first/second page of dummy cells on top/bottom of each block plus a middle page of dummy cells, and including other string-select control voltages for other string-select devices (not shown). The NAND chip 100B further includes command interface 80 and HV, MHV, and LV voltage generator circuit 60B. The State-machine 70B is configured to receive external control signals from the command interface 80B and external data from the data I/O buffer 90B to generate operation instruction to High, Medium, and Analog voltage generator 60B and address register 25B and to control ISO row circuit 11B, SA & PRB 30B and SCR 32B.

The NAND array 10B substantially the same as the NAND array 10A of FIG. 3A except that a third row of dummy cells is inserted in the middle of each block to separate a top half block with 64 WLs and a first row of dummy cells from a bottom half block with another 64 WLs and a second row of dummy cells. The dummy cells can programmed to SLC states in complementary fashion for providing an Odd/Even string selection function. The SLC read can be done on Odd/Even-LBL scheme only but SLC program can still be performed in ABL fashion, substantially the same as for the NAND array 10A in FIG. 3A.

Figure 4A:
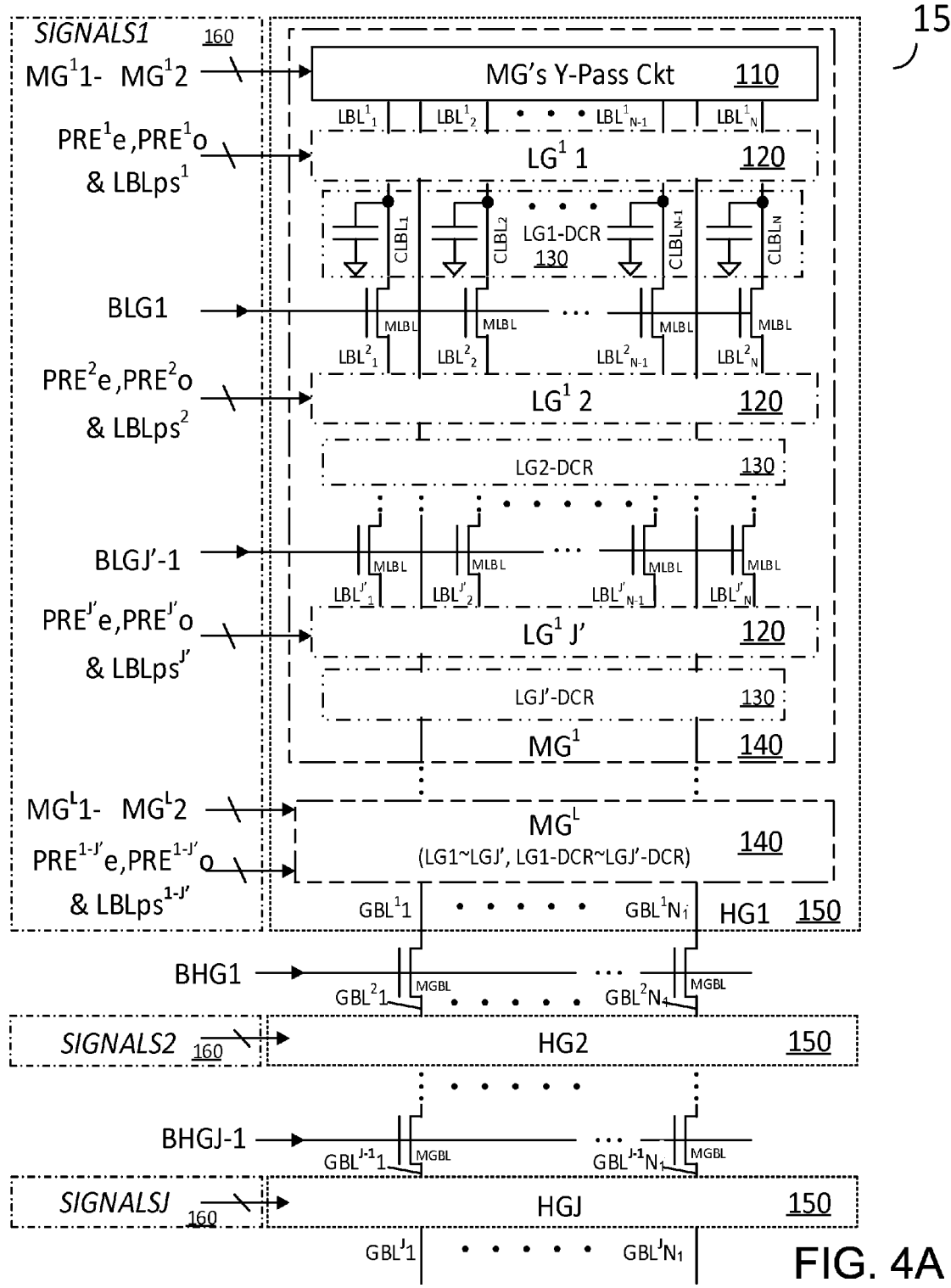
FIG. 4A is a diagram showing the hierarchical-BL NAND array divided into multiple hierarchical NAND HG, MG, and LG groups according to an embodiment of the present invention.

FIG. 4A is a diagram showing the hierarchical-BL NAND array divided into multiple hierarchical NAND cell groups according to an embodiment of the present invention. This diagram is merely an example, which should not unduly limit the scope of the claims. One of ordinary skill in the art would recognize many variations, alternatives, and modifications. As shown, the preferred NAND plane 10A of this NAND array 15 is divided into 3 hierarchical groups along the column direction of the array in association with 2-level topological metal lines selectively broken in accordance with corresponding groups. Firstly, each top-level m2 metal line laid along (but not directly connected to) a column of the NAND cells serves as a global bit line through the whole memory plane and is divided into J broken GBLs respectively associated with J numbers of NAND cell HG groups 150 formed in a same P-well within a DNW. Each HG group has total $N_1$ broken GBLs connected via ISO circuit 11 to page buffer 30. Between any 2 adjacent HG groups, there is a HG-divider device MGBL gated by a BHG signal. There are total J−1 MGBL devices per each GBL column respectively gated by J−1 different BHG signals such as BHG1 to BHGJ−1 to separate HG1 group, HG2 group, through HGJ group from top to bottom. In an example, J=8.

In a specific embodiment, the length of a broken GBL associated with each HG can be made equal or unequal, depending on the design applications. For example, as the HGJ group is made physically the nearest HG to the PB, the broken GBL associated with HGJ group can be the shortest one, thus the smallest $C_{HG}$, because the sensed voltage of SLC read data has the least dilution due to that a charge-sharing may involve only one HG group. On the contrary, HG1 group is preferably made the longest, thus the largest $C_{HG}$, one due to largest dilution during charge-sharing for read operation.

Referring to FIG. 4A, each HG group 150 is further divided into L middle-level MG groups 140. One layout option of each Odd/Even column of N columns of NAND cells in a MG group 140 is associated with a lower level Odd-m0/Even-m1 metal line or vice versa as its local bit line (LBL), as in a full-shielding configuration described in FIG. 2. Based on such 2 metal level interleaving LBL layout scheme, LBL-LBL AC coupling effect during program or read operation under the NAND memory 15 of FIG. 4A is completely eliminated. Alternatively, a layout with single-level m0 LBLs can still be used for implementing the self-timed SLC pipeline/concurrent program operation without verification.

In another specific embodiment, the N LBLs in one MG group 140 are not connected to N LBLs in next MG group but connected to $N_1$ GBLs through a MG Y-pass circuit 110 which functions as a multiplexer to combine every $M_1 (M_1=N/N_1)$ number of lower level LBLs into one top level GBL. All $N_1$ GBLs are connected, via the ISO circuit 11, to corresponding $N_1$-bit SA & PRE of PB 30, whose size is reduced by a factor of $M_1$ comparing to conventional PB. In an example, $M_1=2$, thus one GBL in a HG group is shared by 2 LBLs in each of the L MG groups 140 in the HG group 150. Every HG group 150 is controlled by a Signals bias control unit 160 to provide all the common gate control signals including at least MG1 and MG2 for respectively coupling Odd- and Even-numbered LBLs to one corresponding GBLs, PREo, PREe, and LBLps for controlling precharging or discharging of Odd- and Even-numbered LBLs, and BLG1 through BLGJ'−1 for controlling separation and connection between neighboring MG groups.

Each LBL per MG group is then further divided, by J'−1 LG-divider devices MLBL gated respectively by J'−1 signals such as BLG1 to BLGJ'−1, into J' broken-LBLs respectively associated with J' LG groups 120. All N columns of NAND cells in a LG group 120 are respectively connected by N broken-LBLs such as $LBL^{J'}1$ through $LBL^{J'}N$ metal lines. These N broken-LBLs serve as one page of LG-based N-bit (8 KB) small DCR, e.g., LG1-DCR, formed by N individual broken-LBL metal line capacitors of $C_{LBL1}$ through $C_{LBLN}$ for ABL N-bit SLC program. When all LG-divider devices MLBL are turned on by applying proper bias voltages to BLG1 to BLGJ'−1, all the broken-LBLs of all LG groups 120 are connected so that J' pages of the smaller LG-based N-bit DCRs denoted as $C_{LG}$s are combined to form one page of larger MG-based N-bit DCR denoted as $C_{MG}$ for ABL-like read operation. In an embodiment, a plurality of the smaller LG-based DCRs are used to latch a plurality of N-bit SLC program data to allow ABL SLC pipeline and concurrent SLC program operation. In another embodiment, a plurality of the larger MG-based DCRs are used to latch a plurality of N-bit SLC read data to allow ABL-like SLC pipeline and concurrent SLC read operation.

Furthermore, each Odd/Even-numbered broken LBL per LG group 120 is connected to a precharge power line LBLps via a precharge device gated by a control signal PREo/PREe. The precharge power line LBLps is a metal line laid at bottom level perpendicular to all N broken LBLs and connected to a Vinh supply (≥7V) so that all N broken LBLs, or N/2 Odd numbered broken LBLs, or N/2 Even numbered broken LBLs can be selected to be charged concurrently to a voltage up to Vinh as a charge stored in corresponding N-bit or N/2 bit DCR.

Figure 4B:
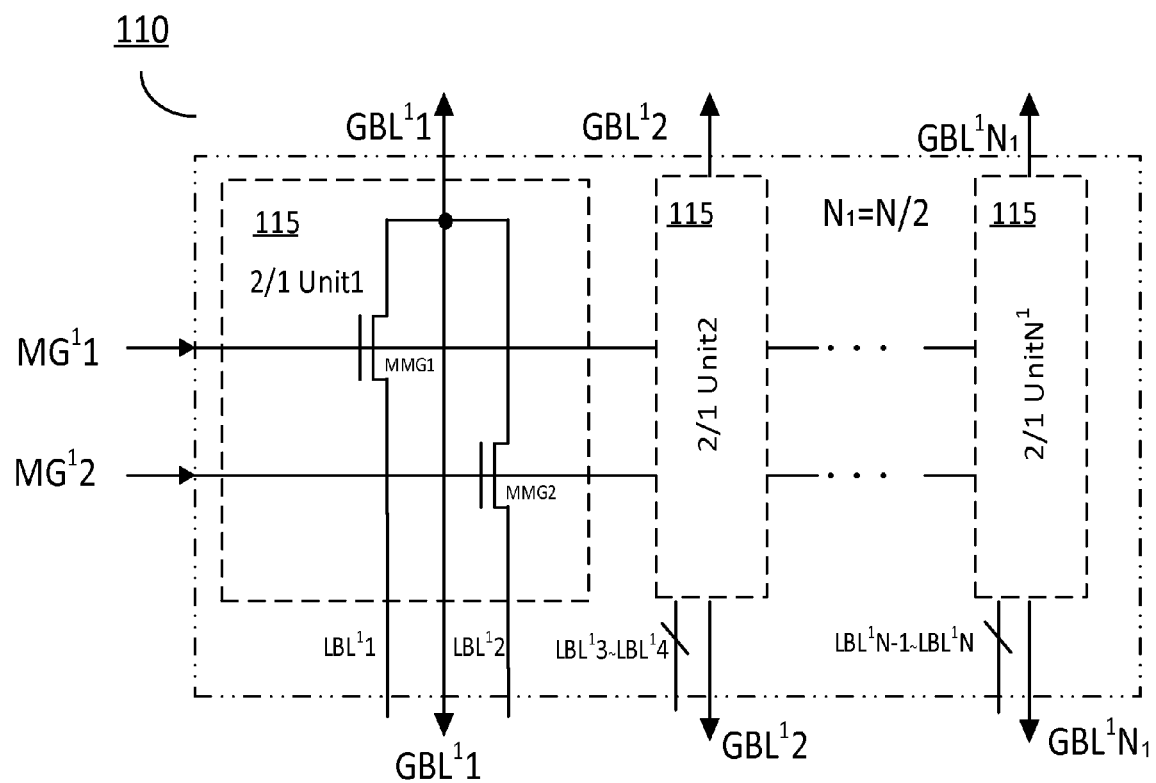
FIG. 4B is a diagram of a preferred MG Y-pass circuit in the hierarchical-BL NAND array according to an embodiment of the present invention.

FIG. 4B is a diagram of a preferred MG Y-pass circuit in the hierarchical-BL NAND array according to an embodiment of the present invention. This diagram is merely an example, which should not unduly limit the scope of the claims. One of ordinary skill in the art would recognize many variations, alternatives, and modifications. As shown, a preferred MG Y-pass circuit 110 per one MG group 140, as seen in FIG. 4A, includes $N_1$ units of $M_1$-to-1 multiplexer circuit 115. Each $M_1$-to-1 multiplexer circuit 115 includes $M_1$ NMOS Y-select transistors. In an example, $M_1=2$ as seen in FIG. 4B, the two rows of NMOS Y-select transistors comprising $N_1/2$ MMG1s and $N_1/2$ MMG2s respectively gated by $MG^11$ and $MG^12$. In an embodiment, the MG Y-pass circuit 110 is used to connect or isolate the bottom local 8 KB $N_1$ m0/m1 LBL lines from top 4 KB global m2 GBL lines such as $GBL^11$ to $GBL^1N_1$ In other words, each GBL line is shared by $M_1$ LBL lines with a $M_1\times2\lambda$ loose layout pitch, thus lower manufacturing cost. While the number of GBL is made equivalent to the bit-size of PB. Therefore, the size of PB is reduced by $M_1$-fold, where $M_1$ is defined by the equation of $M_1=N/N_1$. In the example of FIG. 4B, $M_1=2$. The device characteristics of MMG1 and MMG2 are preferably made identical to NAND string-select transistors with BVDS≥Vinh determined by the device breakdown voltage.

Figure 4C:
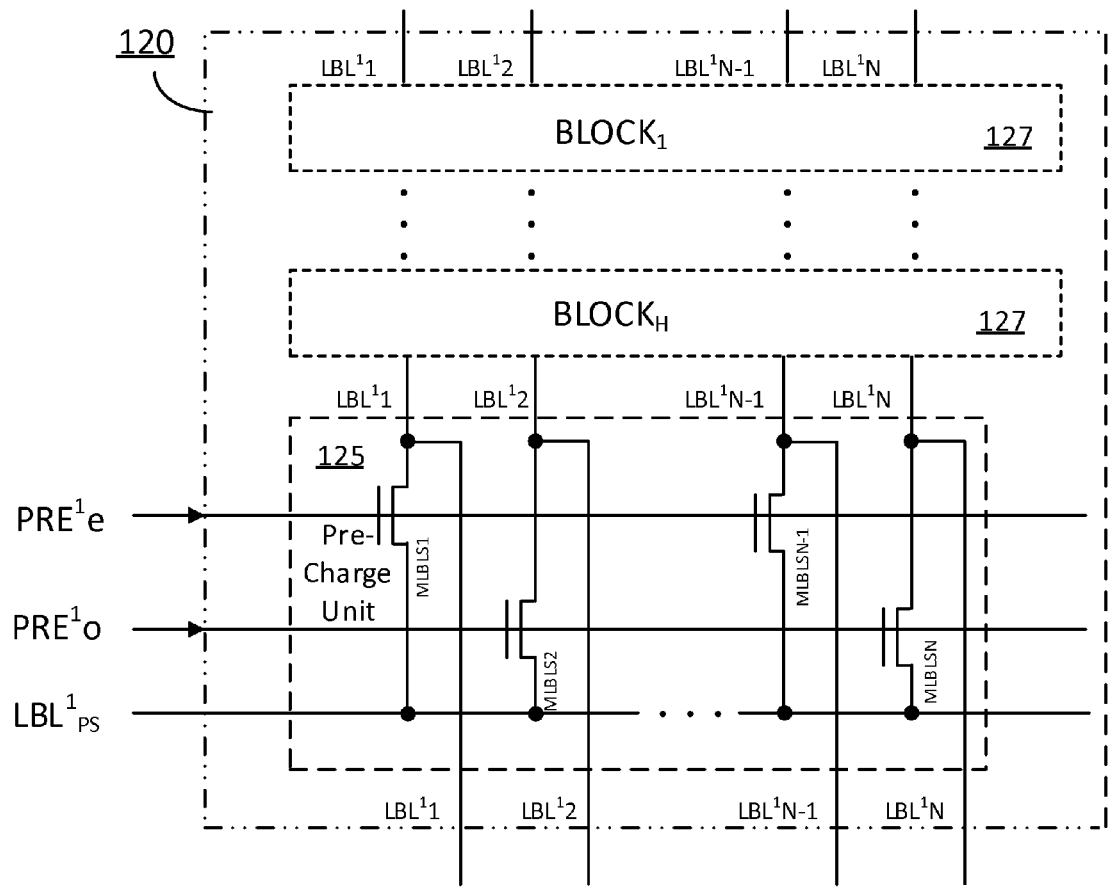
FIG. 4C is a diagram of a preferred LG circuit in the hierarchical-BL NAND array according to an embodiment of the present invention.

FIG. 4C is a diagram of a preferred LG circuit in the hierarchical-BL NAND array according to an embodiment of the present invention. This diagram is merely an example, which should not unduly limit the scope of the claims. One of ordinary skill in the art would recognize many variations, alternatives, and modifications. As shown, a preferred LG circuit 120, as seen in FIG. 4A, further includes H NAND blocks such as $Block_1$ to $Block_H$ connected by N common lower-level m0/m1 broken LBLs such as $LBL^11$ to $LBL^1N$ and one shared LBL-precharger 125 at the bottom per one LG circuit of 120. Each LBL-precharger 125 includes N/2 Odd-numbered precharger devices MLBLS1, MLBLS3, or in general MLBLSo gated by a common PREo signal and N/2 Even-numbered precharger devices MLBLS2, MLBLS4, or in general MLBLSe gated by a common PREe signal, both the source nodes of Odd and N/2 Even-numbered precharger devices are connected to a common precharge power or discharge line $LBL^1$ps which locally supplies the desired Vinh for program-inhibit and LBL precharge voltages for performing pipeline and concurrent ABL SLC program, ABL-like SLC read, and erase-verify operations. In an embodiment, the common precharge power or discharge line $LBL^1$ps is provided as a metal line also laid at either m0 or m1 level to get around m0 and m1 LBL connection between LG groups by the regular layout technique to avoid increasing the metal layer number in NAND array for cost reduction and line resistance.

The function of this LG circuit 120 is to form NAND LG-based and MG-based DCRs that allow an independent precharging and discharging with the lowest current for the preferred ABL SLC pipeline and concurrent program and ABL-like SLC pipeline and concurrent read operation.

Figure 4D:
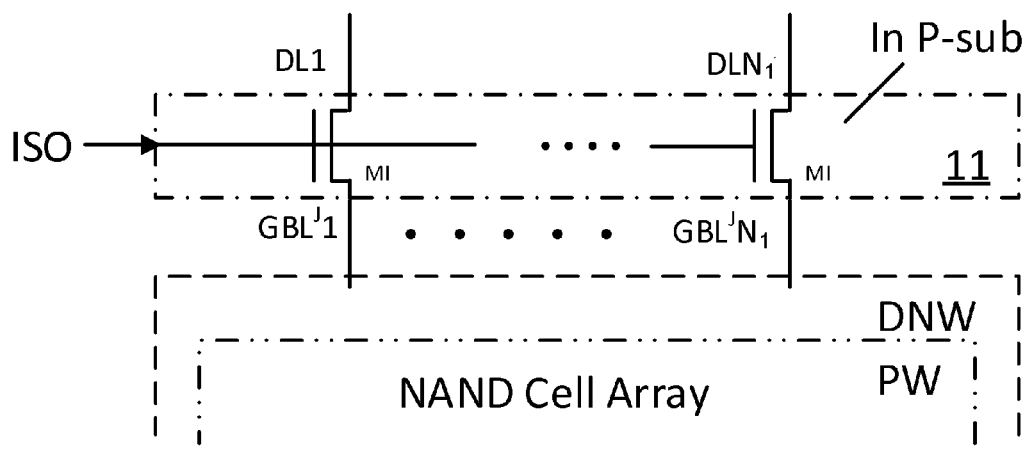
FIG. 4D is a diagram of a preferred HV ISO circuit in the hierarchical-BL NAND array according to an embodiment of the present invention.

FIG. 4D is a diagram of a preferred ISO circuit in the hierarchical-BL NAND array according to an embodiment of the present invention. This diagram is merely an example, which should not unduly limit the scope of the claims. One of ordinary skill in the art would recognize many variations, alternatives, and modifications. As shown, the ISO circuit 11 includes one row of $N_1$ 20V NMOS 1-poly devices MI, gated by a common ISO signal, connected between $N_1$ GBLs, $GBL^{J'}1$ to $GBL^{J'}N_1$ and N1 respective data lines DL1 to $DLN_1$. Each MI device is a buffer to isolate 20V HV erase voltage appeared on all nodes of $GBL^{J'}1$ to $GBL^{J'}N_1$ in NAND array from damaging corresponding LV PB located in the peripheral circuit connected to $N_1$ data lines DL1 to $DLN_1$. The isolation is achieved by coupling the common signal of ISO to ground during erase operation but to a voltage ≥Vdd during other operations such as SLC program and read during SLC page data loading from the PB into a selected page of LG-based DCRs or MG-based DCRs in the NAND array. The ISO circuit 11 is laid outside the NAND array area without being formed within a same Triple P-Well (TPW) and deep N-well (DNW) as the regular NAND cells. Note, due to the reduction of the number of GBLs from N to $N_1$ by $M_1$-factor by the MG Y-pass circuit 110, thus the size of ISO circuit 11 is also reduced by $M_1$-factor. As a result, the NAND die size is reduced for a lower cost.

FIG. 5A shows a preferred SLC program sequence for an ABL random-1WL pipeline SLC program operation without verify step according to an embodiment of the present invention. This diagram is merely an example, which should not unduly limit the scope of the claims. One of ordinary skill in the art would recognize many variations, alternatives, and modifications. As shown, a series of ABL SLC programs on randomly selected WLs without verification are performed in a self-timed pipeline manner with each starting time of a program operation being associated with only one WL. Assuming that there are total m separate and random WLs dispersed in m blocks of m LG groups being sequentially selected by m cycles for this preferred ABL pipeline SLC program, in each selected block, only one WL in one of H blocks in each selected LG group can be selected for this ABL pipeline SLC program. The location of each selected one WL can be any one in a 128-WL block. For programming each selected WL, one set of gate control voltages, including one Vpgm for the selected WL and Vpass for 127 unselected WLs and Vdd for SSL top string-select devices and 0V for GSL bottom string-select devices, has to be locked in 1-cycle from a common XT high-voltage signal bus into the corresponding parasitic poly wordlines and gate lines for string-select devices of any selected block (e.g., Block1 shown in FIG. 1A). The details of performing the preferred sequential ABL SLC random-1WL pipeline program are illustrated using the example shown in FIG. 5A with references to FIG. 9, FIG. 10, FIG. 11, FIG. 13, FIG. 14, FIG. 15 and FIG. 16 shown in later sections of the specification.

Referring to the example of FIG. 5A, in t1, one WL with address WL2 in Block1 of selected LG1 within MG1 and HG1 is selected to start for performing ABL N-bit SLC program by latching N-bit SLC data from the PB inside the LG1-DCR. At the same time, one set of Vpgm, Vpass, Vdd, and Vss voltages are also respectively latched into one set of WLs, SSL, and GSL poly lines of the selected block by each corresponding block-decoder. Once the operation starts, the program time Tpgm1 of about 50 μs-100 μs for the first program in the pipeline is controlled by a first self-timed Time Control circuit (see FIG. 9). This program ends without any program-verify step.

In t2, the selected WL is WL63 in Block4 of selected LG2 within same MG1 but different HG5. In this case, only one WL63 in the LG2 is selected to start for ABL N-bit SLC program without verify. The program time Tpgm2 for the second program in the pipeline is controlled by a second self-timed Time Control circuit (see FIG. 9). The Tpgm1 and Tpgm2 may have overlapping or non-overlapping period, depending on the time delay between two SLC page loadings from PB or I/O.

In t3, the selected WL is WL22 in Block2 of selected LG4 within same MG3 but different HG3 to start a third program without program-verify in the pipeline. Similarly, Tpgm1, Tpgm2, and Tpgm3 may have overlapping or non-overlapping period, depending on the time delay between any two SLC page loadings from PB or I/O.

Again, in tm, the selected WL is WL128 in Block3 of selected LG8 within MG4 but different HG2 to start the mth program without verify. Similarly, the corresponding program time Tpgmm may have overlapping or non-overlapping period with other program time Tpgmm−1, Tpgmm−2, etc, depending on the time delay between any two SLC page loadings from PB or I/O.

Since each one of m WLs starts its ABL SLC pipeline program at different times and controlled by its self-timed Time Control circuit, thus the m ABL SLC programs may end, without program-verify, at m different times during the normal Vdd operation. As explained above, some overlappings of the program time Tpgm will happen between several sequential WL SLC programs in the pipeline. As a result, a tremendous, even more than 10-fold, reduction in overall SLC program time can be achieved comparing to conventional SLC program schemes.

Only one WL's N-bit cells in one LG are selected at a time in a pipeline manner. The only one WL (e.g., out of 128 WLs) is randomly selected from one block in a LG group randomly selected from a MG group of a randomly selected HG of the NAND array. In the embodiment, at t1 a page with a WL address of WL2 is selected from Block 1 of LG1 of MG1 of HG1. Once it is selected and to-be programmed page data is loaded via the GBLs and LBLs, the row-decoder will latch a set of HV supplies with Vpgm applied to corresponding selected WL as well as other proper HV signals to all unselected WLs and string-select devices for the selected block so that the whole page of the selected WL will be programmed with 8 KB data, which is self-timed starting from t1. While without waiting for completion of the WL2 page program, at t2 another page with a WL address of WL63 in Block 4 of LG2 of MG1 of HG5 may be selected to perform ABL programming of another 8 KB data, which is self-timed starting from t2. Further, additional page can be selected in similar random-1WL fashion to start individual WL program in pipeline manner that allows at least partial overlapping time spans for respective one or more page programming sequences. This ABL random-1WL pipeline SLC program can be based on a NAND array as shown in FIG. 1A, or FIG. 1B, or FIG. 1C, or FIG. 1D or more configured with all peripheral circuits including Row-decoders, group-decoders, SA and PRB, I/Os, Multiplier, etc. shown in FIG. 3A, or FIGS. 3B, and 4A-4D, regardless the 2D or 3D type of NAND array and 2-level or 1-level LG-based broken LBLs as basic units of parasitic capacitors for temporary data setting during the SLC program for each page.

In an embodiment, the random-1WL pipeline program means that the SLC program is performed on one WL with a random address selected in one random block of a LG group of a MG group of a HG group of the hierarchical-BL NAND array self-timed one after another in pipeline. Each WL program starts at different times and finishes at different times without any program-verify operation while having partially overlapping time spans between any two subsequent WL programming operations.

FIG. 5B shows a preferred SLC program sequence for an ABL SLC random-multi-WL pipeline/concurrent program operation without verify step according to another embodiment of the present invention. This diagram is merely an example, which should not unduly limit the scope of the claims. One of ordinary skill in the art would recognize many variations, alternatives, and modifications. As shown, a series of ABL SLC programs on multiple selected WLs without verification are performed in a self-timed pipeline manner with each starting time being associated with a separate program operation performed on one or more WLs concurrently. The guidelines of this preferred multi-WLs ABL pipeline and concurrent SLC program operation are summarized below, wherein the number of WLs can be any number up to J'×L, which is the total number of blocks in a LG group distributed in J HGs of the hierarchical-BL NAND array of the present invention. Practically for achieving best overall operation time saving with balance of data loading time and program time for entire SLC program operations in a whole pipeline, the number of WLs to be selected to start an individual ABL SLC program at the same time is preferred to be ≤3.

Assuming that there are more than m separate and random WLs dispersed in m blocks of m LGs being sequentially selected by less than m cycles for this preferred ABL pipeline SLC program, only one WL's N-bit cells in one LG are selected at a time in a pipeline manner. In each selected block, only one WL in one of H blocks in each selected LG group. In the example, up to 3 WLs in 3 LGs with a limitation that the location of each WL has to be the same can be selected for concurrently starting one ABL SLC program in the pipeline. Accordingly, 1 up to 3 sets of HV supplies, including one Vpgm for a selected WL, Vpass for 127 unselected WLs, Vdd for SSL, and 0V for GSL, are locked in 1-cycle from the common XT high-voltage signal bus into the corresponding parasitic poly WLs and string-select gate lines of any selected block. The operation of the sequential ABL random Multi-WL pipeline and concurrent SLC program is briefed by the example of FIG. 5B with references to FIG. 9, FIG. 10, FIG. 11, FIG. 13, FIG. 14, FIG. 15 and FIG. 16 to be shown below.

Referring to FIG. 5B, in t1, 2 WLs with a same address of WL5 are selected for ABL SLC program. The first WL of the two selected WLs is WL5 in Block1 of selected LG1 within MG1 of HG1. The second WL is WL5 in Block4 of selected LG2 within same MG1 but different HG5. The two WLs with address of WL5 are selected to start concurrently for ABL N-bit SLC program by sequential latching 2 sets of N-bit SLC data into 2 LG-based DCRs, i.e., LG1-DCR and LG2-DCR, respectively by the PB. But only one set of HV supplies including Vpgm, Vpass, Vdd, and Vss are respectively latched into two sets of WLs, SSL, and GSL poly lines of the corresponding two selected blocks by corresponding block-decoders due to the same WL5 location. Once the operation starts, the program time Tpgm1 of about 50 μs-100 μs is controlled by a self-timed Time Control circuit.

In t2, 3 WLs with a same address of WL32 are selected for ABL SLC program. The first WL of the 3 selected WLs is WL32 in Block2 of selected LG1 within MG1 and HG1. The second WL of the 3 selected WLs is WL32 in Block1 of selected LG4 within MG2 but different HG3. The third WL of the 3 selected WLs is WL32 but in Block3 of the same LG4 within MG3 but same HG3. The three WL32 of same location are selected to start concurrently for performing ABL N-bit SLC program by sequential latching 3 set of N-bit SLC data into 3 LG-based DCRs, i.e., LG1-DCR in MG1, LG4-DCR respectively in MG2 and MG3, by the PB. But only one set of HV supplies including Vpgm, Vpass, Vdd, and Vss are also respectively latched into two sets of WLs, SSL, and GSL poly lines of the correspond three selected blocks by corresponding block-decoders due to the same WL32 location. The program time Tpgm2 of about 50 μs-100 μs is controlled by a self-timed Time Control circuit.

In tm, 2 WLs of a same address of WL1 are selected for ABL SLC program. The first WL of the two selected WLs is WL1 in Block3 of selected LG5 within MG3 and HG3 and the second WL of the two selected WLs is same WL1 in Block4 of selected LG8 within different MG4 and HG2. In this case, two WLs with the same address WL1 are selected to start concurrently for performing ABL N-bit SLC program by sequential latching 2 sets of N-bit SLC data into LG1-DCR and LG2-DCR respectively by PB. But only one set of HV supplies including Vpgm, Vpass, Vdd, and Vss are respectively latched into two sets of WLs, SSL, and GSL poly lines of the two selected blocks by corresponding block-decoders due to the same WL1 location. The corresponding program time Tpgmm of about 50 μs-100 μs is controlled by a self-timed Time Control circuit.

Although the ABL SLC pipeline program on multi-WLs starts the operation at the same time but has separate time lines for each WL programming controlled by its self-timed Time Control circuit, thus this multi-WLs ABL SLC program will have more WLs' cells end at m different time lines during the normal low-voltage Vdd operation. As a result, more reduction of ABL SLC program time can be achieved from the multi-WLs pipeline/concurrent operation over the previous one shown in FIG. 5A. Again, the multi-WLs program operations started at t1 are allowed to be overlapped in time at least partially with the multi-WLs program operations started at t2 next in the pipeline.

Figure 5C:
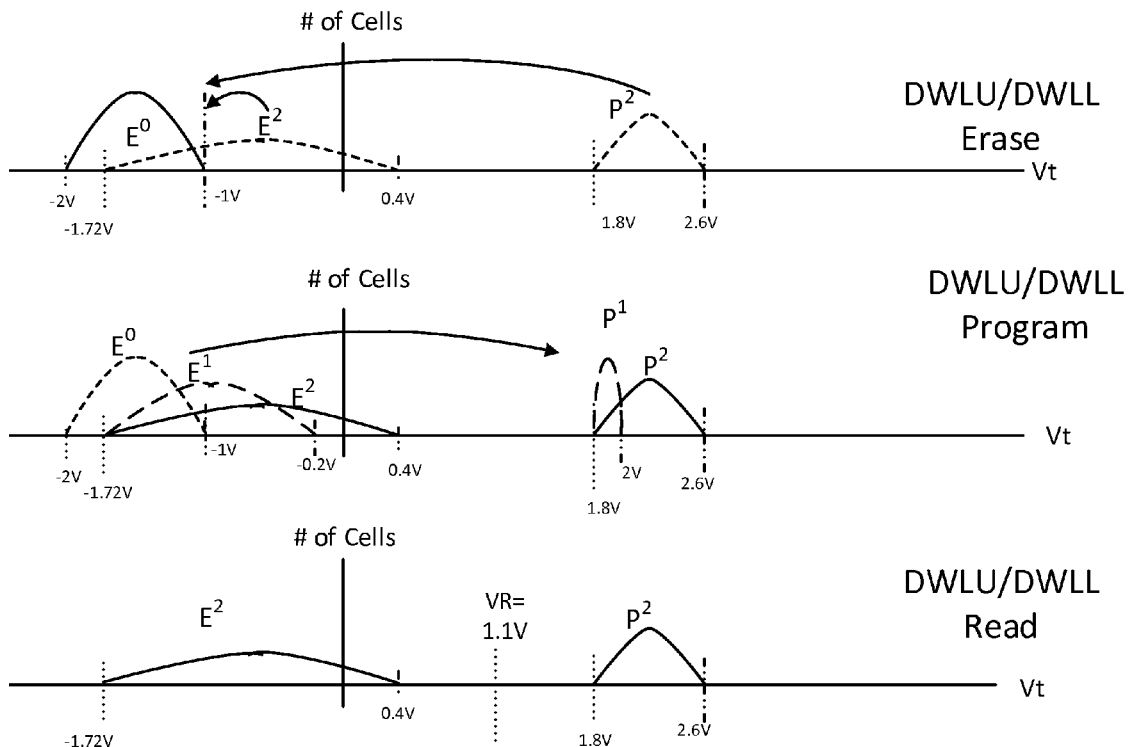
FIG. 5C is a diagram showing a narrow SLC program Vt but a wide erase Vt in distributions, populations and gap of a SLC-like program with a verification and read operations performed on dummy cells in the NAND array built by strings of FIG. 1B, or FIG. 1C or FIG. 1D according to an embodiment of the present invention.

FIG. 5C is a diagram showing SLC Vt distributions, populations, gap, and widened voltages of erase, SLC-like program and read operations with verification performed on dummy cells in the NAND array built by strings of FIG. 1B, or FIG. 1C, or FIG. 1D according to an embodiment of the present invention. This diagram is merely an example, which should not unduly limit the scope of the claims. One of ordinary skill in the art would recognize many variations, alternatives, and modifications. As shown, in a first graph the erase operation on the dummy cells shifts both SLC's widened positive $P^2$ program-state with $Vtp^2$ distribution between $Vtp^2$ min=1.8V and $Vtp^2$max=2.6V and the widened $E^2$ erase-state with $Vte^2$ distribution between $Vte^2$ min=−1.72V and $Vte^2$max=0.4V to a final $E^0$-state in a solid graph with $Vte^0$distribution between $Vte^0$min=−2V and $Vte^0$max=−1V with a desired erase-verify voltage of $Vte^1$max≤−1.0V.

Referring to FIG. 5C again, in the second graph, it shows a SLC program operation is performed on dummy cells with verify. This program operation shifts part of $E^0$-state cells' Vt from one initial $E^0$ state in dotted graph to one narrow SLC program state of $P^1$ in dotted graph with $Vtp^1$min=1.8V and width of 0.2V. The remaining $E^0$-state cells' Vt distribution has been shifted and widened to $E^1$-state with $Vte^1$ distribution between $Vte^1$min=−1.72V and $Vte^1$max=−0.2V by each $P^1$ SLC program in same DWLU or DWLL due to Yupin coupling effect induced by two adjacent LBLs with a 10% contribution factor. The dummy cell program is performed on DWLU cells or DWLL cells following sequence at t period to cause the Vt shift from $E^0$-state to $P^1$-state. The $E^0$-state is shifted and widened to $E^1$-state due to coupling effect. $Vte^1$min=−2V is shifted to $Vte^1$min=−1.72V by 0.28V due to DWLU/DWLL ($Vtp^1$min-Vtemax) 10%=(1.8+1.0)10%=0.28V. Similarly, $Vte^0$max=−1V is shifted to $Vte^1$max=−0.2V by $Vte^0$max+(2+2)10%×2=−0.2V.

Further in the third graph, it shows the final cells' Vt distribution (estimated) of $E^2$ and $P^2$ states on DWLU or DWLL when the adjacent WL cells are SLC programmed of this preferred SLC read of dummy cells. The $E^1$-state is finally widened to an $E^2$-state with $Vte^2$ min=−1.72V and $Vte^2$max=+0.4V with a $\Delta Vte^2$ of 2.12V. The positive $P^1$-state is widened to a $P^2$-state with $Vtp^2$ min=1.8V and $Vtp^2$max=2.6V with a final $\Delta Vp^2$ of 0.8V with a wide Vt-gap of 1.4V. Therefore, a read check voltage VR is preferably set to be a middle value at 1.1V between the $Vte^2$max=0.4V and $Vtp^2$ min=1.8V. As a result, it shows the dummy cell's SLC program with program-verify can achieve highly reliable distinguishing the program $P^2$-state from an erase $E^2$-state of the dummy cell by setting $Vtp^2$ min=1.8V.

Figure 5D:
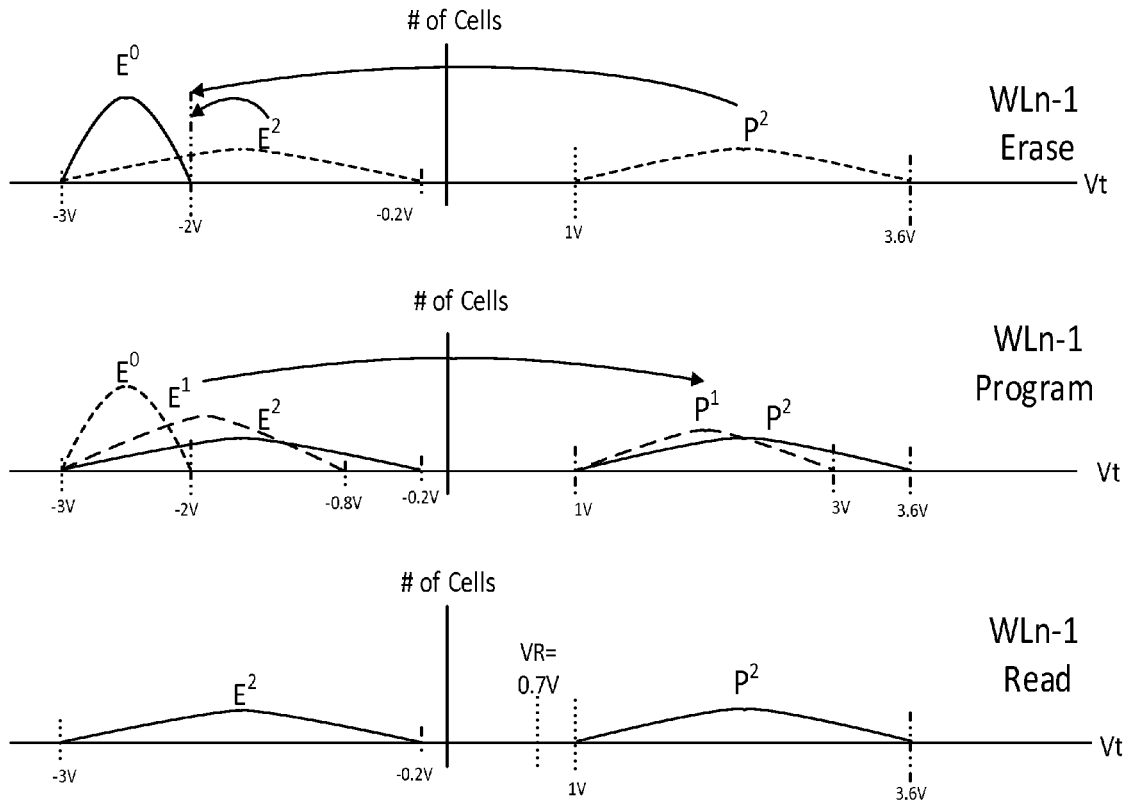
FIG. 5D is a diagram showing a widened SLC program Vt and a widened erase Vt in distributions, populations, and gap of a SLC-like program without a verification and read operations performed on selected first WL of regular cells in the NAND array built by strings of FIG. 1A, or FIG. 1B, or FIG. 1C or FIG. 1D according to another embodiment of the present invention.

FIG. 5D is a diagram showing SLC Vt distributions, populations, gap, and widened voltages of erase, SLC-like program and read operations without verification performed on selected first WL of regular cells in the NAND array built by strings of FIG. 1A, or FIG. 1B, or FIG. 1C or FIG. 1D according to another embodiment of the present invention. This diagram is merely an example, which should not unduly limit the scope of the claims. One of ordinary skill in the art would recognize many variations, alternatives, and modifications. As shown, in a first graph, the erase operation is performed on a selected first WL, i.e. WLn−1, of regular cells to shift both Vts from a single positive widened program-state of $P^2$ and one negative widened $E^2$-state in dotted line to one more negative but less-widened erase $E^0$-state in a solid line with a desired erase-verify voltage of $Vte^0max \leq -2.0V$, which is 1V lower than that of the dummy cell $E^0$-state shown in FIG. 5C. The reason to set a more negative $Vte^0max$ for a regular cell is to keep a bigger Vt gap between Vte and Vtp because there is a large 20% shift by two adjacent LBL-LBL coupling effects and another 10% shift by one adjacent WL-WL coupling effect. By contrast, in a dummy WL cell, the Vt gap can be made smaller because there is only 10% shift by one adjacent LBL-LBL coupling effects. Less negative Vte-state cells can shorten the erase time for the dummy cells.

In an embodiment, a second graph of FIG. 5D shows a preferred SLC program operation starts from the selected boundary WLn−1 without verify to shift parts of initial $E^0$-state cells' Vts ($Vte^0max=-2V$, $Vte^0min=-3V$) to a widened $P^1$ program-state with $Vtp^1min=1V$ and $Vtp^1max=3V$ at t0 without verify. As a result, the remaining cells of $E^0$-state in WLn−1 will be shifted and widened to $E^1$-state with $Vte^1max=(-2)+(3+3)10\%\times2=-1.4V$. 10% is an estimated factor corresponding to Yupin coupling effect of an adjacent WL cell on Vt shift/widening of the selected first WL cell. Further, the $E^1$-state of the WLn−1 cell is shifted to $E^2$-state with $Vte^2max=(-0.8)+(3+3)10\%=-0.2V$ by an one-pulse SLC program at t1 by Yupin coupling effect induced by performing a SLC program without verify on adjacent WLn cells. As a result, a Vt-gap of 1.2V is still reliably kept for the regular SLC cells formed in WLn−1.

In another embodiment, a third graph shows a preferred Vt distribution (estimated) of SLC read for WLn−1 cells. The final Vt distributions $\Delta Vte$ of $E^2$-state is $2.8V=-0.2V-(-3V)$ and $\Delta Vtp$ of SLC program $P^2$-state is $2.6V=3.6V-1V$. Thus a VR voltage is optimally defined in the middle of $Vtp^2min=1V$ and $Vte^2max=-0.2V$ as 0.7V for reliable SLC pipeline read. In summary, it shows that a SLC program on non-boundary WLn−1 cells without a program-verify can still maintain a big Vt-gap=1.4V. Thus, a highly reliable SLC read in WLn−1 can be achieved even when one adjacent WLn cells are performed a SLC program without verify.

Figure 5E:
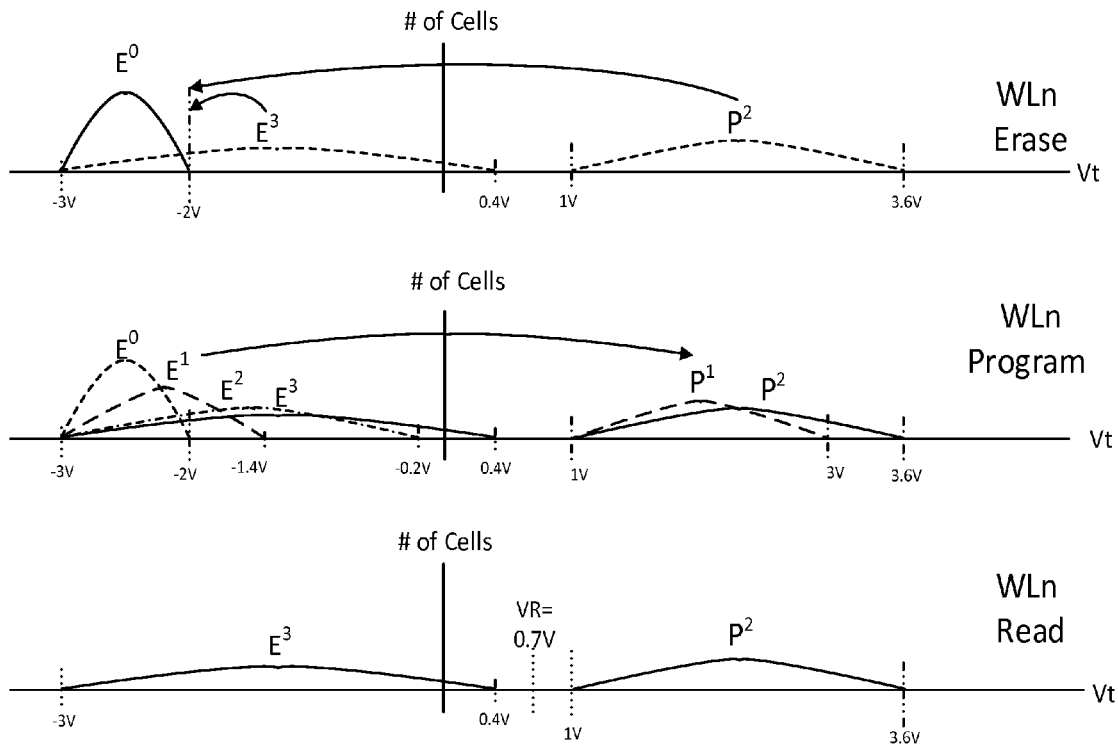
FIG. 5E is a diagram showing a widened SLC program Vt and a widened erase Vt in distributions, populations, and gap of a SLC-like program without verify and read operations performed on selected next WL of regular cells in the NAND array built by strings of FIG. 1A, or FIG. 1B, or FIG. 1C or FIG. 1D according to yet another embodiment of the present invention.

FIG. 5E is a diagram showing SLC Vt distributions, populations, gap, and widened voltages of erase, SLC program and read operations without verification performed on one non-boundary WLn of regular cells in the NAND array built by strings of FIG. 1A, or FIG. 1B, or FIG. 1C or FIG. 1D according to yet another embodiment of the present invention. The non-boundary WLn' cells have suffered double WL-WL coupling effect of boundary WLn−1's cell in ABL SLC program. This diagram is merely an example, which should not unduly limit the scope of the claims. One of ordinary skill in the art would recognize many variations, alternatives, and modifications. As shown, in a first graph, the erase operation on WLn regular cell both Vts from a single positive widened program-state of $P^2$ and one negative widened $E^3$-state in dotted line to one more negative but less-widened erase $E^0$-state in a solid line with a desired erase-verify voltage of $Vte^0max \leq -2.0V$, which is 1V lower than that of the dummy cell $E^0$-state shown in FIG. 5C. The similar reason to set a more negative $Vte^0max$ for a regular cell is to keep a bigger Vt gap between Vte and Vtp because there is a large 20% shift by two adjacent LBL-LBL coupling effects and another 20% shift by two adjacent WL-WL coupling effects.

In an embodiment, a second solid graph of FIG. 5E shows a preferred SLC program operation on the selected non-boundary WLn cells without verify to shift parts of initial $E^0$-state cells' Vts ($Vte^0max=-2V$, $Vte^0min=-3V$) to a widened $P^1$ program-state with $Vtp^1min=1V$ and $Vtp^1max=3V$ at t0 without verify. As a result, the remaining cells of $E^0$-state in WLn will be shifted and widened to $E^1$-state with $Vte^1max=(-2)+(3+3)10\%\times2=-1.4V$ at initial time t0. 20% is an estimated factor corresponding to Yupin coupling effect of two adjacent LBL cells on Vt shift/widening of the selected first WLn cell. Further, the $E^1$-state of the WLn cell is shifted to $E^2$-state with $Vte^3max=(-1.4)+(3+3)10\%=-0.2V$ by an one-pulse SLC program at next time t1 by Yupin coupling effect induced by performing a SLC program without verify on WLn cells. Furthermore, the $E^2$-state of the WLn cell is shifted to $E^3$-state with $Vte^3max=(-0.2)+(3+3)10\%=0.4V$ by an one-pulse SLC program at further later time t2 by Yupin coupling effect induced by performing a SLC program without verify on WLn+1 cells. As a result, a Vt-gap of 0.6V is still reliably kept for the regular SLC cells formed in non-boundary WLn.

In another embodiment, a third graph shows a preferred Vt distribution (estimated) of SLC read for WLn−1 cells. The final Vt distributions $\Delta Vte$ of $E^3$-state is $3.4V=0.4V-(-3V)$ and $\Delta Vtp$ of SLC program $P^2$-state is $2.6V=3.6V-1V$. Thus a VR voltage is optimally defined in the middle of $Vtp^2min=1V$ and $Vte^2max=0.4V$ as 0.7V for reliable SLC pipeline read.

In summary, it shows that a SLC program on non-boundary WLn cells without a program-verify can still maintain an acceptable Vt-gap=0.6V. Thus, a highly reliable SLC read in WLn can be achieved even when adjacent WLn−1 and WLn+2 cells are performed a SLC program without verify.

Figure 5F:
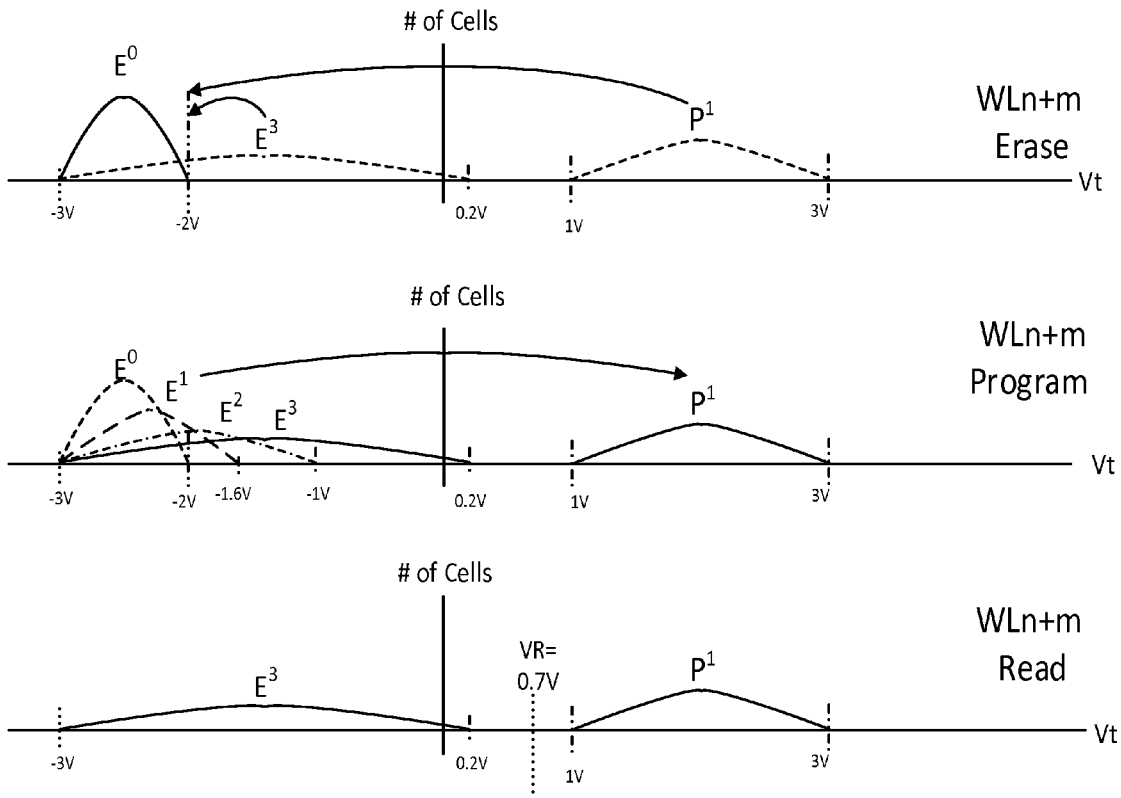
FIG. 5F is a diagram showing a widened SLC program Vt and a widened erase Vt in distributions, populations, and gap of a SLC-like program without verify and read operations performed on arbitrarily selected WLn+m of regular cells without any cell program on WLn+m+1 in the NAND array built by strings of FIG. 1B, or FIG. 1C or FIG. 1D according to still another embodiment of the present invention.

FIG. 5F is a diagram showing SLC Vt distributions, populations, gap, and widened voltages of erase, SLC program and read operations without verification performed on arbitrarily selected WLn+m of regular cells without any cells being programmed (i.e. erase-cells) on WLn+m+1 in the NAND array built by strings of FIG. 1B, or FIG. 1C or FIG. 1D according to still another embodiment of the present invention. This diagram is merely an example, which should not unduly limit the scope of the claims. One of ordinary skill in the art would recognize many variations, alternatives, and modifications. As shown, an arbitrarily selected WLn+m of regular cells, without any WL being programmed after the WLn+m, is subjected to the SLC program and read operations (after ensuring an initial erase $E^0$-state at $Vte^0max=-2V$ and $Vte^0min=-3V$). The sequences of the operations and corresponding Vt distribution shifting and widening are substantially similar to those described in FIG. 5E, without widening of $P^1$-state to $P^2$-state induced by Yupin coupling effect from performing ABL SLC program on WLn+m+1 cells. The resultant Vt distribution of $E^3$-state and $P^1$-state are slightly better with $Vte^3max \leq 0.2V$ and $Vtp^1max \leq 3V$ with a Vt-gap=1V. Thus the VR is still optimally set as 0.7V for a reliable SLC pipeline read.

Figure 5G:
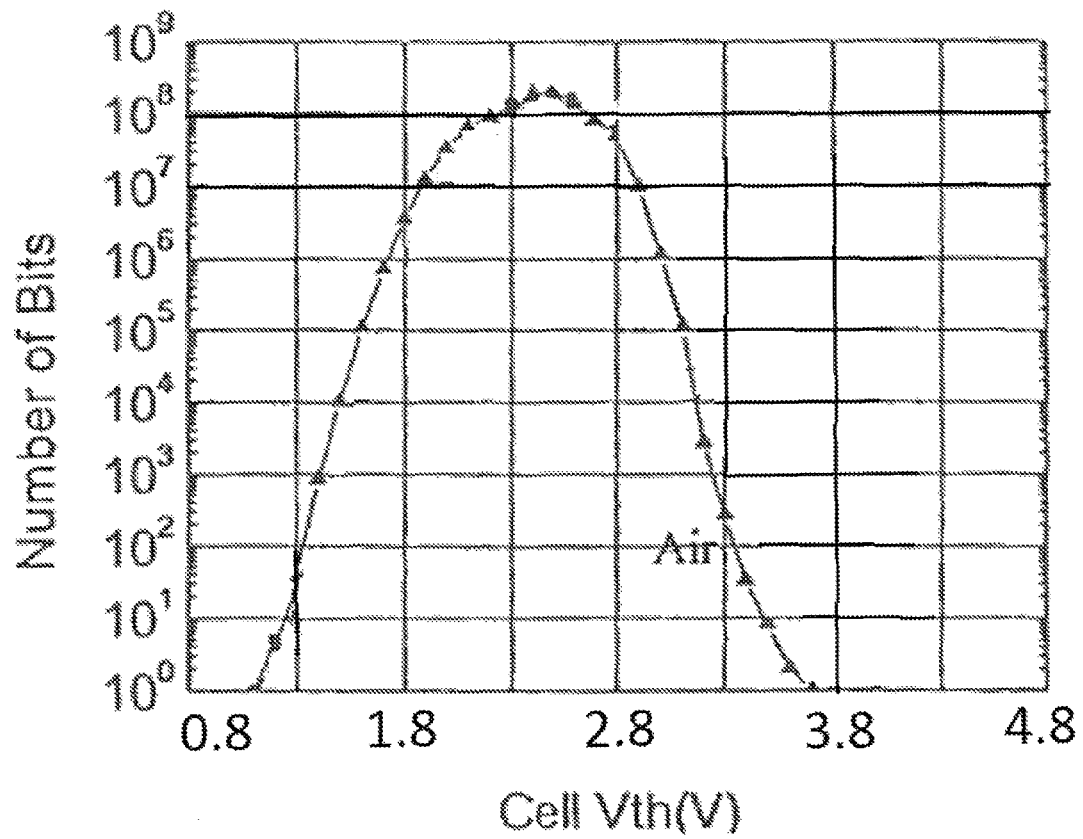
FIG. 5G is an exemplary plot of 1 Gb SLC program Vt distribution under SLC program conditions of one-pulse of Tpgm=100 μs and Vpgm=20V without program verify according to an embodiment of the present invention.

FIG. 5G is an exemplary plot of 1 Gb SLC program Vt distribution under SLC program conditions of one-pulse of Tpgm=100 μs and Vpgm=20V without program verify according to an embodiment of the present invention. This diagram is merely an example, which should not unduly limit the scope of the claims. One of ordinary skill in the art would recognize many variations, alternatives, and modifications. As shown, the resultant center Vtp value of this new 1 Gb of one-pulse SLC program is set to be around 2.3V with Vtpmin≥1.1V under one new set of bias conditions of Tpgm=100 μs and Vpgm=20V. This example will be used for demonstrating one-pulse SLC pipeline program of the present invention.

Referring to FIG. 5G, the Vt distribution of 1 Gb is predicted to be around 3V. Furthermore, if Vpgm above 20V is available on NAND chip, then using another set of conditions of Tpgm=50 μs and Vpgm=21V can further shorten the SLC pipeline program latency and narrow down Vtp-width for the present invention.

In summary, although this preferred pipeline and concurrent SLC program is performed in a page size of 8 KB, thus the Vtp-width should be much narrower than the case of FIG. 5G. But for the design simplicity, the optimal voltages of VR and Vread are assigned to cover the whole 1 Gb density if the subject NAND density is 1 Gb. The optimal Vread is made, Vread≥Vtpmax+2V, while the optimal VR is defined as VR=½(Vtpmin−Vtemax) to obtain the equal read margin between Vte and Vtp without counting the adjacent WL coupling effect.

Figure 6:
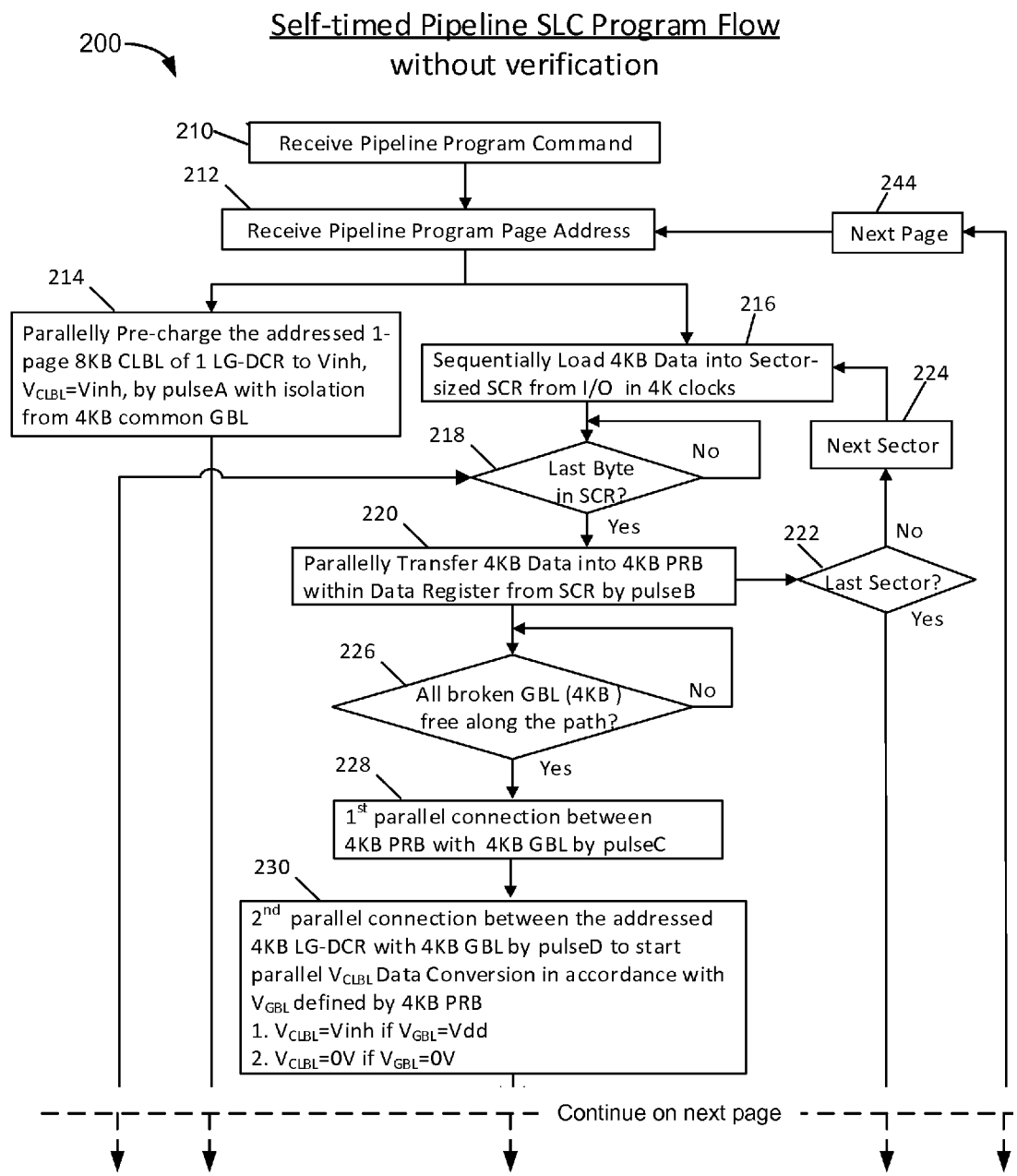
FIG. 6 is a flow chart showing a method of a batched-based M-WL pipeline SLC program operation without program-verify according to an embodiment of the present invention.
Figure 6:
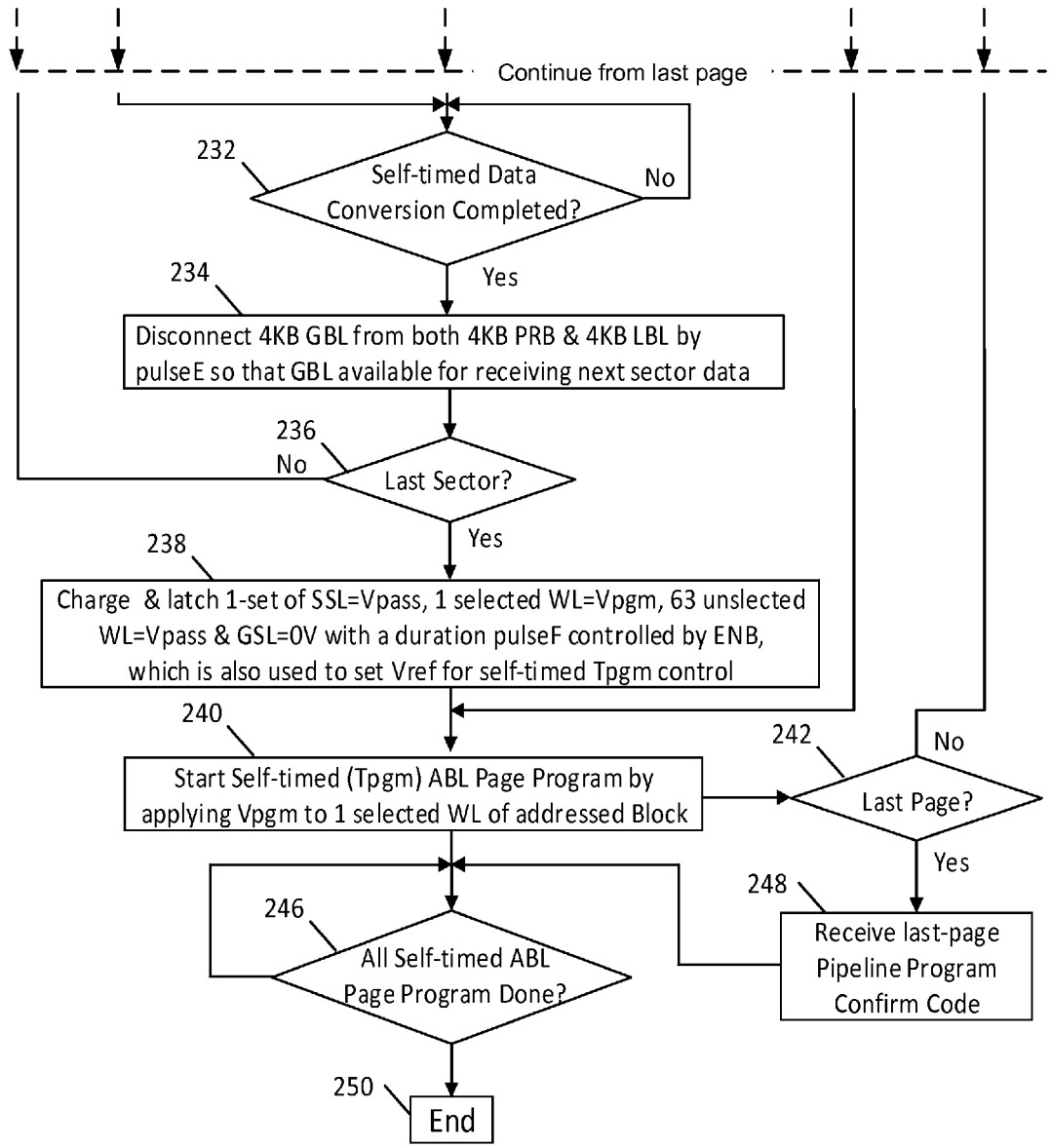

FIG. 6 is a flow chart showing a method of a batched-based M-WL pipeline SLC program operation without program-verify in one plane or more planes of the preferred hierarchical NAND array according to the sequence defined in FIG. 5A of the present invention. This diagram is merely an example, which should not unduly limit the scope of the claims. One of ordinary skill in the art would recognize many variations, alternatives, and modifications. As shown, the method 200 for performing a batched-based M-WL pipeline ABL SLC program without verification starts from step 210 to receive pipeline program command. The pipeline program command would be based on a hierarchical NAND array design, e.g., as shown in FIG. 3A and FIG. 3B, which allows multiple pages to be selected from multiple dispersed blocks for programming concurrently in multiple pipeline series. The method 200 is not like the prior art where NAND program command is designed to take only one-page program scheme with a start code followed by one page address and one page 8 KB program data and the program ends with a code is received to indicate one page of SLC program loading and instruction from host with flash controller being terminated unless a new program page is received again in a new command.

The reason of the prior art SLC program taking only one page data for a whole NAND plane is because its NAND array is not built on the broken GBL and broken LBL hierarchical-BL structures as proposed by the present invention. Instead, hierarchical-BL NAND arrays according to several embodiments of the present invention is able to form a plurality of pages of DCRs with expandable capacitance values within the NAND array without taking extra silicon area outside the array. Thus, more than one page of SLC program or read data can be temporarily stored in those pages of DCRs like DRAMs to last more than 64 ms, which is long enough time span to allow the ABL SLC program, ABL-like SLC read, program-verify, and erase-verify operations to be performed either in pipeline or in concurrent manner. In this invention, multiple-WL program is performed on one-page by one-page base with overlapping time interval in either pipeline or concurrent manner, which dramatically increases the program and read speed. Therefore more page addresses and page data would be sequentially loaded from I/Os into the addressed SCRs in PB and then loaded in a parallel manner into DCRs from SCR or PRB with page program being initiated one by one. As a result, the pipeline program command received in step 210 is to allow this multiple-WL page program and read operation to flexibly take any numbers of page addresses and data.

Next, in step 212, the method 200 is performed to receive a first single pipeline program page address to enable two subsequent functions to be preferably performed at the same time. The first function led to step 216 is to perform sequential loading and latching of two or more sector data from one byte-based I/O. In an embodiment, one sector of 4 KB data is loaded via a 4 KB peripheral SCR and then one 4 KB PRB, to a first selected dynamic 8 KB DCR addressed by a first page address in one selected LG group based on a hierarchical-BL NAND array with broken GBL and broken LBL for subsequent multiple-WL pipeline ABL SLC program. In the example, the number of GBLs are cut in half versus the number of LBLs so that a 4 KB PRB and a 4 KB SCR in the page buffer (PB) can be used for an 8 KB DCR of 8 KB WL to cut the areas of SCR and PRB in half for cost reduction as well as to loosen the tight layout design rules between GBL and PRB. Therefore, each SLC 8 KB page data from the 4 KB SCR needs two cycles to load two 4 KB sector data from one 4 KB PRB. From I/O to SCR needs 4K clocks to load one 4 KB sector data. For whole SLC 8 KB page program data, it takes 8K cycles to from I/O load into SCRs in two steps (4 KB in either Odd sector or Even sector per step). Alternatively, in another example, the number of GBLs are cut to ¼ of the number of LBLs and the first function is to perform sequential loadings and locking of 4 2 KB sector data from one byte-based I/O, via 2 KB SCR and then 2 KB PB, to a first selected page of 8 KB DCR in one selected LG for the subsequent multiple WL pipeline ABL SLC program.

The second function led to step 214 is to perform a parallel Vinh precharge operation on whole 8 KB broken-LBL capacitors ($C_{LBL}$) as one page of 8 KB DCR collectively and simultaneously in one step. The precharge operation is done in a pulse A of less than 1 μs to charge all LBL capacitors ($C_{LBL}$) to Vinh via one precharge power line LBLps within one selected LG group. Before Vinh precharge, the selected LBLps line has to be coupled to a Vinh-driver circuit so that $V_{LBLps}$=Vinh.

Note, since the Vinh voltage is precharged to a plurality of 8 KB broken LBLs (or smaller $C_{LBL}$ capacitors) from only one selected horizontal LBLps line, rather than from 8 KB long GBL lines as used in prior art, thus precharge current can be reduced substantially to less than ¹⁄₁₀.

Next through two sequential 4 KB Odd/Even sector-based Vdd/Vss to Vinh/Vss voltage conversions between each set of 4 KB $C_{GBL}$ lines and each set of 4 KB $C_{LBL}$ Odd/Even sector lines in accordance with the SLC page data, the final 8 KB program voltages $V_{LBL}$s are latched and converted in each selected 8 KB DCR. In addition, the selected block-decoder with a shared self-timed delay control circuit will charge and latch one new set of Vpgm, Vpass, Vread, and Vss voltages for one selected WL, and the remaining unselected WLs, one SSL line, and one GSL line in one selected block within one selected LG to start performing the preferred self-timed pipeline ABL SLC program without verify.

In an embodiment, among the set of Vpgm, Vpass, Vread, and Vss voltages charged and latched for all WLs and 2 string-select lines, the Vpgm is preferred to be a 20V applied in a pulseA duration of 5 μs to precharge and through total program time Tpgm of ~100 μs or less for programming one randomly selected WL. A Vpass voltage of about 10V is applied for the remaining unselected WLs, a Vread voltage is applied for one SSL, to allow the stored Vinh and Vss of SLC page data in N $C_{LBL}$s can be passed to channels of N randomly selected cells and Vss is applied to one GSL line.

Therefore, in order to fully connect both program-inhibit Vinh voltage (~7V) and program voltage Vss on $C_{LBL}$s after conversion to the addressed WL 8 KB cells channels via multiple pass NAND cells along 8 KB NAND strings, Vss is applied for one GSL to shut off 8 KB string channel voltages from being leaked to CSL (supplied with Vdd) in FIG. 1A or SL (supplied with Vdd) in FIGS. 1B, 1C, and 1D.

At step 218, the method 200 determines if a last byte of a 4 KB sector data is fully loaded into one 4 KB SCR from byte-based I/Os by 4K sequential cycles. If yes at the step 218, then the method 200 includes step 220 for transferring the 4 KB sector data in each SCR to one 4 KB PRB in parallel manner in one-step with a pulseB duration less than 1 µs, because there is no $C_{GBL}$ and $C_{LBL}$ involved in the step. Then, this 4 KB SCR will be instantly released for next sequential loading operation of next 4 KB sector program data from I/O again in next 4K sequential clock cycles. If no at the step 218, then the current 4 KB sector program data has to be continuously loaded from I/Os until it is completed (to the last byte).

Further at step 226 following the step 220, the method 200 determines if 4 KB broken GBLs are released from other pipeline or concurrent operations at the moment prior to the transferring of 4 KB data in PRB to the addressed 4 KB SCR. If yes, at the step 226, the method 200 includes step 228 for making a first connection between 4 KB PRB and 4 KB shared broken GBLs in a duration of pulseC, which is longer than pulseA and pulseB due to the higher parasitic capacitance of $C_{GBL}$ to be charged with Vdd or Vss but is less than 3 µs in accordance with the new sector data along the path from 4 KB PRB to one addressed 4 KB DCR of a selected 8 KB DCR. At this step, each parasitic capacitance of $C_{LBL}$ is not seen from each bit of PRB due to the disconnection between 4 KB $C_{GBL}$s and 4 KB $C_{LBL}$s of one 4 KB DCR.

Once above 4 KB $V_{GBL}$ voltages are settled at the step 228 in accordance with the current 4 KB sector program data supplied by one 4 KB PRB, the first connection has to remain intact, and then the method includes step 230 for making a second connection between the 4 KB $C_{GBL}$s and 4 KB selected $C_{LBL}$s out of total 8 KB $C_{LBL}$s in one LG-based DCR.

With the proper connections of 8 KB relevant MLBL devices along the path by applying Vdd to some of relevant BLG1 to BLJ'−1 signals, a $V_{LBL}$ voltage conversion from all initial Vinh to Vinh/Vss will take place in a duration of pulseD, which is about equal to pulseA, pulseB, and pulseC but should be less than 1 µs because conversion of $V_{LBL}$ of initial Vinh voltage will be done by discharging the Vss via each $C_{GBL}$ and each corresponding PRB at Vss. As a result of the step 230, the final $V_{LBL}$=Vss if $V_{GBL}$ and corresponding PRB is at Vss corresponding to data "0", and $V_{LBL}$=Vinh if $V_{GBL}$ and corresponding PRB is at Vdd corresponding to data "1".

Note, the $V_{LBL}$ voltage conversion for this pipeline SLC program is preferably checked by a self-timed delay control of 1 µs seen at step 232. Once conversion is completed, then the method 200 includes a step 234 for disconnecting both the first and the second connections of the 4 KB GBLs, in a pulseE, from both 4 KB PRB and 4 KB broken LBLs so that the 4 KB GBLs are released for loading next 4 KB sector data. If not completed, then the $V_{LBL}$ voltage conversion has to be continued for the current sector data with both the first and the second connections staying intact.

Then the method 200 includes step 236 for determining if the current sector is the last sector of one selected WL. If yes, then the method 200 includes a step 238 for performing one-pulse charging and latching one set of Vpgm, Vpass, Vread, and Vss gate voltages respectively on one selected WL, all un-selected WLs and SSL, and GSL parasitic poly2-line capacitors in a duration of pulseF. In an embodiment, the pulseF is controlled by ENB command signal which also is used to set a reference voltage Vref for starting a self-timed ABL page program at step 240 by applying Vpgm to one selected WL of the addressed block with a self-timed Tpgm control. The programming time Tpgm is about 100 µs for this pipeline SLC program operation without verification. In another alternative embodiment, the present invention also provides a pipeline ABL SLC program with verification with a total iterative programming time of about 250 µs.

Next, the flow moves to Step 246 to check if all self-timed pipeline SLC program on multiple WLs have been finished. If yes, then this pipeline SLC program is ended at step 250. If not, then the loop of the pipeline SLC program is continued without interrupt until all of them are finished and ended at step 250.

After performing the self-timed ABL page program at step 240 by applying Vpgm to one selected WL of the addressed block, simultaneously, the method 200 includes another step 242 to check if the currently executed page is the last one of the M-WL pipeline SLC program. If yes, then the method 200 includes a step 248 for receiving a conform-code of the last-page of pipeline SLC program, and then merging into step 246 to determine if all self-timed pipeline SLC program on multiple WLs have been finished. If the step 242 leads to a "no", then the method 200 includes a step 244 to sequentially load next page data again for repeating the pipeline SLC program started at the step 212 for receiving the (next) pipeline program page address.

Note, the total selected blocks for pipeline SLC program can be flexibly and randomly distributed in one or more planes in each NAND chip, regardless of the type of 2D or 3D NAND array structures with only one restriction that any two selected WLs in two blocks cannot be within the same LG-based DCR because $C_{LBL}$ in one LG can be used for only one 8 KB $V_{LBL}$ program voltage of one selected WL of one selected block.

Furthermore, more than one set of Vpgm, Vpass, Vread, and Vss for more than one selected block with same selected WL location can be set in 1-cycle for the batch-based pipeline operations can be performed with overlapping time span following sequence and guideline as defined in FIG. 5B for further reducing the M-WL SLC program time.

In addition, the preferred pipeline operations include more than just the pipeline SLC program. They can include something like the pipeline read, erase-verify, and another pipeline SLC program. Those skilled in the art should recognize many derivatives or modified designs from above disclosures.

Figure 7:
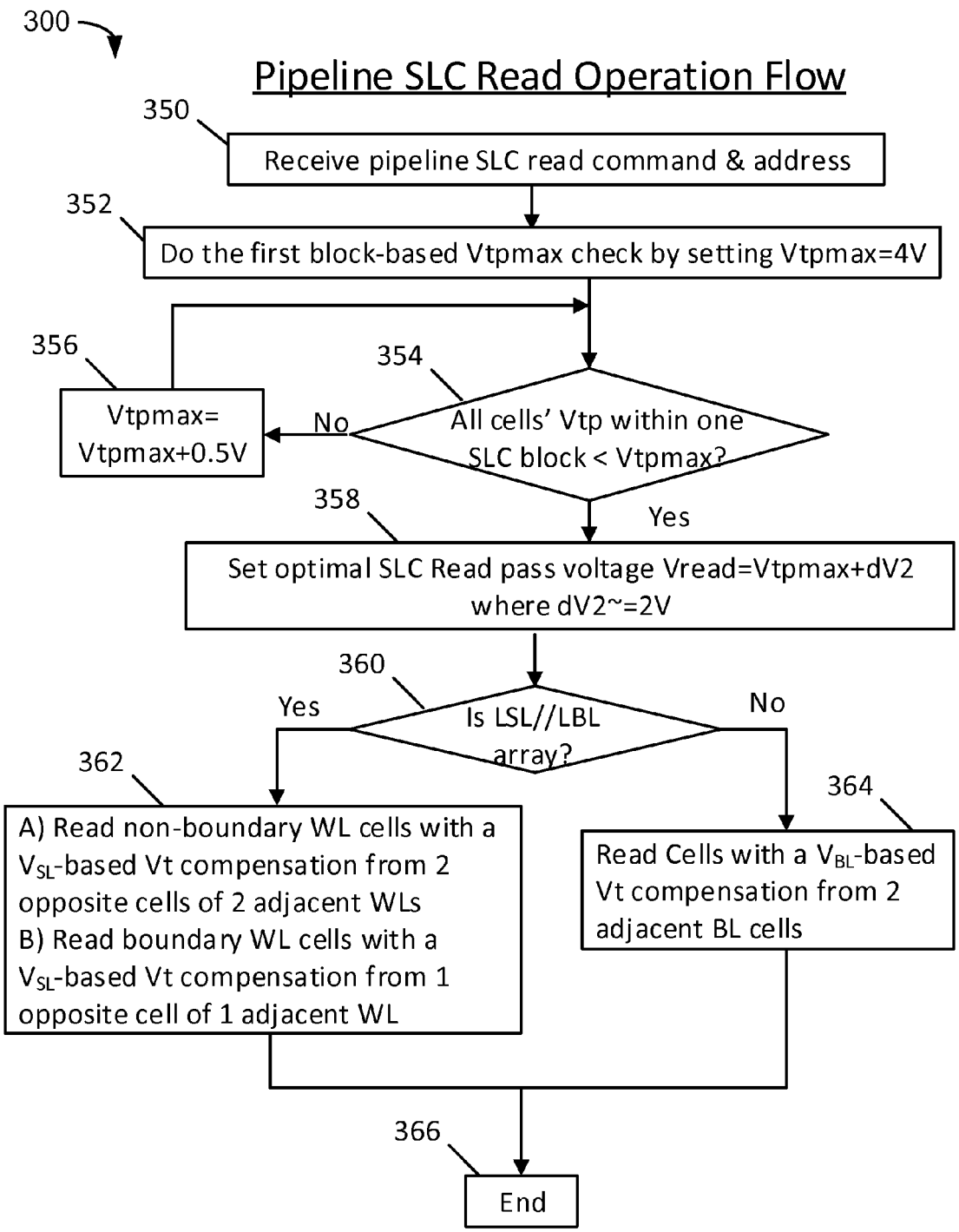
FIG. 7 is a flow chart showing a method of a pipeline ABL-like SLC read operation according to an embodiment of the present invention.

FIG. 7 is a flow chart showing a method of a pipeline ABL-like SLC read operation according to an embodiment of the present invention. This diagram is merely an example, which should not unduly limit the scope of the claims. One of ordinary skill in the art would recognize many variations, alternatives, and modifications. As shown, a method 300 is provided for a pipeline ABL-like SLC read operation with or without a $V_{SL}$-based Individual Vt compensation, depending on NAND array layout scheme of (GBL//LBL)⊥(CSL//LBLps) as shown in FIG. 1A or (GBL//LBL//LSL)⊥LBLps as shown in FIG. 1B, or FIG. 1C or FIG. 1D. Here "//" is denoted for parallel line configuration and "⊥" is denoted for orthogonal line configuration. In an embodiment, the method 300 includes steps to check block-based program-state Vtpmax and assign the optimal read-pass voltage Vread with margin for ABL-like SLC read operation. Additionally, the method 300 includes steps to perform the desired page-based ABL-like SLC read operation on one selected WL of one selected block within one selected LG and one MG.

As shown, a method 300 is provided for performing a block-based ABL-like SLC pipeline read operation of the present invention. The ABL-like read means that the main latencies of each 8 KB SLC read operation including the first step of ABL 8 KB LBL Vinh precharging, the second step of ABL 8 KB data evaluation and the third step of two sequential HBL 4 KB CS from one selected block in one selected LG. In these 3 steps, only the third CS step is not performed in ABL manner. But because the HBL CS latency is much shorter than ABL Vinh precharge and ABL data evaluation, thus CS latency is not counted. Then, the SLC read of the present invention is performed like an ABL read referred as an ABL-like read by the present invention. In an embodiment, the ABL-like read operation can be done equivalently on 8 KB cells simultaneously in one step with minor delay to transfer the realized 8 KB sensed data on sector-based from 8 KB $C_{LBL}$s to 4 KB PRB in 2 sequential cycles in accordance with 8 KB SLC cells Vts in one whole WL if NAND arrays are made of a plurality of NAND strings as shown in FIG. 1A, regardless of the 2D or 3D type NAND technology.

Other NAND arrays made of NAND strings shown in FIG. 1B, 1C, or 1D will be performed with the Odd/Even HBL SLC read in 2 cycles, regardless of 2D or 3D type NAND technology. As a result, the precharged $V_{LBL}$ of Vinh will be discharged to Vinh−ΔV if all 128 SLC cells (in corresponding LG group) Vts are Vte, where ΔV≥2V, depending on the hierarchical NAND array scheme, location of selected MG and HG, or retained (at its initially pre-charged value) if the SLC cell Vt is Vtp when a predetermined VR is applied to selected WL of the selected block, where $V_{LBL}$ is the initially precharged voltage of 7V in each $C_{LBL}$ for the subsequent CS (charge-sharing) operation between $C_{LBL}$ and $J \times C_{GBL}$ to get a higher differential signal for each SA's Vt evaluation.

In an embodiment, when multiple M WLs are selected for performing a pipeline ABL-like SLC read, it means these multiple WLs' cells can be performed with M ABL Vinh precharge and M ABL evaluation simultaneously in 1-cycle and the followed by 2M sequential CS steps. As a result, a dramatic more than M-fold reduction of M-WL ABL-like SLC read can be achieved by the present invention.

Referring to FIG. 7, the method 300 of performing SLC pipeline ABL-like read operation starts from a step 350 to receive pipeline SLC read command and address information. The pipeline SLC read command allows read multiple dispersed pages (WLs) in multiple dispersed blocks in multiple dispersed $C_{LG}$s in a pipeline and concurrent manner. Therefore, after each SLC read command, multiple addresses of selected WLs can be set one by one after command code.

Since the ABL SLC program operation, as described earlier, is performed by one ~20V Vpgm in approximate 100 ms program time Tpgm without an iterative program/program-verify step, thus the final Vt values of the SLC Vtpmin and Vtpmax of 8 KB cells in each WL, in each block and even each chip become more difficult to be individually controlled within a desired narrow range as the SLC Vts with a program verify. Thus an initial pre-read operation for determining the final Vtpmax of each selected block is to determine an optimal Vread with at least 2V margin to SLC program state Vtpmax for those unselected 127 WLs of each selected block to perform a more reliable pipeline SLC read operation. Although each NAND block has density of 8 Mb (8 KB×128) in the present invention, the density of NAND chip can be up to 256 Gb. Thus, the wider Vtp distribution can happen, thus a fast block-based pre-read to determine the optimal Vread in 1-cycle is justified. For M WLs are selected in M dispersed MGs, then this pre-read operations can be done simultaneously for ABL Vinh-precharge and ABL Vtpmax evaluation to gain further M-fold reduction in SLC pre-read latency.

The method 300 includes a pre-read operation at step 352 by applying a first Vtpmax=4V voltage to all 128 selected WLs along with Vdd to SSL and GSL of each selected block. The Vtpmax=4V can be best characterized by the production history of one particular NAND die, wafer, or NAND technology nodes. In a specific embodiment, this initial Vtpmax=4V is used to determine if all 8 Mb SLC cells' program state Vtpmax is less than 4V after being performed one pulse 20V Vpgm with a duration approximate of 100 μs from erase state Vte state.

Subsequently, the method 300 includes a step 354 for iteratively checking Vts of the whole 8 Mb cells' Vtp in one selected block are less than Vtp<Vtpmax=4V.

If the step 354 yields "yes", then all 8 Mb cells' $V_{LBL}$=0V in one of the selected block are like the E-state cells with data "1", i.e., all 8 Mb cells' Vts with a Vtpmax<4V in normal Vtp distribution. Then the method 300 includes a step 358 for setting an optimal Vread voltage Vread=Vtpmax+dV2, where dV2 is at least 2V. Thus Vread for each block is sort of the customized value for each selected block to obtain the optimal ABL-like SL read subsequently for less Vread WL stress.

If the step 354 yields "no", then the method 300 includes a step 356 for resetting the Vtpmax by increasing 0.5V from the initial Vtpmax to continue determining the next final optimal Vtp value of the Vtpmax, which is defined as Vtpmax=Vtpmax+0.5V.

The steps 356 and step 354 will continue and Vtpmax value will be increased accordingly and will terminate until all 8 KB $V_{LBL}$=Vss being detected by PB in each selected block in each selected MG. The last value of Vtpmax plus 2V margin will generate the optimal Vread defined by Vread=Vtpmax+dV2 to complete the SLC pre-read operation, where dV2=2V for the subsequent 2nd ABL-like SLC read operation performed at either step 362 or step 364, depending on the type of NAND array.

Next the method 300 moves to the second sub-operation of step 360 to determine if the NAND array includes a common source line (CSL) in each block. If no, then the NAND array scheme is based on FIG. 1A with (GBL//LBL)⊥(CSL//LBLps), then the method 300 moves to step 364 for performing HBL SLC read operation using a $V_{BL}$-based or $V_{WL}$-based cell Vt compensation scheme in accordance with two adjacent SLC cells stored data. If yes, it means that the NAND array formed in (GBL//LBL//LSL)⊥LBLps, using each adjacent BL as a SL per string, then the method 300 moves to step 362 for performing HBL SLC read operation using a preferred $V_{SL}$-based cell Vt compensation scheme in accordance with the conditions of two kinds of selected WLs defined below.

For non-boundary WL HBL SLC read operation, a source voltage $V_{SL}$-based individual Vt compensation scheme is used by readjusting a bigger individual $V_{SL}$ voltage calculated from two opposite cells residing on two physically adjacent WLn−1 and WLn+1 of the WLn in the description. Alternatively, for boundary WL HBL SLC read, a $V_{SL}$-based individual Vt compensation scheme is also used by readjusting a smaller individual $V_{SL}$ voltage calculated from one opposing cell residing on one physically adjacent WLn+1 in the description.

After the pipeline SLC read, either $V_{SL}$-based or $V_{BL}$-based Vt compensation can be used as an option in accordance with array types to complete the method 300 at a step 366. The detailed description of the novel individual $V_{SL}$-based cell Vt compensation scheme is disclosed in U.S. patent application Ser. No. 14/828,427, filed by Peter Wung Lee commonly assigned to Aplus Flash Technology and fully incorporated as reference for all purposes.

In an embodiment, the method 300 for performing pipeline SLC ABL-like read operation, the ultimate goal of this preferred read option is to skip the check steps of step 352, 354, 356 and 358 of FIG. 7's flow entirely to shorten read latency but keep SLC read steps of Step 350, Step 360, Step 362 and Step 364 only. This can be done more accurately when more production records of cells' Vt distribution in one page of whole array being more accurately characterized and accumulated.

Figure 8A:
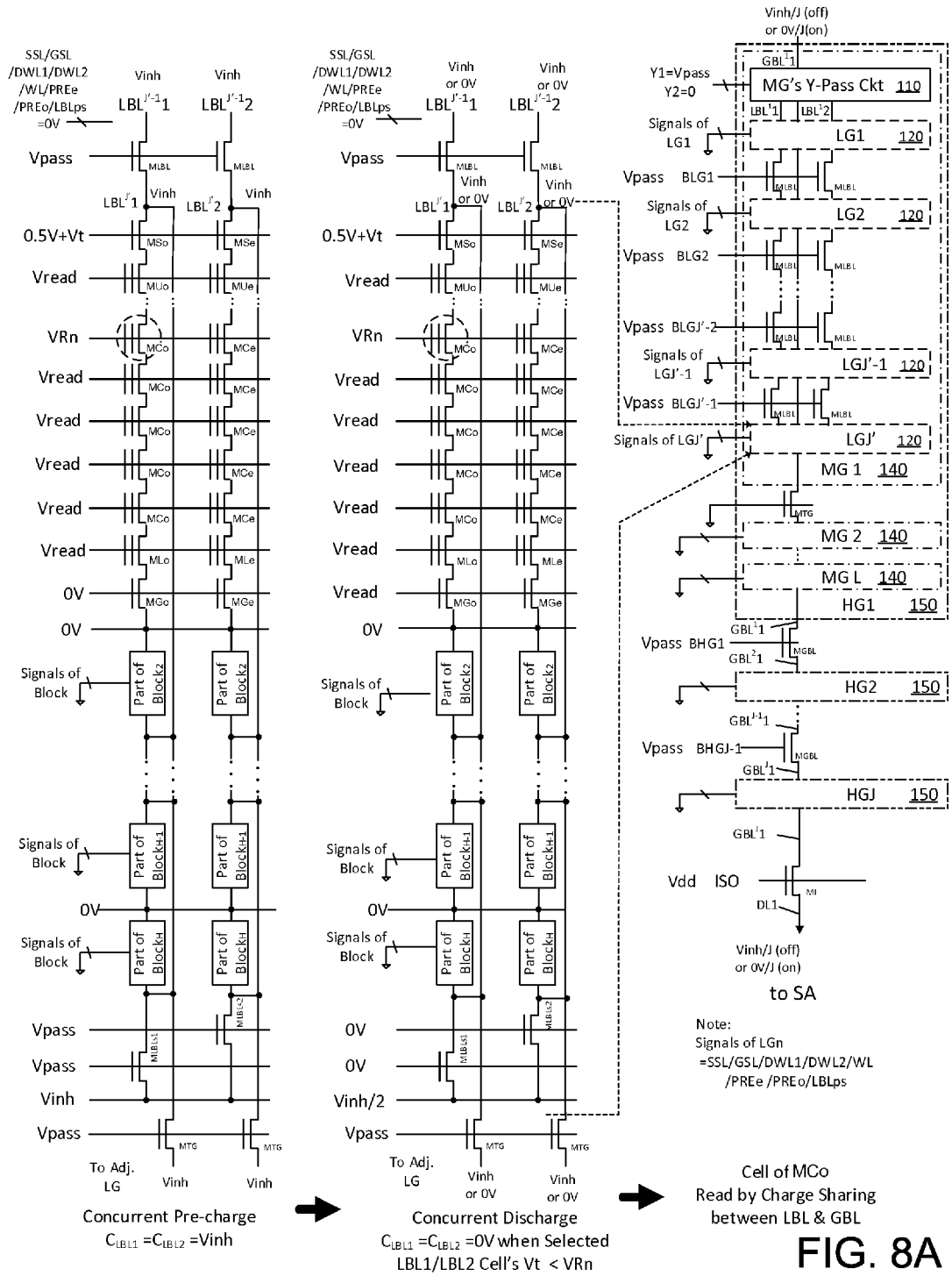
FIG. 8A is a diagram showing block bias conditions for performing pipeline ABL-like SLC read operation according to an embodiment of the present invention.

FIG. 8A is a diagram showing block bias conditions for performing pipeline ABL-like SLC read operation according to an embodiment of the present invention. This diagram is merely an example, which should not unduly limit the scope of the claims. One of ordinary skill in the art would recognize many variations, alternatives, and modifications. As shown, the ABL-like SLC read operation is divided in two steps performed in 2 cycles with the aid from each LBLps precharger circuit being divided into Old and Even Vinh prechargers. In each cycle, a first SLC read data is from each cell's sensed voltages of Vinh or Vss converted from Vtp or Vte from one selected $C_{MG}$ before CS for one input of the DRAM-like sense amplifier (SA). A second SLC read data is preferred from same $C_{MG}$ with a precharge of Vinh–ΔV/2 for a tracking reference voltage before CS for second input of the SA. The reference voltage is the one stored in one selected MG-based DCR, rather from NAND cells.

Three basic steps for this ABL-like SLC pipeline read operation are summarized below. As an example, NAND array with CSL for each block as shown in FIG. 1A is used to illustrate the preferred ABL-like pipeline SLC read operation. Similarly, HBL pipeline SLC read operation can also be applied to other NAND arrays without CSL based on strings shown in FIGS. 1B to 1D, regardless of 2D or 3D string structure.

One basic step is ABL concurrent precharge operation for all 8 KB strings per block. Referring to FIG. 8A, with only first two NAND strings being shown, a set of bias conditions on corresponding control gates is provided for performing concurrent precharge of Vinh (~7V) voltage on 8 KB $C_{LG}$s at node of $LBL^{J''}1$ through $LBL^{J'}N$. Although not fully shown in FIG. 8A, the precharge of Vinh voltage can be performed on all $J'$ $C_{LG}$s in each of 8 KB $C_{MG}$s concurrently and simultaneously to save time. In order to do so, all gates of 8 KB MLBL devices in one $C_{LG}$-DCR are connected to one BLG gate signal, which is coupled to Vpass (~8-10V) to fully equalize Vinh voltage of all $C_{LG}$s within one $C_{MG}$. In addition, all gates of $PRE^1e$ and $PRE^1o$ in each $C_{LG}$ are coupled to Vpass with the precharge power line $LBL^1ps$=Vinh.

In an embodiment, all other biased conditions for precharge operations are included in FIG. 8A. For one selected block in each LG group, gate voltage for the selected WL is biased to VR. Gate voltages for all non-selected WLs are biased to Vread (~6V). GSL gate signal for string-select devices MGe and MGo is biased to 0V to prevent string leakage from LBLs at Vinh to common CSL=0V. SSL gate signal is biased to 0.5V+Vt so that drain nodes of selected strings of NAND cells MCe and MCo are placed at 0.5V for a normal SLC read operation without causing cell channel punch-through. For H-1 non-selected blocks in each LG group, all sets of 127 non-selected WLs, SSL and GSL are coupled to Vss except one WL having the same address of the selected WL of the selected block is applied to VR.

Another basic step is an ABL evaluation operation for discharging or retaining each $V_{LBL}$ in accordance with each stored SLC bit data in an 8 KB page of the selected block in the selected LG group. This step is performed with GSL gate signal being changed from 0V to Vread to turn on two NAND strings for cell sensing. The results of this step: a) each LBL, $LBL^{J'}1$ through $LBL^{J'}N$, retains Vinh if Vt=Vtp>VR for any NAND cell in the selected WL corresponding to the LBL, regardless of MCe or MCo; b) Conversely, each LBL, $LBL^{J'}1$ through $LBL^{J'}N$, discharges to 0V if Vt=Vte<VR for any NAND cell in the selected WL corresponding to the LBL, regardless of MCe or MCo. All other sensed bit voltages $V_{LBL}$ in different $C_{LG}$s are equalized, e.g., $VLBL^{J'-1}1$=$VLBL^{J'}1$ and $VLBL^{J'-1}2$=$VLBL^{J'}2$, because different $C_{LG}$s are connected into one bigger $C_{MG}$ for a stronger signal for the subsequent charge-sharing operation.

The third basic step is to perform HBL charge-sharing (CS) operation between the selected $C_{MG}$ and the rest of $C_{HG}$s to allow each corresponding SA to sense bit voltages along corresponding GBLs. Referring FIG. 8A to the right hand part, it shows the selected LGJ' (120) within MG1 (140) in HG1 (150). Each HG has L MGs and each MG has $J'$ $C_{LG}$s. The CS operation occurs between $C_{MG}1$ and $C_{HG}1$+$C_{HG}2$+ . . . +$C_{HG}J$. In other words, the final sensed voltages become: $VLBL^{J'}1$=$VLBL^{J'}2$=Vinh/J if SLC Vt=Vtp, or $VLBL^{J'}1$=$VLBL^{J'}2$=(Vinh–ΔV)/J if SLC Vt=Vte, and Vinh–ΔV=0V if ΔV=Vinh after sufficient delay. For example, for those sequential 2M CS operations, except for the first HBL CS operation, the remaining 2M-1 CS operations for M-WL SLC read, the Vinh drops to 0V, ΔV=Vinh, so Vinh–ΔV=0V can be realized.

Figure 8B:
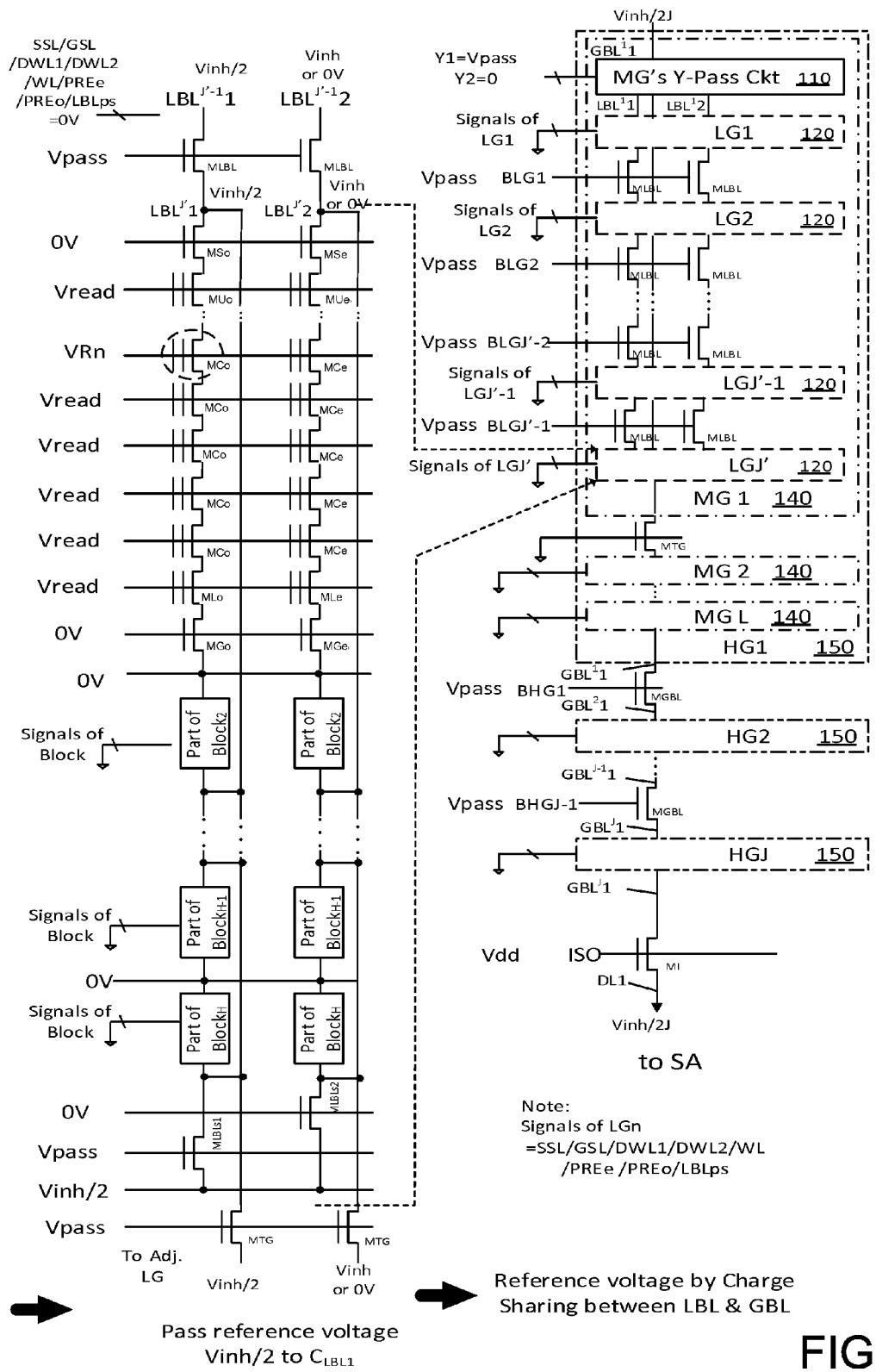
FIG. 8B is a diagram of showing array block bias conditions for continuing the pipeline ABL-like SLC read operation according to an embodiment of the present invention.

FIG. 8B is a diagram of showing block bias conditions for continuing the pipeline ABL SLC read operation according to an embodiment of the present invention. This diagram is merely an example, which should not unduly limit the scope of the claims. One of ordinary skill in the art would recognize many variations, alternatives, and modifications. As shown, FIG. 8B continues the ABL-like SLC read operation of a reference voltage from same MG1 group in HG1 group with the same bias condition as shown in the first circuit of FIG. 8A (on the left side) but with LBLps=Vinh–ΔV/2. As a result, both sensed bit voltages $VLBL^{J'}1$=$VLBL^{J'}2$=Vinh–ΔV/2. Note, the Vinh–ΔV/2 is set for the reference voltage by the precharge power line LBLps, unlike the sensed data from the reference cell in DRAM. Thus, the gate signal SSL has to be set to 0V to shut off string-select device MSo or MSe to prevent this reference voltage Vinh/2 being leaked to the CSL through two NAND strings.

The second HBL CS operation of the reference voltage Vinh–ΔV/2 between MG1 group and rest MG2 to MGJ groups would be the same as the SLC read on regular cells as seen in FIG. 8A. As a result, each sensed bit voltage $VLBL^{J'}1$=$VLBL^{J'}2$=(Vinh–ΔV/2)/N' after N'-fold dilution through the CS operation between a $C_{MG}$ and one or more $C_{HG}$s. Thus there is a signal difference of (Vinh–ΔV/2)/N' between 2 inputs of Qi and QBi of each DRAM-like SA, with more details to be described in FIG. 15 below. The details of the pipeline ABL SLC read operation of the reference voltage Vinh/2 are like FIG. 8A. As described above, the (Vinh−ΔV/2)/N' becomes Vinh/2N' when ΔV=Vinh after a sufficient delay from the second HBL CS operation.

Figure 9:
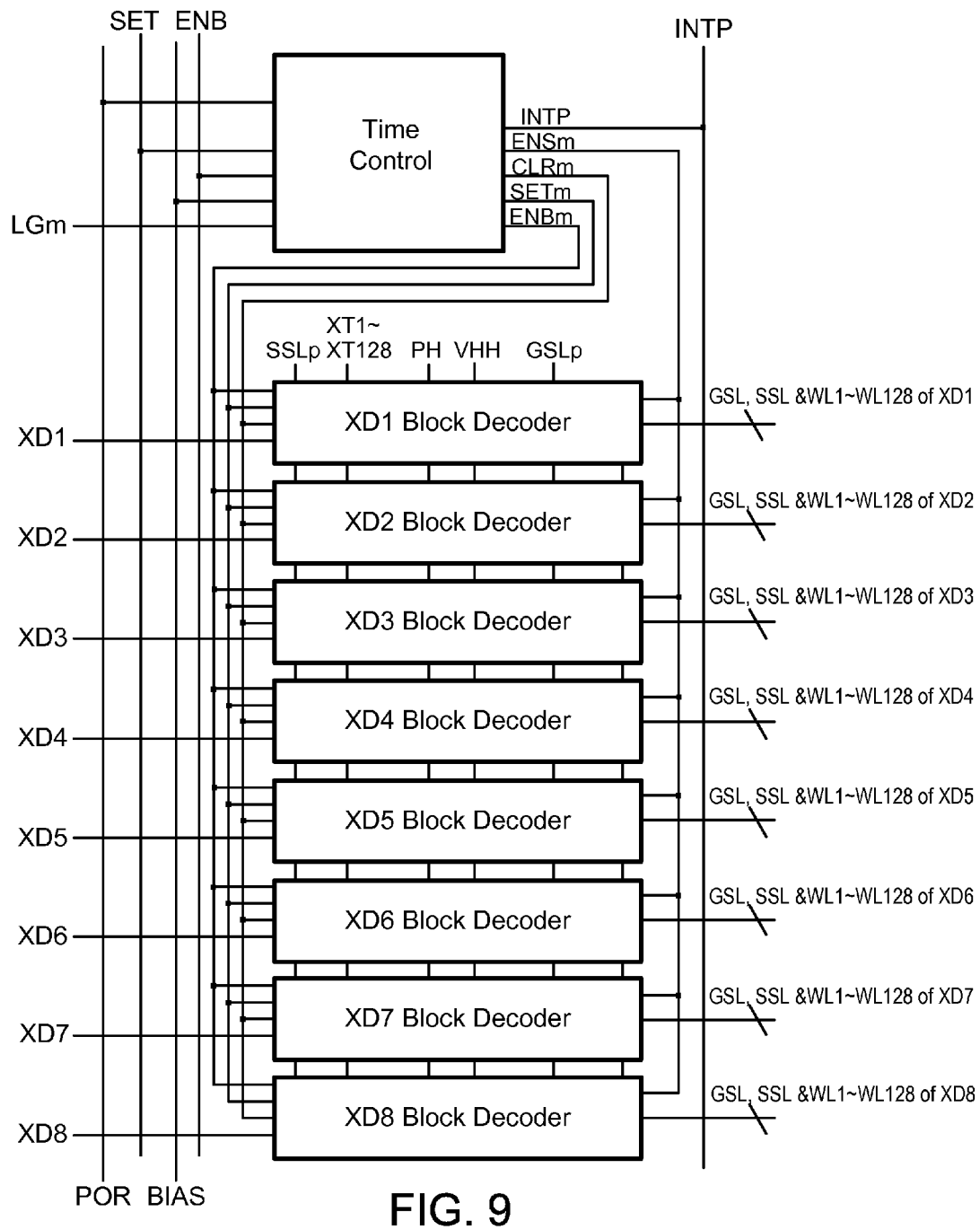
FIG. 9 is a circuit block diagram of multiple block-decoders and one shared self-timed delay control circuit according to an embodiment of the present invention.

FIG. 9 is a circuit block diagram of multiple block-decoders and one shared self-timed delay control circuit according to an embodiment of the present invention. This diagram is merely an example, which should not unduly limit the scope of the claims. One of ordinary skill in the art would recognize many variations, alternatives, and modifications. As shown, a circuit block diagram of a LG-based Row-decoder includes 8 block-decoders and one shared self-timed delay control circuit to work along with the hierarchical-BL NAND array of the present invention for performing pipeline SLC program operation in a highly efficient way.

Referring to FIG. 9, each of the 8 block-decoders has its own individual pre-decoder input denoted as XDn, where n=1 to 8, and four common control inputs denoted as ENBm, SETm, CLRm, and ENSm generated by the common self-time control circuit with one set of common inputs including SSLp (one top string-select input), XT1-XT128, PH (clock), VHH (Global HV input), and GSLp (one bottom string-select input) and corresponding outputs of 128 WLs, SSL, and GSL lines to be supplied and latched with respective bias voltages of Vpgm, Vpass, Vread, and Vss.

In an embodiment, the self-timed delay control circuit is provided for generating several derivative delays from one known-delay controlled by one input pulse of ENB signal and others of POR, BIAS, and SET from an on-chip state-machine (see FIG. 3A). The self-timed delay control circuit is one RC circuit for all blocks within a same LG or one page of LG-based DCRs. All varied derivative delays such as a long delay of 100 μs for Tpgm or a short delay of 2.5 μs for discharging Vpgm, Vpass, Vread, and Vss in one selected WL, 127 unselected WLs, 1 SSL line, and 1 GSL line, and other delays are all aligned to the ENBm signal with a known duration of pusleE of about 5 μs to save the big RC-delay areas. Only the selected LG group will enable this self-timed control circuit. All unselected LG groups would be disabled not to consume any power consumption. It is a simple tracking and very reliable RC circuit made only by small chip area for cost and power reduction.

Figure 10:
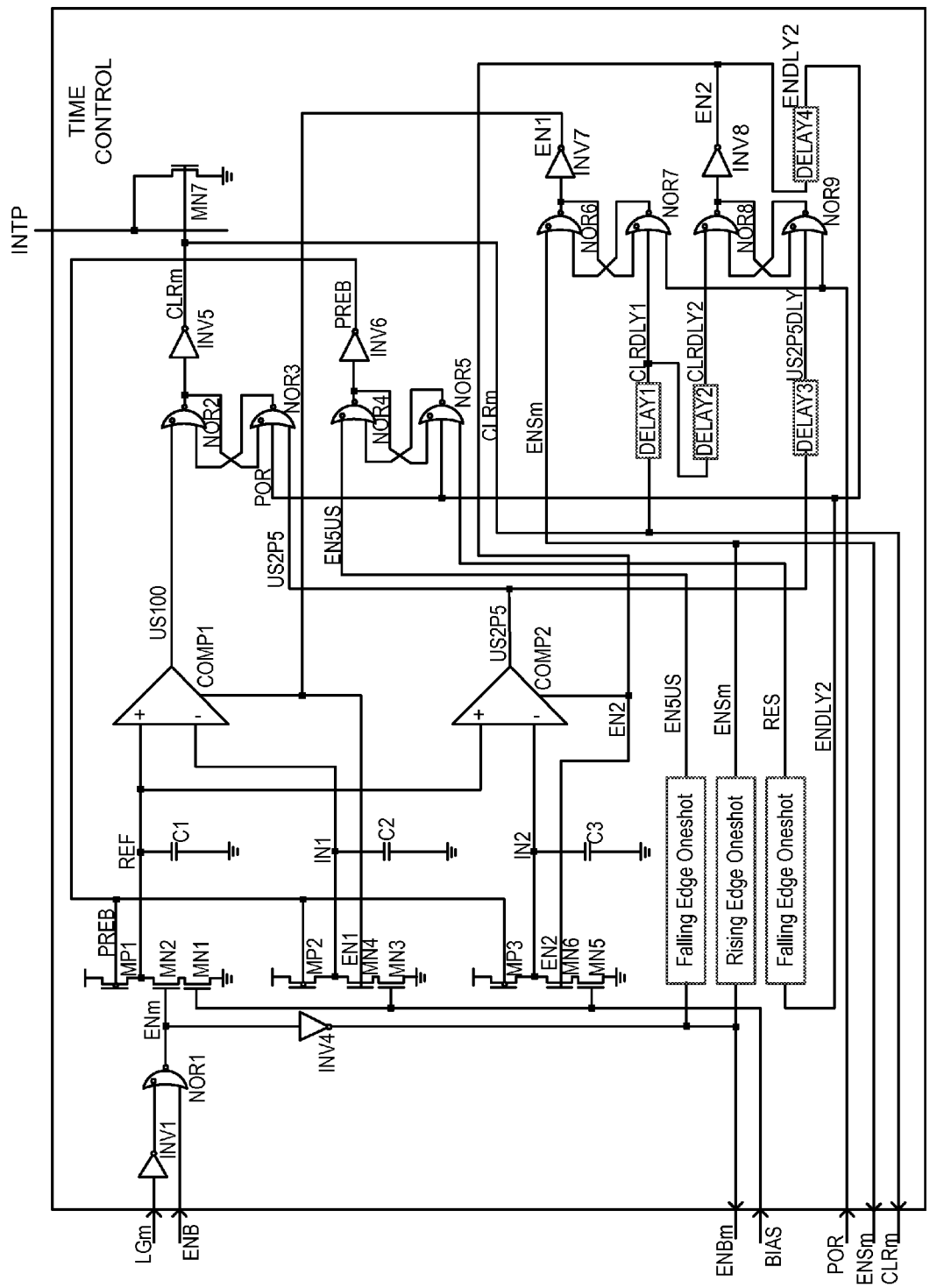
FIG. 10 is a circuit diagram showing details of implementation of the self-timed delay control circuit in FIG. 9 according to a specific embodiment of the present invention.

FIG. 10 is a circuit diagram showing details of implementation of the self-timed delay control circuit in FIG. 9 according to a specific embodiment of the present invention. This diagram is merely an example, which should not unduly limit the scope of the claims. One of ordinary skill in the art would recognize many variations, alternatives, and modifications. As shown, the self-timed delay control circuit includes two Differential Amplifiers (DAs), COMP1 and COMP2. These two DAs have one common Vref input connected to REF node or "+" node with a C1 capacitor of each DA and two separate inputs connected to two individual "−" nodes, IN1 with a C2 of COMP1 and IN2 with a C3 of COMP2.

In an embodiment, the self-timed delay control circuit further includes three similar current-mirrored discharge RC circuits with three identical capacitors but three different R values defined by three ratios of mirrored currents, e.g., three ratios of NMOS W/L values of three NMOS devices of MN1 and MN3 in COMP1 and MN5 in COMP2. Additionally, the self-timed delay control circuit includes an interrupt circuit comprising one pull-down device of MN7 with the common drain node being connected to INTP and gate tied to CLRm. The Vref input at REF node is tuned by using one known-duration signal ENB provided by on-chip state-machine to discharge from its initial precharged Vdd to the final Vref through a discharged circuit which is controlled by a constant current mirror circuit with their common gates connected to BIAS. Further, the self-timed delay control circuit includes several latch circuits such as a first paired circuits of NOR2 and NOR3, a second paired circuits of NOR4 and NOR5, a third paired circuits of NOR6 and NOR7, and a fourth one of NOR8 and NOR9. Furthermore, the self-timed delay control circuit includes several small one-shot pulse generator circuits such as DELAY1, DELAY2, DELAY3, and DELAY4 are for properly generating the right sequential pulse-widths and timing controls of all required durations of 5 μs for EMBm, ~100 μs for XDPn and 2.5 μs for C2 and C3 discharge time controls of enable signals such as EN1 and EN2. One option of all the durations of these four delays can be kept identical less than 50 ns for simpler design.

In another embodiment, several required controlled delays such as Tpgm program time span and others can be generated by aligning to above Vref level defined by discharge time for discharging from Vdd to Vref in a controlled duration of 5 μs by one pulse of ENm. As a result, the long delay generated later from this self-timed control circuit does not require the support from the on-chip state-machine and counter so that power consumption and circuit areas can be greatly reduced.

Figure 11:
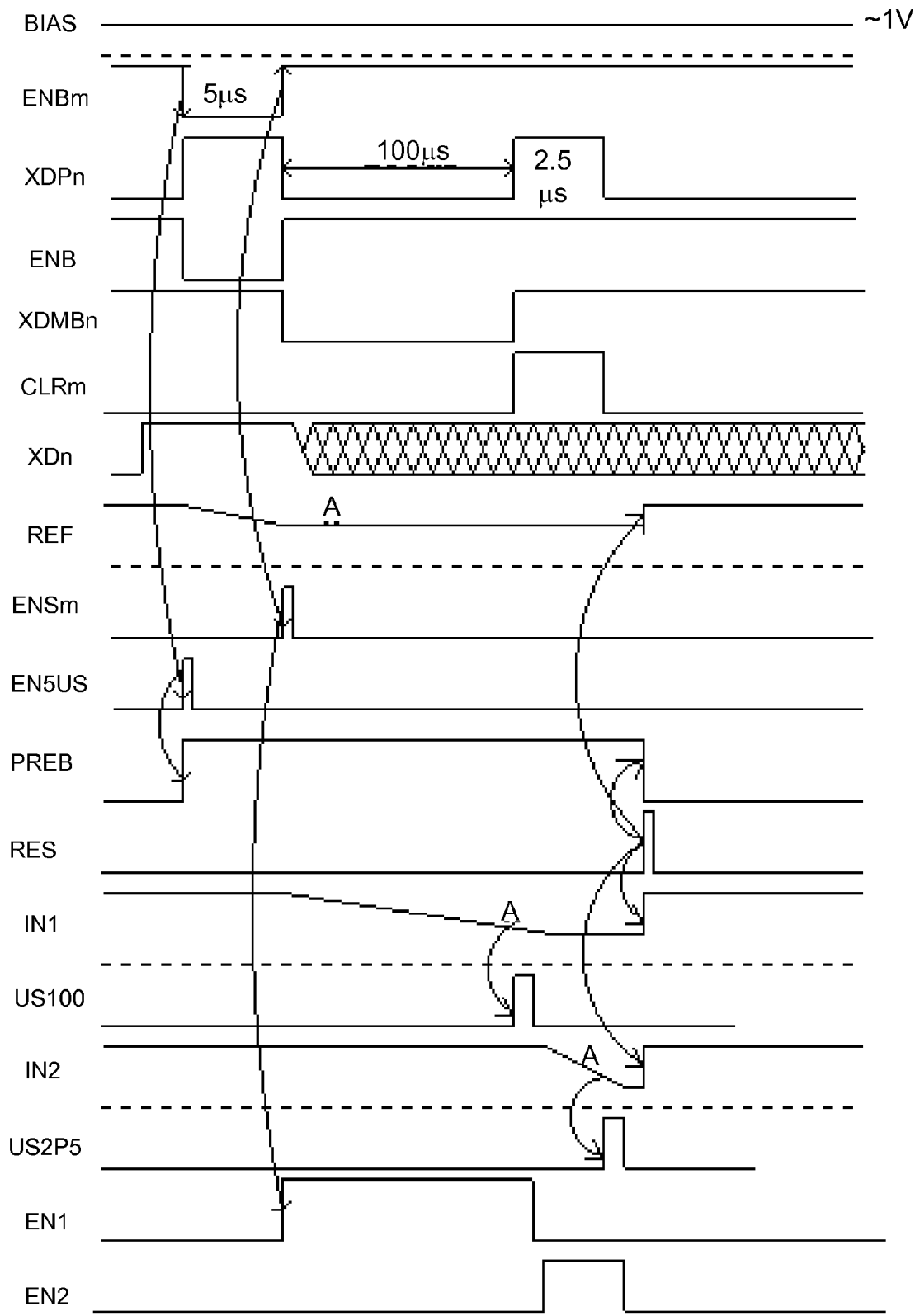
FIG. 11 is a diagram showing waveforms to operate the self-timed delay control circuit of FIG. 10 for performing an ABL pipeline and concurrent SLC program according to a specific embodiment of the present invention.

FIG. 11 is a diagram showing waveforms to operate the self-timed delay control circuit of FIG. 10 for performing a pipeline and concurrent M-WL ABL SLC program according to a specific embodiment of the present invention. This diagram is merely an example, which should not unduly limit the scope of the claims. One of ordinary skill in the art would recognize many variations, alternatives, and modifications. As shown, preferred timing waveforms to operate the self-timed delay control circuit shown in FIG. 10 are designed for performing the M-WL pipeline and concurrent ABL SLC program operation of the present invention. In each NAND memory chip, there are many similar self-timed delay control circuits distributed in whole NAND die. The LG-based row-decoders circuit is just a key circuit using this self-timed delay control circuit for executing the pipeline operation. It can be also used for any self-timed concurrent operations. In other words, as long as a long-delay time span is required, this self-timed control circuit can be applied without using any extra bulky, noisy, high-power oscillator, counters and big capacitors to generate the calculated long R/C delays.

Each of the waveforms represents a respective operational signal of the self-timed delay control with references to circuits of a block-decoder shown below in FIG. 12 and a LG-based row-decoder shown earlier in FIG. 9.

BIAS: When a NAND memory chip is entering into a M-WL ABL SLC program, then BIAS is set to be Vdd by On-chip State-machine circuit, then 3 reference currents of 3 current-mirror circuits of COMP1 and COMPA2 of the time-control circuit in FIG. 10 are enabled if ENm is set to Vdd. These 3 reference currents are respectively controlled by 3 different values of W/L ratios of MN1 and MN3 for COMP1 and MN5 for COMP2 if the sizes of MP1, MP2, and MP3 are equal.

ENBm: When control signals ENB=Vss and LGm=Vdd, then ENBm=Vdd to enable three current-mirrored circuits for REF, IN1, and IN2 of both differential amplifiers COMP1 and COMP2 as seen in FIG. 10. The ENBm=Vdd will turn on transistors MN2, MN4, and MN6 simultaneously for 3 respective REF, EN1, and EN2 current-mirrored circuits. One option of this low one-shot pulse duration of ENBm is set to be 5 µs by ENB=Vss in 5 µs. With PREB=Vss after power-on reset, and EN1=EN2=Vss to disable C2 (IN1 node) discharge path and C3 (IN2 node) discharge path but only C1 (REF node) discharge path is enabled. Note, 5 µs or less is the predetermined time delay to charge up one set of Vpgm, Vpass, Vread, and Vss of the selected block's single selected WL and 127 unselected WLs, 1 SSL, and 1 GSL line due to poly2 parasitic RC.

REF: An initial voltage of Vdd of C1 at REF node will be pulled down slowly when ENm=Vdd. The discharge rate is controlled by the effective resistance of the mirrored current through MN1 gated by BIAS. After the predetermined 5 µs discharge time, the $V_{REF}$ is set to A Volt., which is optimized to be half of Vdd value as one common reference voltage for both COMP1 and COMP2. After that, ENBm returns Vdd to stop the further discharge of C1 to keep $V_{REF}$ at A Volt for a duration long enough (approximate 100 µs) for performing the subsequent operation of COMP1 and COMP2 during the pipeline and concurrent M-WL ABL program or ABL-like or HBL read operations.

PREB: Before turning on discharge paths of C1, C2, and C3, three pull-up PMOS devices of MP1, MP2, and MP3 of the three current-mirrored circuits have to be shut off first by setting PREB=Vdd to prevent the DC leakage current to affect the initial Vdd voltage and final $V_{REF}$ at A Volt for accurate delay control.

EN5US: A one-shot pulse of EN5US is generated upon the rising edge of ENBm. This one-shot pulse is used to set one selected latch for resetting PREB=Vdd to disable the PMOS load devices as mentioned above.

ENSm: One-shot pulse of ENSm is generated upon detecting the falling edge of ENBm. Again, this one-shot pulse is used to reset the selected latch for resetting ENBm back to Vdd to terminate the precharge operation of one set of WLs, SSL, and GSL and then lock the precharged program voltages of Vpgm, Vpass, Vread, and Vss for staring one-pulse of self-timed SLC program with Tpgm=100 µs and Vpgm=20V.

IN1: Upon receiving the one-shot pulse of ENS, a second input of COMP1 from IN1 node of C2 capacitor starts discharging because EN1 is enabled by setting EN1 node to Vdd. In this example, C2=C1 but MN3 resistance is designed to be 20×MN1 by decreasing W/L ratio by 20-fold, thus the delay of 100 µs aligned to 5 µs of control signal ENB is achieved when $V_{IN1}$=A Volt as C1. The output of COMP1 will be flipped because the $V_{IN1}<V_{REF}$ after 100 µs being detected.

US100: This means the delay of 100 µs aligned to the known 5 µs delay of ENB controlled by on-chip state-machine. When the differential amplifier COMP1 detects $V_{IN1}$ voltage below A Volt, a one-shot pulse of US 100 is generated to initiate another shorter pulse with duration of around 2.5 µs to control a turn-on time and discharge HVs to Vss in the selected set of 128 WLs, SSL, and GSL gate lines to prevent over-program and remove HV stresses of Vpgm, Vpass, and Vread.

IN2: An initial precharged Vdd is discharged by a pulse of 2.5 µs that is generated upon completion of 100 µs SLC pipeline program without verify as explained in above. Upon detecting $V_{IN2}$=A Volt, then US2P5 is the pulse of 2.5 µs.

US2P5: A one-shot pulse of US2P5 is generated when $V_{IN2}$ voltage is discharged below A Volt as aligned to 5 µs ENB pulse. Since 2.5 µs is half of 5 µs, thus the W/L ratio of transistor MN5 is 2 times of that of transistor MN1 to reduce the mirrored resistance in half.

RES: A one-shot reset signal is generated upon detecting the pulse US2P5 to reset IN2, IN1, and REF to Vdd but set PREB and EN2 to Vss.

Figure 12:
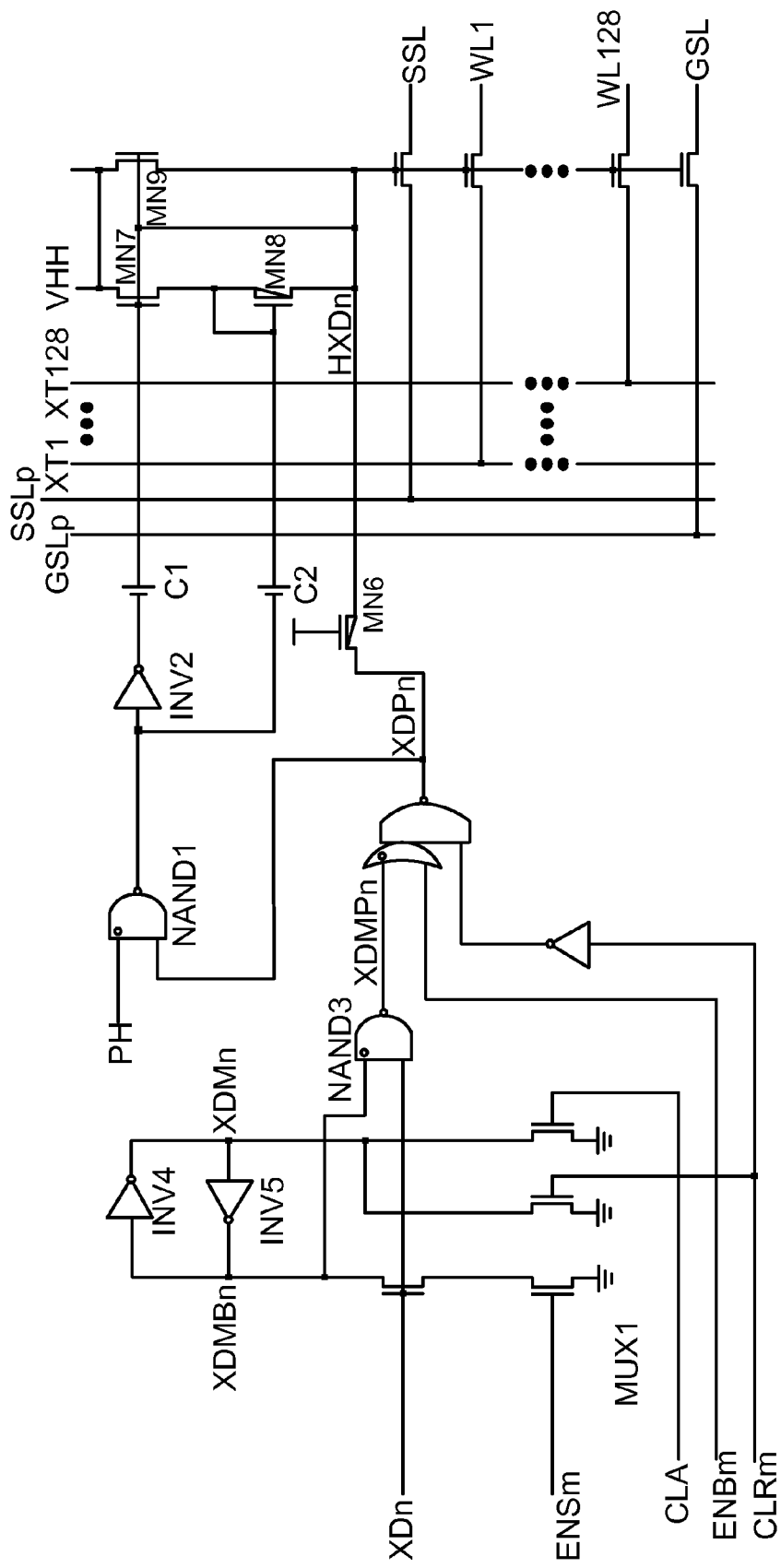
FIG. 12 is a circuit diagram showing details of implementation of a block-decoder with a latch to allow enabling and disabling the pipeline and concurrent SLC program in FIG. 9 according to a specific embodiment of the present invention.

FIG. 12 is a circuit diagram showing details of implementation of a block-decoder in FIG. 9 according to a specific embodiment of the present invention. This diagram is merely an example, which should not unduly limit the scope of the claims. One of ordinary skill in the art would recognize many variations, alternatives, and modifications. As shown, the block-decoder includes an input XDn, which is the output of a Pre-decoder and can only be enabled when a Latch status signal XDMBn=Vdd. The Latch includes both invertors INV4 and INV5. The above Latch is used to determine if the addressed block-decoder is selected or not selected for this preferred pipeline SLC program and read.

In an embodiment, all Latches of all block-decoders are reset by a global one-shot Vdd pulse signal CLA to set all XDMn=Vss and then all XDMBn=Vdd. This global one-shot pulse signal CLA can be generated upon detecting power-up or a chip-enable signal of each NAND chip. When a block decoder is selected by the addressed XDn, then XDn=Vdd with one-shot pulse of ENSm=Vdd to set XDMBn=Vss to record the selection and to differentiate the selected blocks from the non-selected ones. Therefore, when XDMBn=Vss, at least some of all block-decoders are selected for performing the preferred pipeline and concurrent SLC program and read operations.

When CLRm signal is set to Vss and ENBm is given an one-shot pulse Vdd, then XDPn=Vdd to enable the PH clock into a local VHH pump circuit to make HXDn for program voltage Vpp=Vpgm+Vt so that whole set of HVs of GSLp, XT1-XT128, and SSLp are connected without voltage drop to corresponding selected set of SSL, WL1-WL128, and GSL with their respective predetermined program voltages.

The precharge time of above WLs, SSL, and GSL lines is about 5 µs to fully reach Vpgm, Vpass, Vread, and Vss as explained above. This 5 µs duration is not a reference delay. 5 µs is generated and controlled by the on-chip state-machine that involves an n-bit counter and oscillator with stable frequency.

When a pipeline command is received, M WL addresses and SLC data will be sequentially received and forwarded to respective M Latches of M blocks in M LGs. Only one block in each LG can be selected for this self-timed pipeline operation to avoid data contention in each $C_{LG}$, regardless of SLC program or SLC read or SLC erase-verify or program-verify for dummy cells or regular cells in necessary and regardless of 2D or 3D types of NAND structures.

Those local HV pump circuits will be disabled when they are not selected with corresponding Latch status signal XDMBn=Vss. The non-selected XDPn=HXDn=Vss to disconnect the non-selected sets of 1 GSL, 128 WLs, and 1 SSL from corresponding common lines of GSLp, XT1-XT128, and SSLp so that other pipeline or concurrent operations can also be performed.

In an embodiment, the block-decoder provides a non-self-timed voltage charge of Vpgm, Vpass, Vread, and Vss voltages to the selected sets of 128 WLs, 1 GSL, and 1 SSL lines before the pipeline SLC program is started by an ENB pulse of ~5 µs controlled by the on-chip state-machine. Additionally, the block-decoder provides a self-timed (Tpgm=100 µs) program voltage locking on each selected set poly2 parasitic capacitor lines of SSL, GSL, and WL1-WL128 during one-shot pulse of Vpgm=20V. Furthermore, the block-decoder provides a self-timed (Tdischarge~2.5 ns) discharge of the HV remained in each selected set poly2 parasitic capacitor lines of SSL, GSL, and WL1-WL128 during the one-shot pulse of Vpgm=20V when SLC program is completed automatically.

FIG. 13A shows control voltages and varied one-shot waveforms of varied control signals in each block-decoder according to an embodiment of the present invention. This diagram is merely an example, which should not unduly limit the scope of the claims. One of ordinary skill in the art would recognize many variations, alternatives, and modifications. As shown, a table summarizes control voltages and/or one-shot waveforms of varied control signals in different modes of each block-decoder of the present invention. These control signals include CLA, CLRm, PH (clock signal), ENSm, ENBm, XDPn, XDMn, XDMBn, XDn, XDMPn, HXDn, CSLp, XT1-XT128, VHH, SSL, WL1 to WL128, and CSL with reference to FIG. 12.

In a Clear-All mode of the block-decoder, the corresponding control signals are biased for clearing all the latches in all block-decoders, by setting CLA=1 (here, 1=Vdd) to force XDMn=Vss (0=Vss) and XDMBn=1 to enable input signal path to XDMPn. Other signals are "don't-care".

In an individual latch mode of the block-decoder, the bias conditions of various control signals for a selected block include: XDn=Vdd and XDMBn=Vdd, thus XDMPn=Vss. Additionally, with ENBn being given an one-shot of Vss and CLA=Vss and CLRn=0, thus XDPn=HXDn=Vdd to enable PH signal of a clock into local VHH pump. As a result, HXDn≥VHH to connect the voltages of one selected set of 1 SSL, WL1-WL128, and 1 GSL gate lines to one set of common signals of 1 GSLp, XT1-XT64, and 1 SSLp without a voltage drop. In an embodiment, one-shot pulse ENBn is used to control the turn-on time of HXDn. In this preferred pipeline SLC program without verify, the one-shot pulse width of ENBn is 5 μs, which is a required duration to charge a selected pulse voltage Vpgm on WL up to 20V, to keep 127 non-selected WLs with Vpass to 10V, and to maintain one SSL at Vread to reduce the resistance and GSL=Vss to prevent NAND string leakage to CSL. The one-shot pulse ENBn will generate one-shot pulse of XDPn and one-shot pulse of HXDn with a reverse polarity.

The bias conditions of various control signals for unselected blocks include: XDn=Vss and XDMBn=Vdd, thus XDMPn=Vdd to disable the one-shot pulse of ENBn. Additionally, with ENBn being given an one-shot of Vss and CLA=Vss and CLRn=0, thus XDPn=HXDn=Vss to disable PH signal of the clock into local VHH pump and disconnect one set of 1 SSL, WL1-WL128, and 1 GSL gate lines from one set of common signals of 1 GSLp, XT1-XT64, and 1 SSLp.

The bias conditions of various control signals for self-timed Lock include: XDn=Vdd and XDMBn=Vdd and changes to Vss, thus XDMPn=Vss and changes to Vdd. Additionally, with ENBn being given a one-shot of Vss and CLA=Vss and CLRn=0, thus XDPn=HXDn=Vdd to enable PH signal of clock into local VHH pump. As a result, HXDn≥VHH to connect the voltages of one selected set of 1 SSL, WL1-WL128, and 1 GSL gate lines to one set of common signals of 1 GSLp, XT1-XT64, 1 SSLp without a voltage drop. In an embodiment, one-shot pulse ENBn is used to control the turn-on time of HXDn. In this preferred pipeline SLC program without verify, the ENBn one-pulse width is 5 μs, which is a required duration to charge the selected one-pulse WL voltage of Vpgm=20V, 127 non-selected WLs with Vpass=10V, one SSL=Vread to reduce the resistance and GSL=Vss to prevent the NAND string leakage to CSL. Note, one-shot pulse of ENBn will generate one-shot pulse of XDPn and one-shot pulse of HXDn with a reverse polarity.

The bias conditions of various control signals for unselect blocks: XDn=Vss and XDMBn=Vdd, thus XDMPn=Vdd to disable the one-shot pulse of ENBn. Additionally, with ENBn is provided with one-shot pulse of Vss and CLA=Vss and CLRn=0, thus XDPn=HXDn is set to Vss to disable PH signal sent into local VHH pump for disconnecting one set of 1 SSL, WL1-WL128, 1 GSL from one set of common signals of 1 GSLp.

Figure 13B:
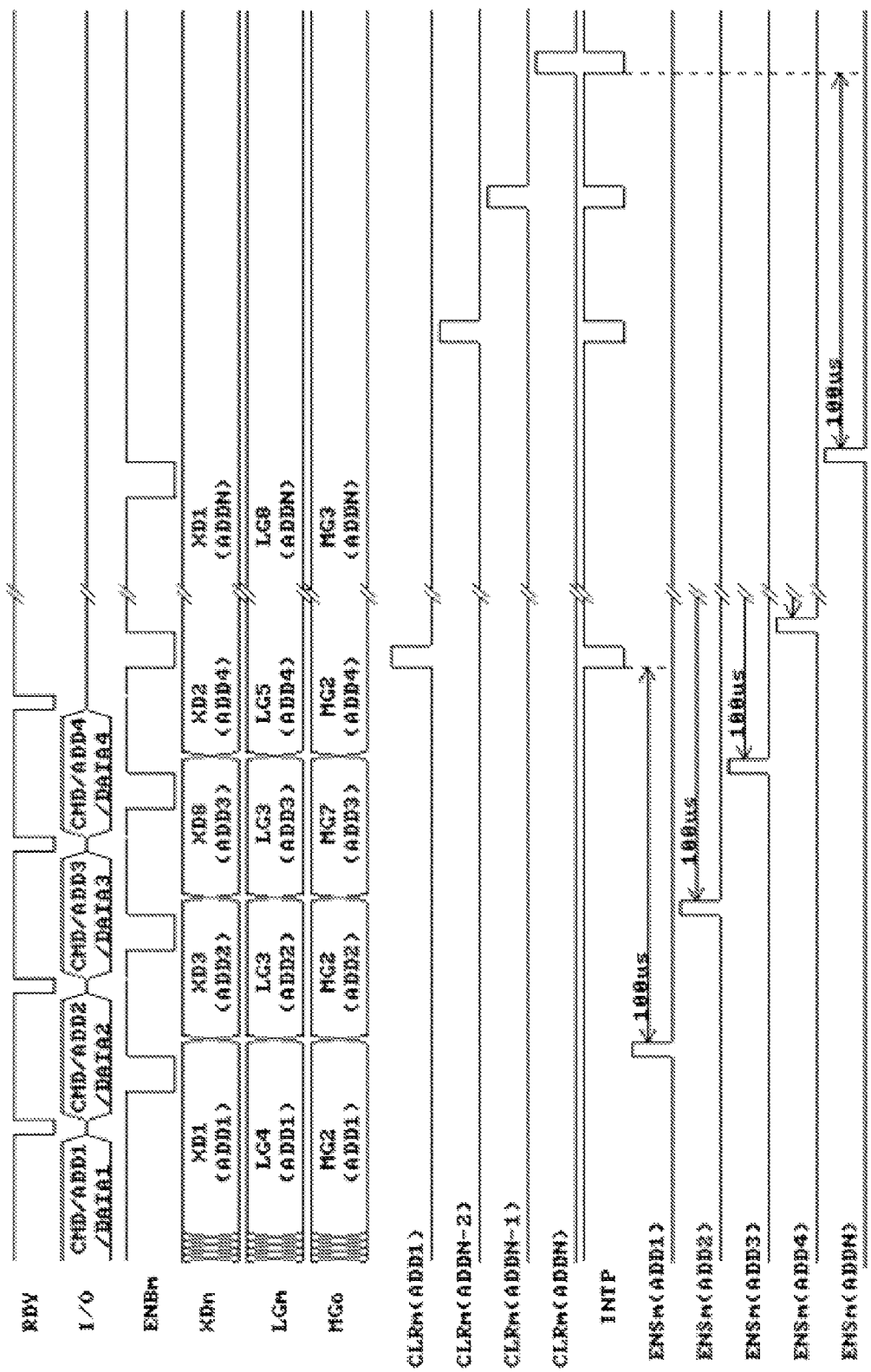
FIG. 13B shows control voltages and timing waveforms of varied control signals in each block-decoder along with varied control signals according to an embodiment of the present invention.

FIG. 13B shows control voltages and timing waveforms of varied control signals in each block-decoder along with varied control signals according to an embodiment of the present invention. This diagram is merely an example, which should not unduly limit the scope of the claims. One of ordinary skill in the art would recognize many variations, alternatives, and modifications. As shown, detailed control voltages and timing waveforms of varied control signals in each block-decoder along with varied control signals in this preferred hierarchical-BL block-decoders such as RDY, I/O, ENBm, XDn, LGm, and MGo are provided for performing the preferred multiple-WL pipeline SLC program operation of the present invention.

RDY is a Ready signal, which is pulled down with a predetermined duration to indicate that the selected NAND status is in a busy state internally. As seen in FIG. 13B, after receiving the pipeline Command, each address and one program page data are divided into 2 sector data, then NAND starts an ABL SLC pipeline program on one addressed WL 8 KB cells.

I/O includes byte-based pins for all Commands, page address, and data received by NAND. For this preferred pipeline SLC program without verify, multiple WL addresses and page data are sequentially loaded and locked in the selected DCRs. In the specification, a Byte-based I/O (8-bit) is used as an example. In fact, Word-based 16 I/Os can also be used for this pipeline SLC program with a double I/O speed.

ENBm is a signal generated by ENB signal and LGm select signal for the selected block-decoder group as seen in FIG. 9. In other words, only the selected LGm=Vdd, then the global signal of ENB will make ENBm=ENB. For those non-selected LGm=0, then ENBm=Vss. A duration of about 5 μs is used for precharging the selected set of 1 SSL, WL1 to WL128, and GSL gate lines with Vpgm, Vpass, Vread, and Vss.

In an embodiment, there are random M WLs or pages with Add1, Add2, Add3, Add4, up to AddM to be flexibly selected for performing this preferred SLC pipeline program operation. Every set of 1 SSL, 128 WLs, and 1 GSL poly2 gate lines with parasitic capacitance of each selected page can be precharged with one pulse of the predetermined voltages of Vpgm, Vpass, Vread, and Vss set by the ENBm signal with duration of 5 μs. Only one block is selected in each LG for the preferred pipeline program at a time. Totally, there are M blocks are selected from M random LGs distributed in M random MGs in each NAND plane.

Referring to the example shown in FIG. 13B, it shows that a first block of XD1 is selected in a fourth LG (LG4) in a second MG (MG2) initiated by ENSm(Add1) first with a self-timed Tpgm=100 μs, followed by a third block (XD3) of a third LG (LG3) in a second MG (MG2) initiated with ENSm(Add2) of another Tpgm=100 μs. Next, an eighth block (XD8) of a third LG (LG3) within a seventh MG (MG7) is initiated with an ENSm(Add3) of another Tpgm=100 μs, followed by a second block (XD2) in a third LG (LG3) within a seventh MG (MG7) initiated with ENSm(Add4) of another Tpgm=100 μs. Lastly a first block of XD1 of an eighth LG (LG8) within a third MG3 is initiated with an ENSm(AddN) of another Tpgm=100 μs to complete the whole pipeline program.

As seen in FIG. 10, whenever one selected WL finishes a SLC program without verify, it will generate a interrupt one-shot signal of INTP to inform the completion of SLC program on one page. Simultaneously, an one-shot signal of CLRn is also generated to discharge each corresponding set of HVs of Vpgm, Vpass, and Vread to Vss in corresponding 128 WLs, 1 SSL, and 1GSl gate lines and then lock them into floating Vss state for each block that completes the SLC program.

Figure 14:
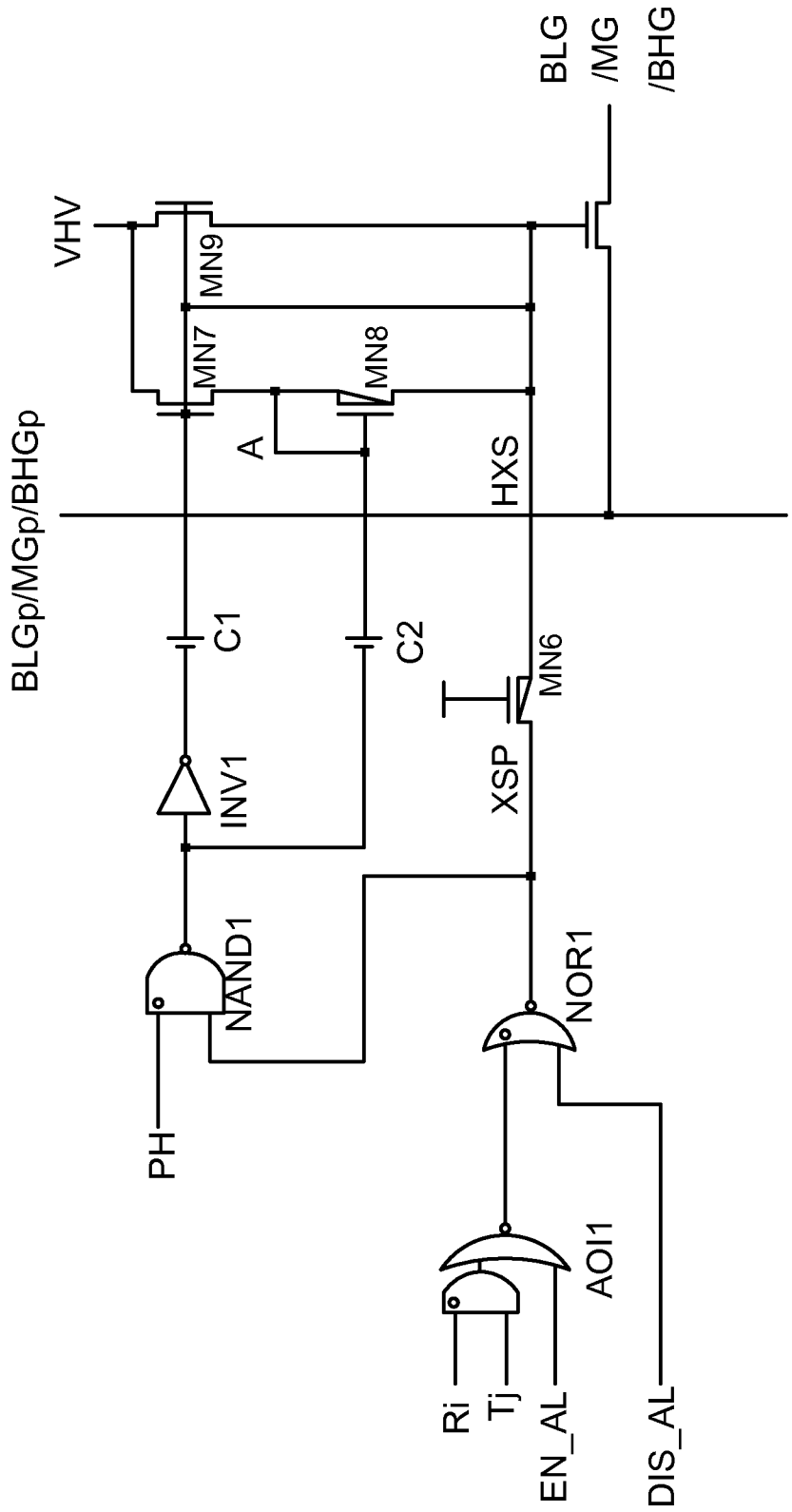
FIG. 14 is a circuit diagram of a decoder for group-dividers implemented for the hierarchical-BL NAND array according to an embodiment of the present invention.

FIG. 14 is a circuit diagram of group-decoders for group dividers implemented for the hierarchical-BL NAND array according to an embodiment of the present invention. This diagram is merely an example, which should not unduly limit the scope of the claims. One of ordinary skill in the art would recognize many variations, alternatives, and modifications. As shown, a common decoder circuit is provided for generating group-divider control signals BLG, MG, and BHG for the preferred hierarchical-BL NAND arrays, regardless of 2D or 3D types of NAND structure.

The common group decoder includes two inputs of Ri and Tj, one enable input signal of EN_AL, and one disable input signal of DIS_AL, where Ri and Tj are outputs of two pre-decoder inputs of the block-decoder (FIG. 12). The selection of this decoder can only be done when EN_AL=Vss and DIS_AL=Vss with the matched Ri and Tj addresses to set XSP node to Vdd to connect PH signal to the local VHP pump so that the only one input of BLGp/MGp/BHGp can be connected to corresponding single output of BLG/MG/BHG without any voltage drop. Note, the BLG, MG, and BHG signals are used for turning on or off the selected broken LBL and broken GBL divider devices of the preferred hierarchical-BL NAND array to perform ABL SLC pipeline and concurrent program operations.

In an embodiment, the control voltage required for BLG, MG, and BHG is set to be VHV which allows each $V_{LBL}$ or $V_{GBL}$ voltage up to Vinh (~7V) to be fully passed without a drop to each SA in each PRB after a charge-sharing operation for a more reliable DRAM-like SLC read operation. When DIS_AL=Vdd, it will force XSP=0V to disable corresponding local VHV pump circuit so that HXS node becomes Vss to disconnect BLG/MG/BHG lines from a common line of BLGp, MGp, and BHGp. In this manner, the localized SLC program or LBL precharged voltage, or sensed cell data, or SLC page program data can be locked for a self-timed operation without being interrupted.

Figure 15:
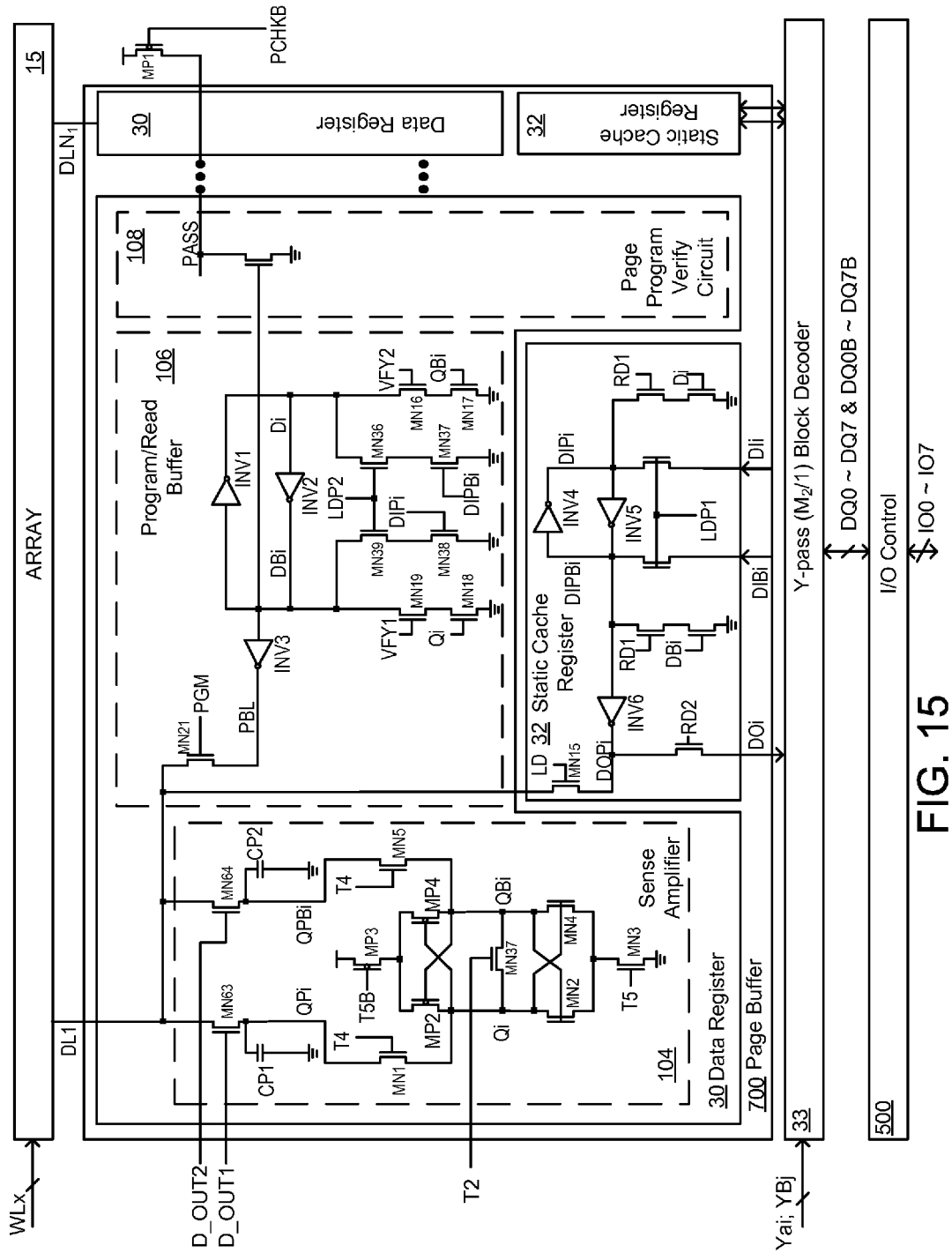
FIG. 15 is a circuit diagram of a preferred page buffer with 4 KB size per half (Odd/Even) page of a dynamic CACHE register (DCR) according to an embodiment of the present invention.

FIG. 15 is a circuit diagram of a preferred page buffer with 4 KB size per one sector (Odd or Even) of a whole physical page of a dynamic CACHE register (DCR) according to an embodiment of the present invention. This diagram is merely an example, which should not unduly limit the scope of the claims. One of ordinary skill in the art would recognize many variations, alternatives, and modifications. As shown, a preferred page buffer circuit optimized to be 4 KB size per sector of a whole physical 8 KB page is provided as an example for performing pipeline SLC operation under the preferred hierarchical-BL NAND array of the present invention. In an embodiment, the PB circuit 700 with 4 KB sector-size includes a DRAM-like clocked Latch-type sense amplifier (SA) 104. From a circuit perspective, this preferred SA 104 includes two inputs of Qi and QBi being combined into one input DL1 through two separate control paths and one buffer comprised of two capacitor-based nodes QPi and QPBi with two separate corresponding capacitors of CP1 and CP2. These two separate paths of Qi and QBi are controlled by a first signal D_OUT1 and a second signal D_OUT2 respectively and by a third signal T4. Each input DL1 per bit line is connected to each $C_{LBL}$ in each DCR bit via each corresponding GBL line in NAND array 15.

In an embodiment, the DRAM-like clocked SA 104 is used with only one combined input via two separate paths as each SLC cell sensed bit data or reference bit data are arranged from a single $C_{MG}$ with same physical location in each corresponding DCR bit for a 100% tracking in total $C_{MG}+C_{HG}$ capacitance for a superior differentiation of the SLC data without error. Each sensed SLC bit data voltage is either Vinh or Vss after conversion in accordance with each SLC bit data and is temporarily stored in each corresponding larger $C_{MG}$ capacitor of each SCR bit before connecting to a GBL like a DRAM cell capacitor. When an ABL read operation is performed in one addressed WL of 8 KB cells in the selected block, each stored Vinh or Vss in each $C_{MG}$ will be performed a charge-sharing operation between each $C_{MG}$ and one or more $C_{HG}$s along the path connected to a SA. As a result, the sensed signal will be diluted from Vinh to Vinh/N' or Vinh−ΔV and the bit data is degraded, where N' is the diluted factor depending on ratio of $C_{MG}/C_{HG}$S. When delay is sufficient, then ΔV is Vinh, thus Vinh−ΔV=Vss for a stronger and superior CS differential signals. Thus, one input of the sensed bit data and one input of the tracking reference bit data from NAND array of the same block from the same $C_{LG}$, $C_{MG}$, and $C_{HG}$ are required to ensure that the read SLC data can be reliably distinguished.

In an embodiment, based on the preferred design of SA 104, each diluted SLC sensed bit data of either Vinh/N' or Vss from each corresponding $C_{MG}$ and $C_{LBL}$ of each SCR bit is forwarded via DL1 into CP1 capacitor and then locked therein by applying an one-shot signal of D_OUT1 to a gate of NMOS device MN63 with T4 node at 0V to isolate Qi node from QPi node of SA 104. Additionally, each identically diluted reference bit data of Vinh/2N' from same corresponding $C_{MG}$ and $C_{LBL}$ with a signal dilution is forwarded via same DL1 into CP2 capacitor and then locked therein by applying an one-shot signal of D_OUT2 into a gate of NMOS device MN64 with T4 node at 0V to isolate QPBi node from QBi node of SA 104. After the above two sensing data forward/lock steps, CP1 capacitor stores voltage of either VCP1=Vinh/N' or Vss and CP2 capacitor stores voltage of VCP2=Vinh/2N'.

In another embodiment, at T2 node, the SA's Qi and QBi are equalized first by turning on MN37 with T2=Vdd. Then, at T4 node, the paired sensed data voltages at QPi node and QPBi node are then transferred concurrently to Qi node and QBi node respectively by applying a one-shot T4 signal on MN1 and MN5 transistors. Then T5 node and T5B node are enabled to turn on MN3 device and MP3 device to amplify the analog signal difference between Qi node and QBi node. As a result, a final full digital signal of either Vdd or Vss will be developed at output nodes of Qi and QBi in accordance with the following conditions: 1) Qi=Vdd if initial Qi=Vinh/N'>QBi=Vinh/2N'; 2) Qi=Vss if initial Qi=Vss<QBi=Vinh/2N'.

In yet another embodiment, based on the preferred design of SA 104, each time the selected 4 KB sector data out of 8 KB ABL sensed bit data from a $C_{MG}$ would be loaded via DL1 through $DLN_1$ and locked into corresponding 4 KB CP1 capacitors, and then the diluted 4 KB reference-bit data from a same $C_{MG}$ would be loaded via DL1 through $DLN_1$ and locked into corresponding 4 KB CP2 capacitors. After locking 4 KB SLC sensed data into CP1 capacitor, the voltages left in the signal paths of above $C_{LG}$, $C_{MG}$, and $C_{HG}$s are first reset to 0V through the selected LBLps precharge power line and then shut off to be floating at 0V. Simultaneously, the same 4 KB $C_{LG}$s associated 4 KB $C_{MG}$s are precharged with a Vinh/2 Next, the read out of each Vinh/2 reference voltage to each SA bit via $C_{HG}$ as above sensed reference bit data is performed again to allow tracking of Vinh/2N being locked into CP2 capacitor by setting D_OUT2 to Vdd.

In the embodiment, the PB circuit 700 additionally includes a Program and Read Buffer (PRB) circuit 106. This is a circuit with a latch made of two invertors INV1 and INV2 having two pairs of two complementary pull-down legs. A first leg includes a transistor MN19 gated by VFY1 connected in series to a transistor MN18 gated by Qi. A second complementary leg includes a transistor MN16 gated by VFY2 connected in series to a transistor MN17 gated by QBi. A third leg includes a transistor MN39 gated by LDP2 connected in series to a transistor MN38 gated by DIPi. A fourth complementary leg includes a transistor MN36 gated by LDP2 connected in series to a transistor MN37 gated by DIPBi. The PRB circuit 106 is configured for each stored digital bit data to be loaded into each corresponding DCR in NAND array using a driver of INV3 via DL1 and a transistor MN21 with a PGM gate control and setting LD node at 0V and both D_OUT1 and D_OUT2 at 0V.

In another embodiment, conversely, each PRB bit can receive a corresponding bit data from each SA 104 via its paired outputs of Qi and QBi on one paired gates of MN18 in the first leg and MN17 in the second leg. Furthermore, each PRB bit can also receive a corresponding bit data from each SCR 32 via its paired outputs of DIPi and DIPBi on one paired gates of MN38 in the third leg and MN37 in the fourth leg. Each PRB bit also acts as one monitor bit of dummy cell page program check. For Odd/Even 4 KB dummy cells SLC program verify per dummy WL, when all 8 KB Di are set to Vss, then PASS node is Vdd to inform the NAND chip that the SLC program-verify is passed. Similarly, it is also use for erase-verify check.

In yet another embodiment, this SLC pipeline program operation is performed without program-verify for the regular SLC cells. But erase-verify of all erased cells and program-verify for the Odd/Even dummy cells are required in the NAND array without common source line per block. Therefore, the first leg with MN19 tied to VFY1 and the second leg with MN16 tied to VFY2 are still required. In other words, this PRB circuit 106 can also be used when the SLC pipeline program-verify operation is performed. When there is no verification required, simply setting the VFY1 and VFY2 to 0V.

Further, the PB circuit 700 includes a program-verify circuit 108 per bit with a NOR-configured PASS line connected to a common PMOS-load MP1 with its gate tied to a control signal of PCHKB. In an embodiment, the program-verify circuit 108 is configured for a 4 KB PB, only 4 KB sector-based SLC program and SLC erase-verification are required. When all 4 KB bits pass the verify, then PASS is Vdd to inform the pass.

Furthermore, the PB circuit 700 includes a static CACHE register (SCR) circuit 32 with one end being connected to byte-based I/O pins and another end flexibly connected to either DL1 direct to NAND array via MN15 gated by LD or the PRB circuit 106 through paired pull-down devices. The SCR circuit 32 is configured to have each bit to receive and temporarily store each sector's program data from I/Os, to receive each transferred bit data from each corresponding PRB bit, and to transfer each bit data into each corresponding bit of DCR and locked therein.

Figure 16:
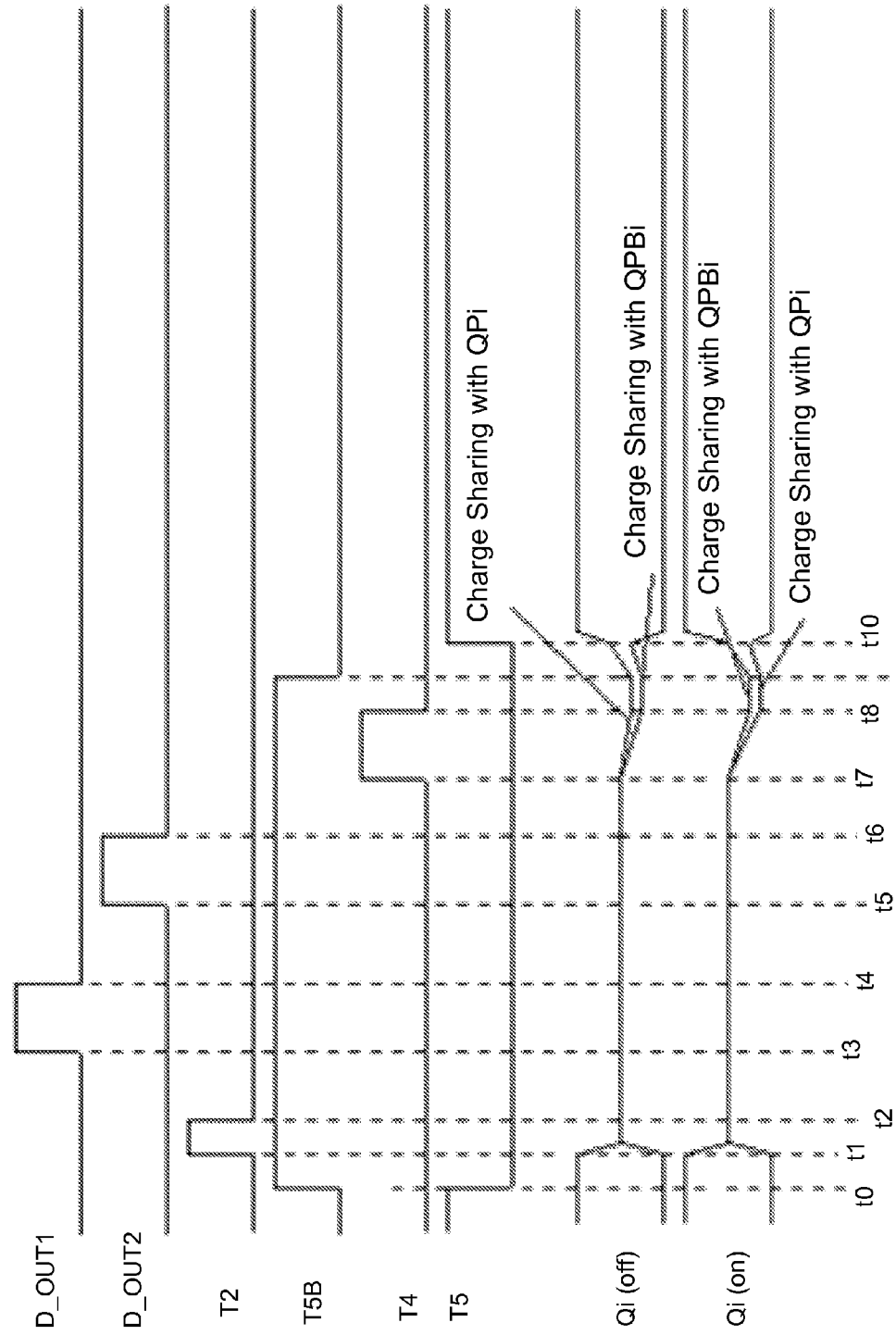
FIG. 16 is a diagram showing preferred timing waveforms of operating a DRAM-like sense amplifier according to an embodiment of the present invention.

FIG. 16 is a diagram showing preferred timing waveforms of operating a DRAM-like sense amplifier according to an embodiment of the present invention. This diagram is merely an example, which should not unduly limit the scope of the claims. One of ordinary skill in the art would recognize many variations, alternatives, and modifications. As shown, the operation of preferred DRAM-like SA is illustrated using several timing waveforms of key control signals following a time sequences from an initial time t0 to t10 and beyond. As seen in FIG. 15, the DRAM-like SA has two inputs with fully tracking parasitic LBL+GBL capacitance from the addressed and reference (m0/m1) $C_{LBL}$ lines via (m2) $C_{GBL}$ lines to allow a highly reliable SLC read signal which is diluted by CS operation from each sensed SLC cell Vts. The operation of the DRAM-like SA is performed on sector-based scheme to reduce the number of SA and SCR size from 8 KB to 4 KB for cost and area reduction. Further reduction to 2 KB SCR and 2 KB PRB can be achieved by reducing the GBL lines to 2 KB via a larger Y-pass circuit, with four MG gate signals such as $MG^1 1$, $MG^1 2$, $MG^1 3$, and $MG^1 4$ respectively controlling 4 Y-pass transistors of MMG1, MMG2, MMG3, and MMG4.

In an embodiment, the operation of DRAM-like SA starts from a t0 time period by setting T5 node to Vss but T5B node to Vdd. This is an initial step used to disable the SA so that both Qi node and QBi node are in high-impedance state. Additionally, the operation includes setting both D_OUT1 and D_OUT2 to Vss to disconnect two inputs of the SA from one common input of DL1. Further, the operation includes setting T2 node to 0V to disable an equalization step in the beginning so as to disconnect Qi node from QBi node of each SA.

In next time period t1, providing T2 node with a one-shot pulse until t2. This is to perform an equalization step between Qi node and QBi node. After T2 one-shot pulse, the voltage level at Qi node equals to QBi node at ½Vdd.

Next in t3-t4 period, D_OUT1 is provided with a one-shot pulse with D_OUT2 being kept at Vss. This is to latch each sensed SLC bit data from each corresponding $C_{LBL}$ of DCR bit. Each sensed bit data includes two voltages: Vinh/N' before CS if the cell is in a program state Vtp>VR, where N' is signal dilution factor due to a charge-sharing (CS) between $C_{LBL}$ and $C_{GBL}$(total); 2) (Vinh−ΔV)/N'. When delay is sufficient, then ΔV is Vinh, thus Vinh−ΔV=Vss for a stronger and superior CS differential signals Vss if cell is in an erase state Vte<VR.

Next in t5-t6 period, D_OUT2 is provided with a one-shot pulse with D_OUT1 being kept at Vss. This is to latch each reference SLC bit data from each corresponding $C_{LBL}$ of DCR bit as used by above sensed bit data. Only one reference voltage is generated from same $C_{LBL}$ preferably, which is Vref=Vinh/2N' by precharging the $C_{LBL}$ with a Vinh/2 from the selected LBLps precharge power line and performing a same CS operation to obtain the voltage Vinh/2N', which is set to be a reference level in the middle of two sensed voltages of Vinh/N' and Vss. Thus, the sensing margin ΔVread will be Vinh/2N'. In a specific embodiment, as long as ΔVread>50 mV, the SLC read can be very reliable.

Further in next t7-t8 period, the operation of SA includes providing T4 node a one-shot pulse with D_OUT1 and D_OUT2 being set to Vss. This is to transfer both sensed bit data of Vinh/N' or (Vinh−ΔV)/N' and reference bit data of (Vinh−ΔV/2)/N' respectively at CP1 capacitor and CP2 capacitor to Qi node and QBi node in one cycle with a tracking signal T4 and parasitic capacitances at both nodes of Qi and QBi. If not tracking, then more fine tuning of layout has to be made to ensure a full tracking.

Furthermore, in t9 period, the operation of SA includes switching T5B node to low with T5 node being set to Vss to start a first amplification of the two sensed bit data stored in Qi node and QBi node with initial small voltage difference of Vinh/2N'.

Moreover, in t10 period, T5 node is switched to Vdd with T5B being set to Vss to start a second amplification of the first amplification of the sensed bit data stored in Qi node and QBi node. After t10, the sensed SLC bit data will be fully developed into a full digital Vdd or Vss at Qi and QBi nodes: Qi=Vdd and QBi=Vss if the cell is in a program state Vt=Vtp; Qi=Vss and QBi=Vdd if the cell is in an erase state Vt=Vte.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A NAND memory chip configured for pipeline/concurrent All-BL (ABL) SLC program without program-verify and ABL-like SLC read operations, the NAND memory chip comprising:
a NAND array comprising J numbers of HG groups arranged in a bitline (BL) direction, each HG group including L numbers of MG groups, each MG group including J' numbers of LG groups, each LG group including H numbers of blocks, each block including N numbers of strings cascaded one another in a wordline (WL) direction orthogonal to the BL-direction, each string comprising K numbers of NAND memory cells capped by a pair of string-select transistors respectively at two ends of the string having its source node connected to a common source line laid in the WL-direction, wherein N, J, L, J', H, and K are integers of 2 and greater based on memory chip design;
a two-level BL hierarchical structure comprising N/2 first metal lines laid at a first level as global bit lines (GBLs) in the BL-direction through the NAND array and broken by J−1 rows of N/2 GBL-dividers forming a set of N/2 broken-GBLs associated with one of J HG groups, and comprising N second metal lines laid below the first level as local bit lines (LBLs) in the BL-direction through each MG group forming one page of N-bit on-chip capacitors $C_{MG}$s, each pair of Odd and Even LBLs being connected to one GBL via a 2-to-1 MG-Ypass device, each of the N LBLs being divided to J' pages of N broken-LBLs by J'−1 rows of N LBL-dividers, each page of N broken-LBLs being associated with a LG group as one page of N-bit parasitic capacitors $C_{LG}$s and respectively connecting to drain nodes of N strings of each block of the LG group wherein N/2 Odd-numbered broken-LBLs and N/2 Even-numbered broken-LBLs are commonly connected to a precharge power line respectively via N/2 Odd-precharger devices and N/2 Even-precharger devices for charging a medium-high voltage Vinh of about 7V or lower or discharging to ground or other small voltages;
a plurality of group-decoders including BHG-DEC, MG-DEC, BLG-DEC, and LG-based precharge power line decoder for providing respective gate control signals;
a row-decoder control circuit including a plurality of LG-based row-decoders, each LG-based row-decoder including a time control unit and H block-decoders, each block-decoder being configured to provide line control signals for K WLs of NAND cells and a pair of gate lines of string-select transistors per block;
a peripheral system comprising a data communication group and a command control group, the data communication group including a N/2-bit page buffer circuit coupled between the N/2 GBLs and I/Os for program data loading and read data sensing, the command control group including a command interface, a state-machine circuit, an address register circuit, and a voltage generator for receiving/transmitting external control signals, controlling I/Os to operate the page buffer operated with a low Vdd operating voltage, and generating various required high, medium, and analog low voltages and address information for the row-decoder control circuit and the plurality of group-decoders to set desired bias conditions for performing multi-WLs pipeline/concurrent ABL SLC program without program-verify and ABL-like read operation with substantial reduction in operation latency.

2. The NAND memory chip of claim 1 wherein the N is number of bits per physical page selected from 4 KB, 8 KB, 16 KB or other suitable integers; J is selected from 8, 16, or other suitable integer smaller than 16; L is an integer selected from 4, 8, 16 or other suitable integer smaller than 16; J' is selected from 4, 8, or other suitable integer smaller than 8; H is selected from 4, 8, 16; and K is selected from 8, 16, 32, 64, 128, 256 or other suitable integer smaller than 256.

3. The NAND memory chip of claim 1 wherein each of the plurality of NAND memory transistors is either a transistor selected from 1-poly charge-trapping SONOS type and 2-poly floating gate type, with non-volatile design selected from either PMOS or NMOS NAND, 2T Flotox-based EEPROM, NAND-based NOR, and NAND-based Flash, based on a manufacturing technology selected from 2D type and 3D type, PMOS or NMOS NAND cell and flash technology types.

4. The NAND memory chip of claim 1 wherein each of the pair of string-select transistors, the GBL-dividers, the LBL-dividers, and the Odd- and Even-precharger devices is a 1-poly NMOS transistor with preferred source-drain breakdown voltage (BVDS)≥Vinh.

5. The NAND memory chip of claim 1 wherein the time control unit comprises a self-timed delay control circuit configured to be shared by the H block-decoders and be turned on by receiving LG-select signal for generating several derivative delays to corresponding output control signals to drive a selected one of the H block-decoders based on one known-delay controlled by one input pulse of ENB signal and three other POR, BIAS, and SET input signals from the state-machine circuit.

6. The NAND memory chip of claim 5 wherein the self-timed delay control circuit comprising two differential amplifiers having a common reference input coupled a first capacitor at two positive nodes and two separate inputs respectively coupled a second capacitor and third capacitor to two negative nodes, the common reference input being tuned using one known-duration ENB signal provided by the state-machine to discharge from its initial precharged Vdd to a final Vref through a discharge of the first capacitor, the second capacitor, and the third capacitor controlled by three constant current mirror circuits with their common gates connected to the BIAS signal.

7. The NAND memory chip of claim 6 wherein the self-timed delay control circuit further comprising multiple latch circuits, each being made by a pair of NOR devices, combined with multiple one-shot pulse generator circuits for providing controlled delays including program time span with respect to a known duration of a discharge time of 5 µs from Vdd to the final Vref.

8. The NAND memory chip of claim 1 wherein the N/2 bit page buffer circuit comprises a data register per bit including a sense amplifier, a program/read buffer, and a page program-verify circuit, and a N/2-bit static cache register circuit, the sense amplifier being a DRAM-like clocked differential amplifier configured, for performing a pipeline SLC read operation on a selected WL of a selected block in a MG, to have its first node coupled to one of N GBLs to receive a first voltage sensed from an 1-bit SLC data with a converted voltage of Vinh or Vss in a NAND cell of the selected WL of the MG and alternatively to have its second node coupled to the same one GBL to receive a second voltage of 1-bit reference data from a parasitic capacitor $C_{MG}$ of the same MG precharged to Vinh−ΔV/2 after passing the first voltage to the first node, the second voltage being substantially full tracking of the first voltage.

9. The NAND memory chip of claim 8 wherein the first voltage is Vinh/N' or Vss after a charge-sharing operation to dilute the converted voltage Vinh by a factor N' determined by a ratio of LBL length of the MG and total length of one or more GBLs involved for the charge-sharing operation and the second voltage is (Vinh−ΔV/2)/N', making ΔV/2N' as a differential signal of the sense amplifier.

10. The NAND memory chip of claim 8 wherein the ΔV is a design variable depending on a minimum detectable differential signal value of the sense amplifier and is determined by total number J of HG groups in the NAND array, location of the selected HG group within the J HG groups relative to the sense amplifier, and a sequential number of the selected WL among multiple WLs in the pipeline, such that the second voltage is a reference voltage at a middle level between a first level of Vinh/N' and a minimum detectable second level below the first level.

11. The NAND memory chip of claim 1 wherein the N numbers of second metal lines comprise N/2 Odd-numbered LBLs laid at a second level below the first level and N/2 Even-numbered LBLs laid at a third level below the second level or vise versa, the N/2 Odd/Even-numbered LBLs being interleaved with remaining N/2 Even/Odd-numbered second metal lines at the third/second level that are electrically grounded and fully isolated from the N/2 Odd/Even-numbered LBLs to provide substantially full shielding of AC coupling effect between LBL-LBL.

12. The NAND memory chip of claim 1 wherein the BHG-DEC is one of the plurality of group-decoders configured to provide self-timed BHG signals to selectively turn on one or more rows of GBL-dividers for connecting corresponding two or more adjacent broken-GBLs associated respectively with two or more HG groups among the total J HG groups in the NAND array; the MG-DEC is one of the plurality of group-decoders configured to provide self-timed MG1 and MG2 signals to selectively turn on two transistors in a 2-to-1 MG-Ypass device for connecting the N LBLs in a selected MG group to N/2 broken-GBLs in a HG group; the BLG-DEC is one of the plurality of group-decoders configured to provide self-timed BLG signals to selectively turn on one or more rows of LBL-dividers for connecting corresponding two or more adjacent broken-LBLs associated respectively with two or more LG groups among the L LG groups within a selected MG group, and LG-based precharge power line decoder is configured to provide two self-timed PREo and PREe signals to control independent and concurrent precharging all or half LBLs in precharge cycle or concurrent discharging after the precharge or charge-sharing cycle.

13. The NAND memory chip of claim 1 wherein one page of N-bit parasitic capacitors $C_{LG}$s is configured to be a $C_{LG}$-based one page Dynamic CACHE Register (DCR) to allow temporary storage of N-bit of analog or digital voltage data or precharged program-inhibit voltages without taking extra silicon area outside the NAND array in the peripheral area for performing pipeline/concurrent ABL SLC program operation.

14. The NAND memory chip of claim 1 wherein one page of N-bit parasitic capacitors $C_{MG}$s is configured to be a $C_{MG}$-based one page DCR to allow temporary of N-bit of sensed analog data from N-bit NAND cells or precharged $V_{LBL}$ voltages without taking extra silicon area outside the NAND array in the peripheral area for performing pipeline/concurrent ABL-like SLC read operation.

15. The NAND memory chip of claim 1 wherein the multi-WLs pipeline/concurrent ABL SLC program without program-verify comprises an operation for one selected WL in a selected block in a selected LG group in a selected HG group starting from
  receiving Command and address;
  dividing a N-bit SLC page data into a first N/2-bit half-page SLC data and a second N/2-bit half-page SLC data;
  setting the first N/2-bit half-page SLC data from a flash controller sequentially and synchronously clocked into a N/2-bit SCR via a byte-based I/O in N/2 clocks;
  selecting a first Odd-numbered N/2-bit capacitors $C_{LG}$s as a first half-page DCR for precharging with the Vinh voltage, the first half-page DCR being associated with a LG group containing a selected block containing all Odd-numbered cells in the selected WL;
  transferring the first N/2-bit half-page SLC data from the N/2-bit SCR to a N/2-bit PB;
  releasing the N/2-bit SCR to receive continuous loading of a second N/2-bit half-page SLC data from the I/O;
  connecting the first N/2-bit half-page SLC data in N/2-bit PB to N/2 GBLs while disconnected from the first half-page DCR;
  connecting the N/2 GBLs and the first half-page DCR in parallel to start voltage conversion within N/2 Odd-numbered LBLs associated with the first half-page DCR from all initial Vinh voltage is every Odd-numbered LBL to a patterned Vinh/Vss in accordance with a pattern of Vdd/Vss of the first N/2-bit half-page SLC data;
  disconnecting the N/2 GBLs from both the N/2-bit PB and the first half-page DCR to release the N/2 GBLs for loading and converting a second N/2-bit half-page SLC data.

16. The NAND memory chip of claim 15 wherein the multi-WLs pipeline/concurrent ABL SLC program without program-verify comprises a continued operation for the selected WL by
  setting the second N/2-bit half-page SLC data from the flash controller sequentially and synchronously clocked into the N/2-bit SCR via the byte-based I/O in N/2 clocks;
  selecting a second Odd-numbered N/2-bit capacitors $C_{LG}$s as a first half-page DCR for precharging with the Vinh voltage, the second half-page DCR being associated with the same LG group of the first half-page DCR containing a selected block containing all Even-numbered cells in the selected WL;

transferring the second N/2-bit half-page SLC data from the N/2-bit SCR to the N/2-bit PB;

releasing the N/2-bit SCR to receive continuous loading of a next page SLC data from the I/O;

connecting the second N/2-bit half-page SLC data in N/2-bit PB to N/2 GBLs while disconnected from the second half-page DCR;

connecting the N/2 GBLs and the second half-page DCR in parallel to start voltage conversion within N/2 Even-numbered LBLs associated with the second half-page DCR from all initial Vinh voltage is every Even-numbered LBL to a patterned Vinh/Vss in accordance with a pattern of Vdd/Vss of the second N/2-bit half-page SLC data;

disconnecting the N/2 GBLs from both the N/2-bit PB and the second half-page DCR to release the N/2 GBLs for loading next page.

17. The NAND memory chip of claim 16 wherein the multi-WLs pipeline/concurrent ABL SLC program without program-verify comprises an pipeline operation for a first selected WL in a first selected block in a first selected LG group in a HG group and a second selected WL in a second selected block in a second selected LG group in the same or a different HG group by selecting a first page of N-bit parasitic capacitors $C_{LG}$s made by corresponding N broken-LBLs as one page of $C_{LG}$-based DCR in the selected LG group for storing a first temporary page SLC data, the first page of $C_{LG}$-based DCR containing the first selected block containing the first selected WL;

supplying and latching a first set of bias voltages including Vpgm, Vpass, Vdd, and Vss control gate voltages for the first selected WL, all non-selected WLs, one pair of string-select transistor gates SSL and GSL of the first selected block to start a first program cycle with self-timed control on the first selected WL based on the first temporary page SLC data without program-verification;

selecting a second page of $C_{LG}$-based DCR from the second selected LG group in the same or different HG group, without waiting for the setup of the first set of bias voltages, independently for storing a second temporary page SLC data;

supplying and latching a second set of bias voltages including Vpgm, Vpass, Vdd, and Vss control gate voltages for the selected WL, all non-selected WLs, one pair of string-select transistor gates SSL and GSL of the second selected block to start a second program cycle with self-timed control on the second selected WL in the pipeline based on the second temporary page SLC data without program-verification, the second program cycle being at least partially overlapped with the first program cycle;

discharging each of the first set of bias voltages and the second set of bias voltages whenever the first or second program cycle is finished based on self-timed control.

18. The NAND memory chip of claim 16 wherein the multi-WLs pipeline/concurrent ABL SLC program without program-verify comprises an pipeline/concurrent operation for first m selected WLs in first m blocks in first m LG groups in first m HG groups and second n WL in a second n blocks in second n LG groups in second n HG groups by sequentially selecting a page of N-bit parasitic capacitors $C_{LG}$s made by corresponding N broken-LBLs as a selected page of $C_{LG}$-based DCR in each of the m LG groups for storing each temporary page SLC data, each selected page of $C_{LG}$-based DCR containing at least one of the first m blocks containing one of the first m selected WLs, each of the first m selected WLs having a same address in corresponding block;

supplying and latching a first set of bias voltages including Vpgm, Vpass, Vdd, and Vss control gate voltages for one of the first m selected WL, all non-selected WLs, one pair of string-select transistor gates SSL and GSL of all first m blocks to concurrently start a first program cycle with self-timed control on all first m selected WLs without program-verification;

sequentially selecting a page of $C_{LG}$-based DCR from each of the second n LG groups in the second n HG groups, without waiting for the setup of the first set of bias voltages, independently for storing each corresponding temporary page SLC data, each of the second n selected WLs having a same address in corresponding block;

supplying and latching a second set of bias voltages including Vpgm, Vpass, Vdd, and Vss control gate voltages for one of the second n selected WLs, all non-selected WLs, one pair of string-select transistor gates SSL and GSL of all the second n blocks to start a second program cycle with self-timed control on all the second n selected WLs in the pipeline without program-verification, the second program cycle being at least partially overlapped with the first program cycle;

discharging each of the first set of bias voltages and the second set of bias voltages whenever the first or second program cycle is finished based on self-timed control.

19. The NAND memory chip of claim 1 wherein the multi-WLs pipeline/concurrent ABL SLC program without program-verify comprises a series of operations of receiving pipeline program command from the command interface;

receiving pipeline program page address for a selected WL of a selected block;

sequentially loading half-page data into N/2-bit SCR from I/O in N/2 cycles in parallel of concurrently precharging one page of parasitic capacitors $C_{LG}$s made by N broken-LBLs of the selected WL as one page of $C_{LG}$-based DCR to store the Vinh voltage during a first time period with the one page of $C_{LG}$-based DCR being isolated from corresponding N/2 GBLs;

transferring the half-page data fully loaded after the N/2 cycles from the N/2-bit SCR into a N/2-bit program-register buffer in a data register in a second time period;

setting free of the N/2 GBLs connected to the N/2-bit program-register buffer at the end of the second time period;

connecting the N/2-bit program-register buffer to the N/2 GBLs in a third time period;

connecting the N/2 GBLs to half of the one page of $C_{LG}$-based DCR in a fourth time period to start data conversion by changing all Vinh voltages precharged inside the half page of $C_{LG}$-based DCR to a pattern defined by Vinh or Vss in accordance with digital pattern in the N/2 GBLs defined by Vdd or Vss voltage in each GBL;

disconnecting the N/2-bit GBLs from both the N/2-bit program-register buffer and the half page of $C_{LG}$-based DCR in a fifth time period at the end of the fourth time period to make the N/2 GBLs available for loading next half page data;

charging and latching one set of bias voltages for the selected WL, all other unselected WLs, and a pair of string-select lines in a sixth time period after full page data being loaded to the one page of $C_{LG}$-based DCR, the latching being controlled by a known-pulse signal for setting a reference voltage to determine a program cycle time;

starting ABL page program on the selected WL by applying the latched one set of bias voltages onto corresponding gate lines of the selected block within the determined program cycle time with self-timed control, in parallel to start loading next page data if current page is not last page under the pipeline program command; and programming subsequent pages based on the pipeline program command.

20. The NAND memory chip of claim 1 wherein the pipeline ABL-like SLC read operation comprises an operation of receiving pipeline SLC read command and address of a selected block;

performing a first read check for all NAND cells in the selected block using a predetermined program-state threshold maximum Vtpmax of 4V;

determining threshold Vt values of all NAND cells in the selected block to be smaller than the Vtpmax, otherwise increasing the Vtpmax by 0.5V;

setting an optimal read-pass voltage equal to the Vtpmax plus a margin of 2V;

performing SLC read of a selected NAND cell using a VR voltage determined with an individual BL-based cell threshold Vt value compensation for the selected NAND cell due to at least two adjacent cells associated with adjacent LBLs.

21. The NAND memory chip of claim 20 wherein pipeline ABL-like SLC read operation comprises an operation for one selected WL in a selected block in a selected MG group in a selected HG group starting from concurrently charging N LBLs associated with N strings of the selected block to the Vinh voltage from the precharge power line with the VR voltage applied to the selected WL and the read-pass voltage applied to all unselected WLs and Vss applied to a bottom string-select gate and the common source line;

concurrently discharging or retaining voltage in each LBL in accordance with each stored SLC bit data in each NAND cell in the selected WL of the selected block in the selected MG group with the VR voltage applied to the selected WL and the read-pass voltage applied to all unselected WLs and the bottom string-select gate and Vss applied to the common source line and with the precharge power line dropped from Vinh to (Vinh−ΔV/2);

passing the retained voltages in N/2 LBLs to the sense amplifier after a charge-sharing operation between the selected MG and all HG groups from the selected HG group to the sense amplifier in two cycles;

passing a reference voltage of (Vinh−ΔV/2) precharged into the N LBLs of same MG group after the charge-sharing between the selected MG and all HG groups from the selected HG group to the sense amplifier in two cycles;

determining the SLC bit data in each NAND cell in the selected WL based on determination by the sense amplifier using the retained voltage against the reference voltage.

22. The NAND memory chip of claim 1 wherein the common source line and the common precharge power line are both made of metal lines laid at a level either below the LBLs or higher than the first level of the GBLs.

23. The NAND memory chip of claim 1 wherein the N/2 bit page buffer circuit comprises a data register per bit including a sense amplifier, a program/read buffer, and a page program-verify circuit, and a N/2-bit static cache register circuit, the sense amplifier being a DRAM-like clocked differential amplifier configured, for performing a pipeline SLC read operation on a selected WL of a selected block in a MG, to have its first node coupled to one of N GBLs to receive a first voltage sensed from an 1-bit SLC data with a converted voltage of Vinh or Vss in a NAND cell of the selected WL of the MG and alternatively to have its second node coupled to the same one GBL to receive a second voltage of 1-bit reference data from a parasitic capacitor $C_{MG}$ of the same MG precharged to Vinh−ΔV/2 after passing the first voltage to the first node, the second voltage being substantially full tracking of the first voltage.

24. The NAND memory chip of claim 23 wherein the first voltage is Vinh/N' or Vss after a charge-sharing operation to dilute the converted voltage Vinh by a factor N' determined by a ratio of LBL length of the MG and total length of one or more GBLs involved for the charge-sharing operation and the second voltage is (Vinh−ΔV/2)/N', making ΔV/2N' as a differential signal of the sense amplifier.

25. The NAND memory chip of claim 23 wherein the ΔV is a design variable depending on a minimum detectable differential signal value of the sense amplifier and is determined by total number J of HG groups in the NAND array, location of the selected HG group within the J HG groups relative to the sense amplifier, and a sequential number of the selected WL among multiple WLs in the pipeline, such that the second voltage is a reference voltage at a middle level between a first level of Vinh/N' and a minimum detectable second level below the first level.

26. The NAND memory chip of claim 1 wherein the N numbers of second metal lines comprise N/2 Odd-numbered LBLs laid at a second level below the first level and N/2 Even-numbered LBLs laid at a third level below the second level or vise versa, the N/2 Odd/Even-numbered LBLs being interleaved with remaining N/2 Even/Odd-numbered second metal lines at the third/second level that are electrically grounded and fully isolated from the N/2 Odd/Even-numbered LBLs to provide substantially full shielding of AC coupling effect between LBL-LBL.

27. A NAND memory chip configured for pipeline/concurrent All-BL (ABL) SLC program without program-verify and Half-BL (HBL) SLC read operations, the NAND memory chip comprising:

a NAND array comprising J numbers of HG groups arranged in a bitline (BL) direction, each HG group including L numbers of MG groups, each MG group including J' numbers of LG groups, each LG group including H numbers of blocks, each block including N numbers of strings cascaded one another in a wordline (WL) direction orthogonal to the BL-direction, each string comprising K numbers of NAND memory cells plus several dummy cells capped by a pair of string-select transistors respectively at two ends of the string without connecting to any common source line laid in the WL-direction, wherein N, J, L, J', H, and K are integers of 2 and greater based on memory chip design;

a two-level BL hierarchical structure comprising N/2 first metal lines laid at a first level as global bit lines (GBLs) in the BL-direction through the NAND array and broken by J−1 rows of N/2 GBL-dividers forming a set of N/2 broken-GBLs associated with one of J HG groups, and comprising N second metal lines laid below the first level in the BL-direction through each MG group forming one page of N-bit on-chip capacitors $C_{MG}$s respectively coupled to N broken-GBLs via N 2-to-1 MG-Ypass devices and being divided into J' pages of N broken second metal lines by J'−1 rows of N LBL-dividers, each page of N broken second metal lines being associated with a LG group by alternatively serving local bit lines (LBLs) or local source lines (LSLs) for N/2 Odd-numbered strings or N/2 Even-numbered strings in each block of the LG group and forming one page of N-bit parasitic capacitors $C_{LG}$s and being connected respectively via either an Odd-precharger device or an Even-precharger device to a common precharge power line for charging a medium-high voltage Vinh of about 7V or lower or discharging to ground or other small voltages;
a plurality of group-decoders including BHG-DEC, MG-DEC, BLG-DEC, and LG-based precharge power line decoder for providing respective gate control signals;
a row-decoder control circuit including a plurality of LG-based row-decoders, each LG-based row-decoder including a time control unit and H block-decoders, each block-decoder being configured to provide line control signals for K WLs of NAND cells and a pair of gate lines of string-select transistors per block;
a peripheral system comprising a data communication group and a command control group, the data communication group including a N/2-bit page buffer circuit coupled between the N/2 GBLs and I/Os for program data loading and read data sensing, the command control group including a command interface, a state-machine circuit, an address register circuit, and a voltage generator for receiving/transmitting external control signals, controlling I/Os to operate the page buffer operated with a low Vdd operating voltage, and generating various required high, medium, and analog low voltages and address information for the row-decoder control circuit and the plurality of group-decoders to set desired bias conditions for performing multi-WLs pipeline/concurrent ABL SLC program without program-verify and HBL read operation with substantial reduction in operation latency.

28. The NAND memory chip of claim 27 wherein the N is number of bits per physical page selected from 4 KB, 8 KB, 16 KB or other suitable integers; J is selected from 8, 16, or other suitable integer smaller than 16; L is an integer selected from 4, 8, 16 or other suitable integer smaller than 16; J' is selected from 4, 8, or other suitable integer smaller than 8; H is selected from 4, 8, 16; and K is selected from 8, 16, 32, 64, 128, 256 or other suitable integer smaller than 256.

29. The NAND memory chip of claim 27 wherein each of the plurality of NAND memory transistors is either a transistor selected from 1-poly charge-trapping SONOS type and 2-poly floating gate type, with non-volatile design selected from either PMOS or NMOS NAND, 2T Flotox-based EEPROM, NAND-based NOR, and NAND-based Flash, based on a manufacturing technology selected from 2D type and 3D type, PMOS or NMOS NAND cell and flash technology types.

30. The NAND memory chip of claim 27 wherein each of the pair of string-select transistors, the GBL-dividers, the LBL-dividers, and the Odd- and Even-precharger devices is a 1-poly NMOS transistor with preferred source-drain breakdown voltage (BVDS)≥Vinh.

31. The NAND memory chip of claim 27 wherein the time control unit comprises a self-timed delay control circuit configured to be shared by the H block-decoders and be turned on by receiving LG-select signal for generating several derivative delays to corresponding output control signals to drive a selected one of the H block-decoders based on one known-delay controlled by one input pulse of ENB signal and three other POR, BIAS, and SET input signals from the state-machine circuit.

32. The NAND memory chip of claim 31 wherein the self-timed delay control circuit comprising two differential amplifiers having a common reference input coupled a first capacitor at two positive nodes and two separate inputs respectively coupled a second capacitor and third capacitor to two negative nodes, the common reference input being tuned using one known-duration ENB signal provided by the state-machine to discharge from its initial precharged Vdd to a final Vref through a discharge of the first capacitor, the second capacitor, and the third capacitor controlled by three constant current mirror circuits with their common gates connected to the BIAS signal.

33. The NAND memory chip of claim 32 wherein the self-timed delay control circuit further comprising multiple latch circuits, each being made by a pair of NOR devices, combined with multiple one-shot pulse generator circuits for providing controlled delays including program time span with respect to a known duration of a discharge time of 5 µs from Vdd to the final Vref.

34. The NAND memory chip of claim 27 wherein each Odd-numbered broken second metal line is coupled to a drain node of an Odd-numbered string as a LBL and a source node of an adjacent Even-numbered string of a same block as a LSL and each Even-numbered broken second metal line is coupled to a drain node of an Even-numbered string as a LBL and a source node of an adjacent Odd-numbered string of the same block as a LSL.

35. The NAND memory chip of claim 27 wherein each Odd-numbered broken second metal line is coupled to drain nodes of an Odd-numbered string and an adjacent Even-numbered string of a same block as their LBLs and the adjacent Even-numbered broken second metal line is coupled to source nodes of said Even-numbered string and an next adjacent Odd-numbered string of the same block as their LSLs.

36. The NAND memory chip of claim 27 wherein the BHG-DEC is one of the plurality of group-decoders configured to provide self-timed BHG signals to selectively turn on one or more rows of GBL-dividers for connecting corresponding two or more adjacent broken-GBLs associated respectively with two or more HG groups among the total J HG groups in the NAND array; the MG-DEC is one of the plurality of group-decoders configured to provide self-timed MG1 and MG2 signals to selectively turn on two transistors in a 2-to-1 MG-Ypass device for connecting the N LBLs in a selected MG group to N/2 broken-GBLs in a HG group; the BLG-DEC is one of the plurality of group-decoders configured to provide self-timed BLG signals to selectively turn on one or more rows of LBL-dividers for connecting corresponding two or more adjacent broken-LBLs associated respectively with two or more LG groups among the L LG groups within a selected MG group, and LG-based precharge power line decoder is configured to provide two self-timed PREo and PREe signals to control independent and concurrent precharging all or half LBLs in precharge cycle or concurrent discharging after the precharge or charge-sharing cycle.

37. The NAND memory chip of claim 27 wherein one page of N-bit parasitic capacitors $C_{LG}$s is configured to be a $C_{LG}$-based one page Dynamic CACHE Register (DCR) to allow temporary storage of N-bit of analog or digital voltage data or precharged program-inhibit voltages without taking extra silicon area outside the NAND array in the peripheral area for performing pipeline/concurrent HBL SLC program operation.

38. The NAND memory chip of claim 27 wherein one page of N-bit parasitic capacitors $C_{MG}$s is configured to be a $C_{MG}$-based one page DCR to allow temporary of N-bit of sensed analog data from N-bit NAND cells or precharged $V_{LBL}$ voltages without taking extra silicon area outside the NAND array in the peripheral area for performing pipeline/concurrent HBL SLC read operation.

39. The NAND memory chip of claim 27 wherein the multi-WLs pipeline/concurrent ABL SLC program without program-verify comprises an operation for one selected WL in a selected block in a selected LG group in a selected HG group starting from
receiving Command and address;
dividing a N-bit SLC page data into a first N/2-bit half-page SLC data and a second N/2-bit half-page SLC data;
setting the first N/2-bit half-page SLC data from a flash controller sequentially and synchronously clocked into a N/2-bit SCR via a byte-based I/O in N/2 clocks;
selecting a first Odd-numbered N/2-bit capacitors $C_{LG}$s as a first half-page DCR for precharging with the Vinh voltage, the first half-page DCR being associated with a LG group containing a selected block containing all Odd-numbered cells in the selected WL;
transferring the first N/2-bit half-page SLC data from the N/2-bit SCR to a N/2-bit PB;
releasing the N/2-bit SCR to receive continuous loading of a second N/2-bit half-page SLC data from the I/O;
connecting the first N/2-bit half-page SLC data in N/2-bit PB to N/2 GBLs while disconnected from the first half-page DCR;
connecting the N/2 GBLs and the first half-page DCR in parallel to start voltage conversion within N/2 Odd-numbered LBLs associated with the first half-page DCR from all initial Vinh voltage is every Odd-numbered LBL to a patterned Vinh/Vss in accordance with a pattern of Vdd/Vss of the first N/2-bit half-page SLC data;
disconnecting the N/2 GBLs from both the N/2-bit PB and the first half-page DCR to release the N/2 GBLs for loading and converting a second N/2-bit half-page SLC data.

40. The NAND memory chip of claim 39 wherein the multi-WLs pipeline/concurrent ABL SLC program without program-verify comprises a continued operation for the selected WL by
setting the second N/2-bit half-page SLC data from the flash controller sequentially and synchronously clocked into the N/2-bit SCR via the byte-based I/O in N/2 clocks;
selecting a second Odd-numbered N/2-bit capacitors $C_{LG}$s as a first half-page DCR for precharging with the Vinh voltage, the second half-page DCR being associated with the same LG group of the first half-page DCR containing a selected block containing all Even-numbered cells in the selected WL;
transferring the second N/2-bit half-page SLC data from the N/2-bit SCR to the N/2-bit PB;
releasing the N/2-bit SCR to receive continuous loading of a next page SLC data from the I/O;
connecting the second N/2-bit half-page SLC data in N/2-bit PB to N/2 GBLs while disconnected from the second half-page DCR;
connecting the N/2 GBLs and the second half-page DCR in parallel to start voltage conversion within N/2 Even-numbered LBLs associated with the second half-page DCR from all initial Vinh voltage is every Even-numbered LBL to a patterned Vinh/Vss in accordance with a pattern of Vdd/Vss of the second N/2-bit half-page SLC data;
disconnecting the N/2 GBLs from both the N/2-bit PB and the second half-page DCR to release the N/2 GBLs for loading next page.

41. The NAND memory chip of claim 40 wherein the multi-WLs pipeline/concurrent ABL SLC program without program-verify comprises an pipeline operation for a first selected WL in a first selected block in a first selected LG group in a HG group and a second selected WL in a second selected block in a second selected LG group in the same or a different HG group by
selecting a first page of N-bit parasitic capacitors $C_{LG}$s made by corresponding N broken-LBLs as one page of $C_{LG}$-based DCR in the selected LG group for storing a first temporary page SLC data, the first page of $C_{LG}$-based DCR containing the first selected block containing the first selected WL;
supplying and latching a first set of bias voltages including Vpgm, Vpass, Vdd, and Vss control gate voltages for the first selected WL, all non-selected WLs, one pair of string-select transistor gates SSL and GSL of the first selected block to start a first program cycle with self-timed control on the first selected WL based on the first temporary page SLC data without program-verification;
selecting a second page of $C_{LG}$-based DCR from the second selected LG group in the same or different HG group, without waiting for the setup of the first set of bias voltages, independently for storing a second temporary page SLC data;
supplying and latching a second set of bias voltages including Vpgm, Vpass, Vdd, and Vss control gate voltages for the selected WL, all non-selected WLs, one pair of string-select transistor gates SSL and GSL of the second selected block to start a second program cycle with self-timed control on the second selected WL in the pipeline based on the second temporary page SLC data without program-verification, the second program cycle being at least partially overlapped with the first program cycle;
discharging each of the first set of bias voltages and the second set of bias voltages whenever the first or second program cycle is finished based on self-timed control.

42. The NAND memory chip of claim 40 wherein the multi-WLs pipeline/concurrent ABL SLC program without program-verify comprises an pipeline/concurrent operation for first m selected WLs in first m blocks in first m LG groups in first m HG groups and second n WL in a second n blocks in second n LG groups in second n HG groups by
sequentially selecting a page of N-bit parasitic capacitors $C_{LG}$s made by corresponding N broken-LBLs as a selected page of $C_{LG}$-based DCR in each of the m LG groups for storing each temporary page SLC data, each selected page of $C_{LG}$-based DCR containing at least one of the first m blocks containing one of the first m selected WLs, each of the first m selected WLs having a same address in corresponding block;

supplying and latching a first set of bias voltages including Vpgm, Vpass, Vdd, and Vss control gate voltages for one of the first m selected WL, all non-selected WLs, one pair of string-select transistor gates SSL and GSL of all first m blocks to concurrently start a first program cycle with self-timed control on all first m selected WLs without program-verification;

sequentially selecting a page of $C_{LG}$-based DCR from each of the second n LG groups in the second n HG groups, without waiting for the setup of the first set of bias voltages, independently for storing each corresponding temporary page SLC data, each of the second n selected WLs having a same address in corresponding block;

supplying and latching a second set of bias voltages including Vpgm, Vpass, Vdd, and Vss control gate voltages for one of the second n selected WLs, all non-selected WLs, one pair of string-select transistor gates SSL and GSL of all the second n blocks to start a second program cycle with self-timed control on all the second n selected WLs in the pipeline without program-verification, the second program cycle being at least partially overlapped with the first program cycle;

discharging each of the first set of bias voltages and the second set of bias voltages whenever the first or second program cycle is finished based on self-timed control.

43. The NAND memory chip of claim 27 wherein the multi-WLs pipeline/concurrent ABL SLC program without program-verify comprises a series of operations of receiving pipeline program command from the command interface;

receiving pipeline program page address for a selected WL of a selected block;

sequentially loading half-page data into N/2-bit SCR from I/O in N/2 cycles in parallel of concurrently precharging one page of parasitic capacitors $C_{LG}$s made by N broken-LBLs of the selected WL as one page of $C_{LG}$-based DCR to store the Vinh voltage during a first time period with the one page of $C_{LG}$-based DCR being isolated from corresponding N/2 GBLs;

transferring the half-page data fully loaded after the N/2 cycles from the N/2-bit SCR into a N/2-bit program-register buffer in a data register in a second time period;

setting free of the N/2 GBLs connected to the N/2-bit program-register buffer at the end of the second time period;

connecting the N/2-bit program-register buffer to the N/2 GBLs in a third time period;

connecting the N/2 GBLs to half of the one page of $C_{LG}$-based DCR in a fourth time period to start data conversion by changing all Vinh voltages precharged inside the half page of $C_{LG}$-based DCR to a pattern defined by Vinh or Vss in accordance with digital pattern in the N/2 GBLs defined by Vdd or Vss voltage in each GBL;

disconnecting the N/2-bit GBLs from both the N/2-bit program-register buffer and the half page of $C_{LG}$-based DCR in a fifth time period at the end of the fourth time period to make the N/2 GBLs available for loading next half page data;

charging and latching one set of bias voltages for the selected WL, all other unselected WLs, and a pair of string-select lines in a sixth time period after full page data being loaded to the one page of $C_{LG}$-based DCR, the latching being controlled by a known-pulse signal for setting a reference voltage to determine a program cycle time;

starting ABL page program on the selected WL by applying the latched one set of bias voltages onto corresponding gate lines of the selected block within the determined program cycle time with self-timed control, in parallel to start loading next page data if current page is not last page under the pipeline program command; and programming subsequent pages based on the pipeline program command.

44. The NAND memory chip of claim 27 wherein the pipeline HBL SLC read operation comprises an operation of receiving pipeline SLC read command and address of a selected block;

performing a first read check for all NAND cells in the selected block using a predetermined program-state threshold maximum Vtpmax of 4V;

determining threshold Vt values of all NAND cells in the selected block to be smaller than the Vtpmax, otherwise increasing the Vtpmax by 0.5V;

setting an optimal read-pass voltage equal to the Vtpmax plus a margin of 2V;

performing SLC read of a selected NAND cell using a VR voltage determined with an individual SL-based cell threshold Vt value compensation for the selected NAND cell due to one or two adjacent cells associated with adjacent LBLs.

45. The NAND memory chip of claim 44 wherein pipeline HBL SLC read operation comprises an operation for one selected WL in a selected block in a selected MG group in a selected HG group starting from concurrently charging N LBLs associated with N strings of the selected block to the Vinh voltage from the precharge power line with the VR voltage applied to the selected WL and the read-pass voltage applied to all unselected WLs and Vss applied to a bottom string-select gate and the common source line;

concurrently discharging or retaining voltage in each LBL in accordance with each stored SLC bit data in each NAND cell in the selected WL of the selected block in the selected MG group with the VR voltage applied to the selected WL and the read-pass voltage applied to all unselected WLs and the bottom string-select gate and Vss applied to the common source line and with the precharge power line dropped from Vinh to (Vinh−ΔV/2);

passing the retained voltages in N/2 LBLs to the sense amplifier after a charge-sharing operation between the selected MG and all HG groups from the selected HG group to the sense amplifier in two cycles;

passing a reference voltage of (Vinh−ΔV/2) precharged into the N LBLs of same MG group after the charge-sharing between the selected MG and all HG groups from the selected HG group to the sense amplifier in two cycles;

determining the SLC bit data in each NAND cell in the selected WL based on determination by the sense amplifier using the retained voltage against the reference voltage.

46. The NAND memory chip of claim 27 wherein the common precharge power line is made of metal line laid at a level either below the LBLs or higher than the first level of the GBLs.

* * * * *